United States Patent
Wang et al.

(10) Patent No.: US 10,381,309 B2
(45) Date of Patent: Aug. 13, 2019

(54) PACKAGE STRUCTURE HAVING CONNECTING MODULE

(71) Applicant: Taiwan Semiconductor Manufacturing Co., Ltd., Hsinchu (TW)

(72) Inventors: Chuei-Tang Wang, Taichung (TW); Chung-Hao Tsai, Changhua County (TW); Chen-Hua Yu, Hsinchu (TW); Chun-Lin Lu, Hsinchu (TW); Chao-Wen Shih, Hsinchu County (TW); Han-Ping Pu, Taichung (TW); Kai-Chiang Wu, Hsinchu (TW); Albert Wan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/965,980

(22) Filed: Apr. 30, 2018

(65) Prior Publication Data

US 2019/0157206 A1    May 23, 2019

Related U.S. Application Data

(60) Provisional application No. 62/589,527, filed on Nov. 21, 2017.

(51) Int. Cl.
*H01L 23/538* (2006.01)
*H01L 23/498* (2006.01)
(Continued)

(52) U.S. Cl.
CPC .......... *H01L 23/5384* (2013.01); *H01L 23/28* (2013.01); *H01L 23/49816* (2013.01);
(Continued)

(58) Field of Classification Search
None
See application file for complete search history.

(56) References Cited

U.S. PATENT DOCUMENTS 9,000,584 B2    4/2015    Lin et al.
9,048,222 B2    6/2015    Hung et al.
(Continued)

*Primary Examiner* — Bilkis Jahan
(74) *Attorney, Agent, or Firm* — JCIPRNET

(57) ABSTRACT

A package structure includes a first redistribution layer, a second redistribution layer, at least one semiconductor chip, an insulating encapsulation, a protection layer, and at least one connecting module. The at least one semiconductor chip is located between and electrically connected to the first redistribution layer and the second redistribution layer. The insulating encapsulation encapsulates the at least one semiconductor chip. The protection layer is disposed on and partially covers the first redistribution layer, wherein the first redistribution layer is located between the at least one semiconductor chip and the protection layer. The at least one connecting module connects to the first redistribution layer and is electrically connected to the at least one semiconductor chip through the first redistribution layer, wherein the at least one connecting module comprises a plurality of pins, and the at least one connecting module is mounted onto the first redistribution layer by the protection layer and is accessibly exposed by the protection layer.

8 Claims, 58 Drawing Sheets

(51) Int. Cl.
  *H01L 23/28* (2006.01)
  *H01L 25/065* (2006.01)
  *H01L 25/00* (2006.01)

(52) U.S. Cl.
  CPC .......... *H01L 25/0657* (2013.01); *H01L 25/50* (2013.01); *H01L 2224/18* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2009/0224391 A1* | 9/2009 | Lin ............... H01L 21/6835 257/690 |
| 2010/0065942 A1* | 3/2010 | Lin ............... H01L 27/016 257/531 |
| 2012/0153493 A1* | 6/2012 | Lee ............... H01L 25/16 257/774 |
| 2015/0262909 A1* | 9/2015 | Chen ............. H01L 21/76804 257/774 |
| 2016/0126220 A1* | 5/2016 | Chen ............. H01L 21/563 257/737 |
| 2016/0276325 A1* | 9/2016 | Nair ............. H01L 21/568 |

* cited by examiner

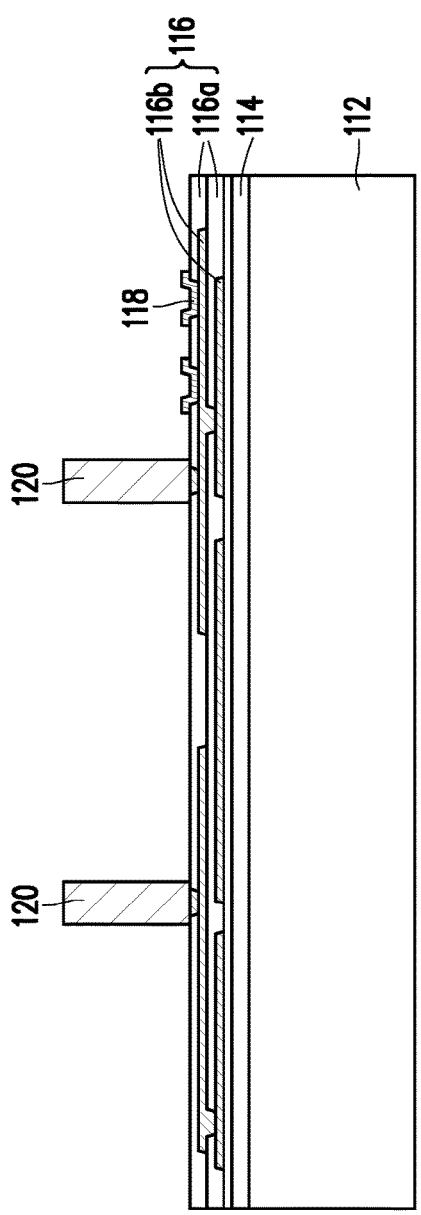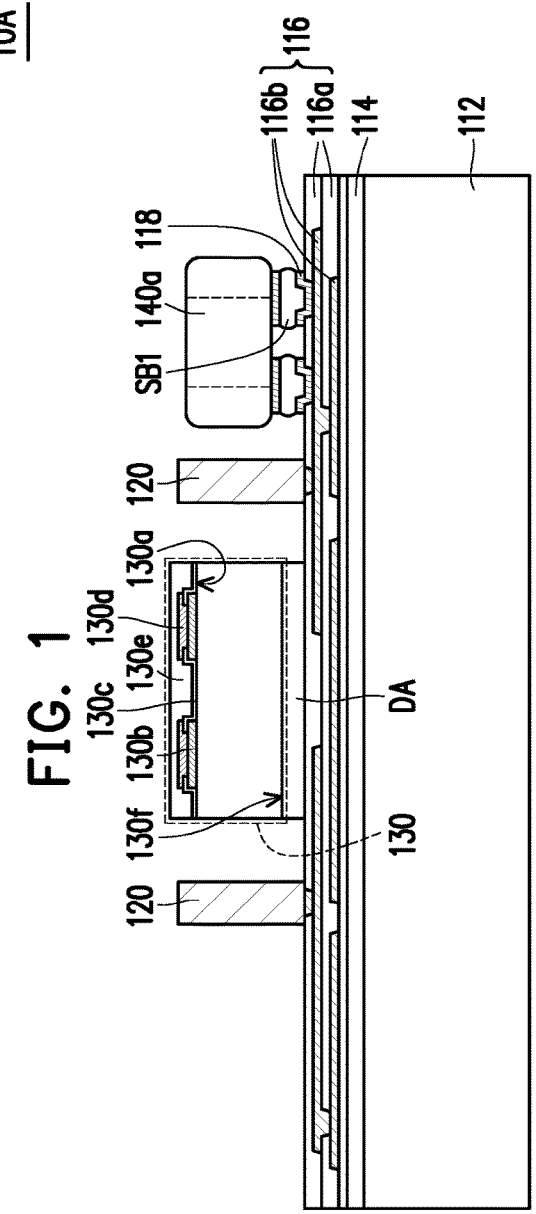

PACKAGE STRUCTURE HAVING CONNECTING MODULE

CROSS-REFERENCE TO RELATED APPLICATION

This application claims the priority benefit of U.S. provisional application Ser. No. 62/589,527, filed on Nov. 21, 2017. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The semiconductor dies of the wafer may be processed and packaged with other semiconductor devices or semiconductor dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 12 are schematic cross sectional views of various stages in a manufacturing method of a package structure according to some exemplary embodiments of the present disclosure.

DETAILED DESCRIPTION

Figure 3:
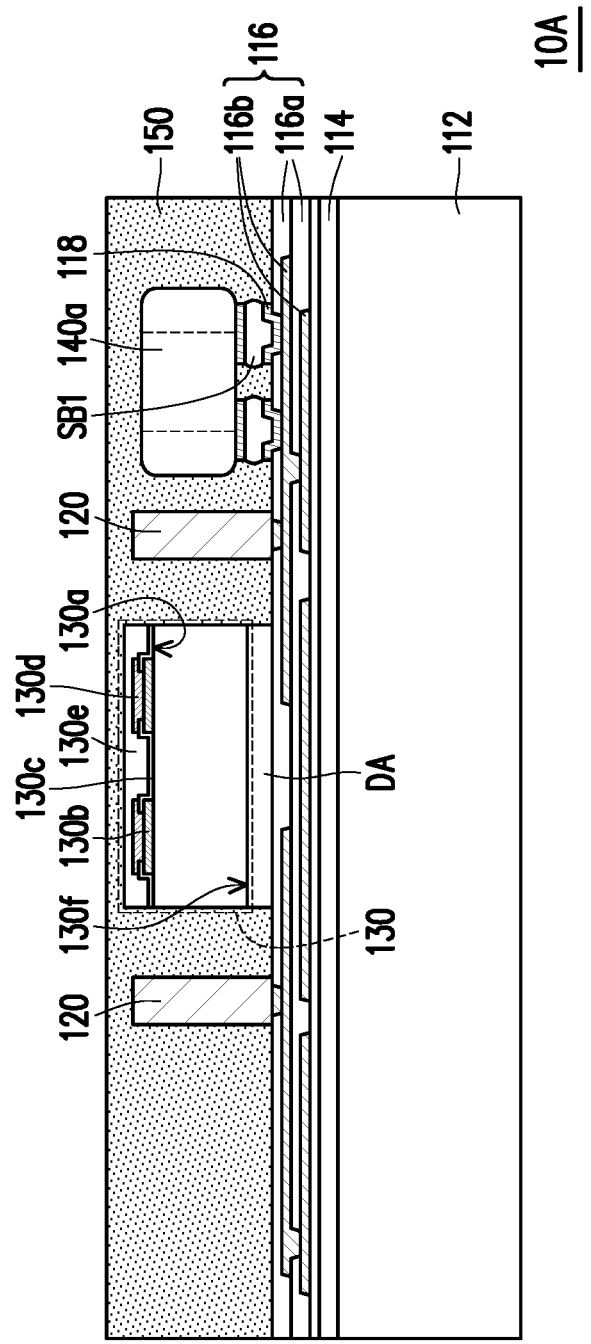

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 12 are schematic cross sectional views of various stages in a manufacturing method of a package structure according to some exemplary embodiments of the present disclosure. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 12, one semiconductor die is shown to represent plural semiconductor dies of the wafer, and a package structure 10A is shown to represent a package structure obtained following the manufacturing method, for example. In other embodiments, two chips or semiconductor dies are shown to represent plural chips or semiconductor dies of the wafer, and one or more package structures are shown to represent plural (semiconductor) package structures obtained following the (semiconductor) manufacturing method, the disclosure is not limited thereto.

Referring to FIG. 1, in some embodiments, a carrier 112 is provided. In one embodiment, the carrier 112 may be a glass carrier or any suitable carrier for carrying a semiconductor wafer or a reconstituted wafer for the manufacturing method of the semiconductor package structure. In some embodiments, as shown in FIG. 1, the carrier 112 is provided with a debond layer 114 formed thereon. In one embodiment, the material of the debond layer 114 may be any material suitable for debonding the carrier 112 from the above layers or any wafer(s) disposed thereon. For example, the debond layer 114 may include a release layer (such as a light-to-heat conversion ("LTHC") layer) or an adhesive layer (such as a ultra-violet curable adhesive or a heat curable adhesive layer).

As shown in FIG. 1, in some embodiments, a redistribution layer 116 and through vias are sequentially formed on the debond layer 114, where the debond layer 114 is located between the carrier 12 and the redistribution layer 116, and the redistribution layer 116 is located between the debond layer 114 and the through via 120. In some embodiments, the redistribution layer 116 is electrically connected to the through vias 120. As shown in FIG. 1, in some embodiments, the redistribution layer 116 is electrically connected to the through vias 120 by mechanically contacting.

In some embodiments, the formation of the redistribution layer 116 includes sequentially forming one or more polymer dielectric layers 116a and one or more metallization layers 116b in alternation. In certain embodiments, as shown in FIG. 1, the metallization layers 116b are sandwiched between the polymer dielectric layers 116a, where the top surface of the topmost layer of the metallization layers 116b is exposed by the topmost layer of the polymer dielectric layers 116a and the lowest layer of the metallization layers 116b is covered by the lowest layer of the polymer dielectric layers 116a. In some embodiments, the material of the polymer dielectric layers 116a includes polyimide, epoxy resin, acrylic resin, phenol resin, benzocyclobutene (BCB), polybenzooxazole (PBO), or any other suitable polymer-based semiconductor dielectric material, and the polymer dielectric layers 116a may be formed by coating. In some embodiments, the material of the metallization layers 116b includes aluminum, titanium, copper, nickel, tungsten, and/or alloys thereof, and the metallization layers 116b may be formed by electroplating or deposition. However, it should be noted that the redistribution layer 116 is not limited to include two polymer dielectric layers and/or two metallization layers. The numbers of the metallization layers 116b and the polymer dielectric layers 116a included in the redistribution layer 116 is not limited according to the disclosure.

As shown in FIG. 1, in some embodiments, the through vias 120 are formed on the redistribution layer 116. In some embodiments, the through vias 120 may be through integrated fan-out (InFO) vias. For simplification, only two through vias 120 are presented in FIG. 1 for illustrative purposes, however it should be noted that more than two through vias may be formed; the disclosure is not limited thereto. The number of the through vias 120 can be selected based on the demand.

In some embodiments, the through vias 120 are formed by photolithography, plating, photoresist stripping processes or any other suitable method. In one embodiment, the through vias 120 may be formed by forming a mask pattern (not shown) covering the redistribution layer 116 with openings exposing the top surface of the topmost layer of the metallization layers 116b exposed by the topmost layer of the polymer dielectric layers 116a, forming a metallic material filling the openings to form the through vias 120 by electroplating or deposition and then removing the mask pattern. In one embodiment, the material of the through vias 120 may include a metal material such as copper or copper alloys, or the like. However, the disclosure is not limited thereto.

As shown in FIG. 1, in some embodiments, a plurality of under-ball metallurgy (UBM) patterns 118 are formed on the redistribution layer 116 for electrically connecting with conductive elements (e.g. a connecting module or the like) and/or semiconductor elements (e.g., passive components or active components). In certain embodiments, the UBM patterns 118 are mechanically contacting the top surface of the topmost layer of the metallization layers 116b exposed by the topmost layer of the polymer dielectric layers 116a. In some embodiments, the material of the UBM patterns 118, for example, may include copper, nickel, titanium, tungsten, or alloys thereof or the like, and may be formed by an electroplating process, for example. As shown in FIG. 1, only two UBM patterns 118 are presented in FIG. 1 for illustrative purposes, however it should be noted that more than or less than two UBM patterns 118 may be formed; the disclosure is not limited thereto.

Referring to FIG. 2, in some embodiments, at least one semiconductor die 130 with a connecting film DA disposed thereon is provided, where the semiconductor die 130 has an active surface 130a and a backside surface 130f opposite to the active surface 130a. As shown in FIG. 2, the semiconductor die 130 is disposed on the redistribution layer 116 and over the carrier 112 through the connecting film DA. In some embodiments, the connecting film DA is located between the semiconductor die 130 and the redistribution layer 116, and the connecting film DA is physically contacts the backside surface 130f of the semiconductor die 130 and the redistribution layer 116. In some embodiments, due to the connecting film DA provided between the semiconductor die 130 and the redistribution layer 116, the semiconductor die 130 and the redistribution layer 116 are stably adhered to each other. In some embodiments, the connecting film DA may be, for example, a semiconductor die attach film, a layer made of adhesives or epoxy resin, or the like. In some embodiments, the redistribution layer 116 is referred as a back-side redistribution layer of the semiconductor die 130. As shown in FIG. 2, for example, the through vias 120 are located aside of a location of the semiconductor die 130.

In some embodiments, as shown in FIG. 2, the semiconductor die 130 includes the active surface 130a, a plurality of pads 130b distributed on the active surface 130a, a passivation layer 130c covering the active surface 130a and a portion of the pad 130b, a plurality of conductive pillars 130d connected to the portion of the pads 130b, a protection layer 130e covering the pads 130b and the conductive pillars 130d, and the backside surface 130f opposite to the active surface 130a. The pads 130b are partially exposed by the passivation layer 130c, the conductive pillars 130d are disposed on and electrically connected to the pads 130b, and the protection layer 130e covers the passivation layer 130c and the conductive pillars 130d. In some embodiments, the pads 130b may be aluminum pads or other suitable metal pads. In some embodiments, the conductive pillars 130d are copper pillars, copper alloy pillar or other suitable metal pillars, for example. In some embodiments, the passivation layer 130c and/or the protection layer 130e may be a polybenzoxazole (PBO) layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto. In an alternative embodiment, the semiconductor die 130 may include the pads 130b distributed on the active surface 130a, the passivation layer 130c covering the active surface 130a and a portion of the pad 130b, the backside surface 130f opposite to the active surface 130a.

As shown in FIG. 2, only one semiconductor die is presented for illustrative purposes, however it should be noted that one or more semiconductor dies may be provided. In some embodiments, the semiconductor die 130 described herein may be referred as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor die 130 are provided, and the semiconductor dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 130 may be referred as a chip or a IC of combination-type, and the semiconductor die 130 may be a WiFi chip simultaneously including both of a RF chip and a digital chip. The disclosure is not limited thereto.

Continued on FIG. 2, in some embodiments, at least one surface mount device 140a is mounted onto and electrically connected to the redistribution layer 116 by solder balls SB1 and the UBM patterns 118. In some embodiments, the surface mount device 140a may be may include passive devices such as, capacitors, resistors, inductors, combinations thereof, or the like. The number of the surface mount device 140a can be selected to be more than one based on the demand. In an alternative embodiment, the surface mount device 140a may further include additional surface mount device (s) of the same type or different types, the disclosure is not limited thereto. As shown in FIG. 2, the surface mount device 140a is located aside of the locations of the semiconductor die 130 and the through vias 120, where the through vias 120, the semiconductor die 130, and the surface mount device 140a are located at the same side of the redistribution layer 116.

Referring to FIG. 3, in some embodiments, the through vias 120, the semiconductor die 130, and the surface mount device 140a are encapsulated in an insulating encapsulation 150. In some embodiments, the insulating encapsulation 150 is formed on the redistribution layer 116 and over the carrier 112. As shown in FIG. 3, the insulating encapsulation 150 at least fills up the gaps between the through vias 120, and between the through vias 120, the solder balls SB1, the semiconductor die 130 and the connecting film DA. In some embodiments, the insulating encapsulation 150 covers the redistribution layer 116, the solder balls SB1 and the connecting film DA. In certain embodiments, as shown in FIG. 3, the through vias 120, the semiconductor die 130, and the surface mount device 140a are not accessibly revealed by the insulating encapsulation 150.

As shown in FIG. 3, the insulating encapsulation 150 covers the redistribution layer 116 exposed from the through vias 120, the through vias 120, the semiconductor die 130, the surface mount device 140a, and the solder balls SB1. In some embodiments, the insulating encapsulation 150 is a molding compound formed by a molding process. In some embodiments, the insulating encapsulation 150, for example, may include polymers (such as epoxy resins, phenolic resins, silicon-containing resins, or other suitable resins), dielectric materials having low permittivity (Dk) and low loss tangent (Df) properties, or other suitable materials. Depending on the frequency range of the high-speed applications, suitable materials of the insulating encapsulation 150 may be selected based on the required electrical properties of the package structure 10A.

Figure 4:
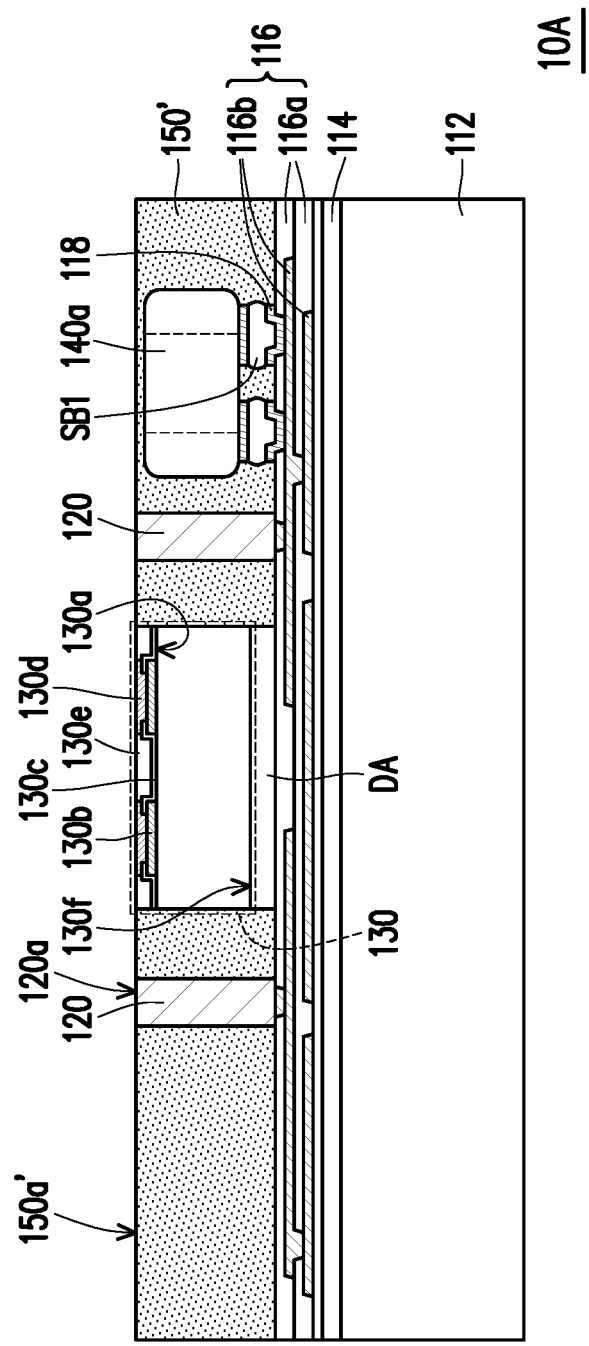

In an alternative embodiment, the insulating encapsulation 150 may include an acceptable insulating encapsulation material. In some embodiments, the insulating encapsulation 150 may further include inorganic filler or inorganic compound (e.g. silica, clay, and so on) which can be added therein to optimize coefficient of thermal expansion (CTE) of the insulating encapsulation 150. The disclosure is not limited thereto Referring to FIG. 4, in some embodiments, the insulating encapsulation 150 is planarized to form an insulating encapsulation 150' exposing the through vias 120 and the semiconductor die 130. In certain embodiments, as shown in FIG. 4, after the planarization, top surfaces 120a of the through vias 120 and top surfaces of the conductive pillars 130d and the protection layer 130e of the semiconductor die 130 are exposed by a top surface 150a' of the insulating encapsulation 150'. That is, for example, the top surfaces of the conductive pillars 130d and the protection layer 130e of the semiconductor die 130 and the top surfaces 120a of the through vias 120 become substantially leveled with the top surface 150a' of the insulating encapsulation 150'. In other words, the top surfaces of the conductive pillars 130d and the protection layer 130e of the semiconductor die 130, the top surfaces 120a of the through vias 120, and the top surface 150a' of the insulating encapsulation 150' are substantially coplanar to each other.

The insulating encapsulation 150 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 150, the conductive pillars 130d and the protection layer 130e of the semiconductor die 130 and the through vias 120 may also be planarized. In certain embodiments, the planarizing step may, for example, performed on the over-molded insulating encapsulation 150 to level the top surface 150a' of the insulating encapsulation 150', the top surfaces 120a of the through vias 120, and the top surfaces of the conductive pillars 130d and the protection layer 130e of the semiconductor die 130.

Figure 5:
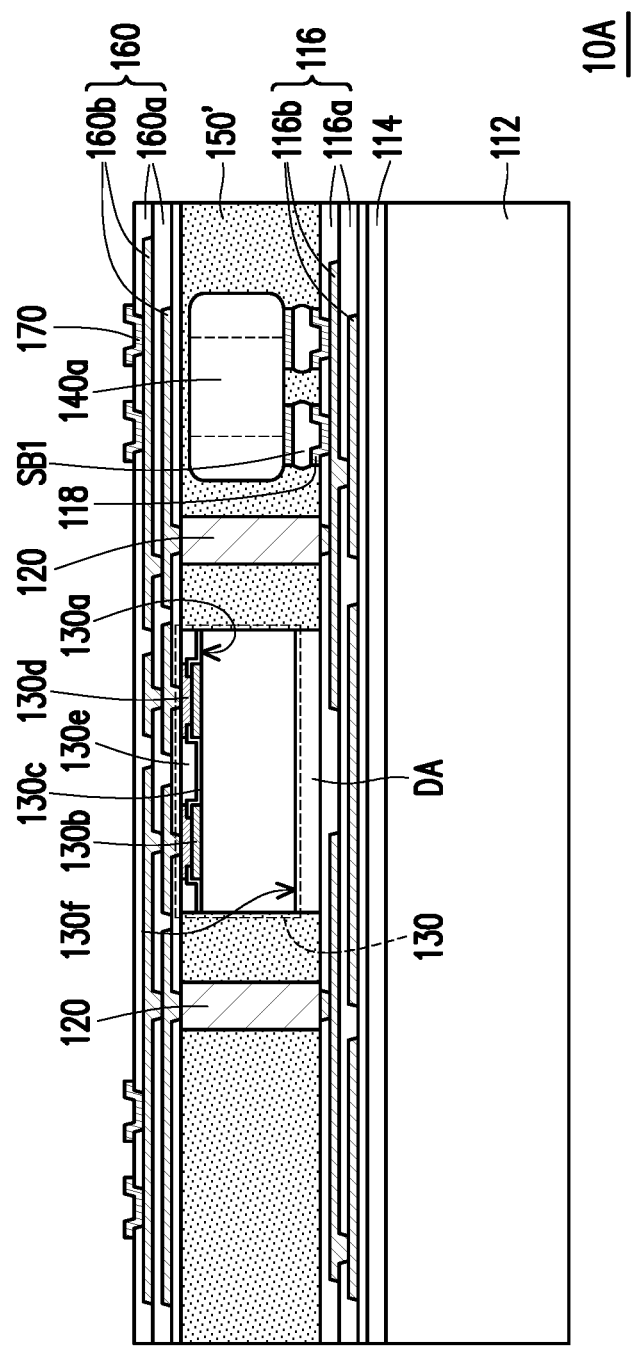

Referring to FIG. 5, in some embodiments, a redistribution layer 160 is formed on the through vias 120, the semiconductor die 130, the surface mount device 140, and the insulating encapsulation 150'. As shown in FIG. 5, the redistribution layer 160 is formed on the top surfaces 120a of the through vias 120, the top surfaces of the conductive pillars 130d and the protection layer 130e of the semiconductor die 130, and the top surface 150a' of the insulating encapsulation 150'. In some embodiments, the redistribution layer 160 is electrically connected to the through vias 120, is electrically connected to the semiconductor die 130 through the conductive pillars 130d, and is electrically connected to the surface mount device 140a through the through vias 120, the redistribution layer 116, the UBM patterns 118, and the solder balls SB1. In some embodiments, through the redistribution layer 160, the semiconductor die 130 is electrically connected to the through vias 120. In some embodiments, through the redistribution layer 160, through vias 120, the redistribution layer 116, the UBM patterns 118, and the solder balls SB1, the semiconductor die 130 is electrically connected to the surface mount device 140a. As shown in FIG. 5, for example, the redistribution layer 160 is referred as a front-side redistribution layer of the semiconductor die 130. In some embodiments, as shown in FIG. 5, the semiconductor die 130 is directly located between the redistribution layer 160 and the connecting film DA, and the through vias 120, the surface mount devie 140a, and the insulating encapsulation 150' are directly located between the redistribution layer 160 and the redistribution layer 116.

In some embodiments, the formation of the redistribution layer 160 includes sequentially forming one or more polymer dielectric layers 160a and one or more metallization layers 160b in alternation. In certain embodiments, as shown in FIG. 5, the metallization layers 160b are sandwiched between the polymer dielectric layers 160a, but the top surface of the topmost layer of the metallization layers 160b is exposed by the topmost layer of the polymer dielectric layers 160a and the lowest layer of the metallization layers 160b is exposed by the lowest layer of the polymer dielectric layers 160a to connect the through vias 120 and the conductive pillars 130d of the semiconductor die 130.

In some embodiments, the material of the polymer dielectric layers 160a includes polyimide, epoxy resin, acrylic resin, phenol resin, benzocyclobutene (BCB), polybenzooxazole (PBO), or any other suitable polymer-based semiconductor dielectric material, and the polymer dielectric layers 160a may be formed by coating. In one embodiment, the materials of the polymer dielectric layers 116a and the polymer dielectric layers 160a may be the same. In an alternative embodiment, the material of polymer dielectric layers 116a is different from the material of the polymer dielectric layers 160a. In some embodiments, the material of the metallization layers 160b includes aluminum, titanium, copper, nickel, tungsten, and/or alloys thereof, and the metallization layers 160b may be formed by electroplating or deposition. In one embodiment, the materials of the metallization layer 116b and the metallization layer 160b may be the same. In an alternative embodiment, the material of the metallization layer 116b is different from the material of the metallization layer 160b. However, it should be noted that the redistribution layer 160 is not limited to include two polymer dielectric layers and/or two metallization layers. In one embodiment, the redistribution layer 116 and/or the redistribution layer 160 provide a routing function for the semiconductor die 130.

Continued on FIG. 5, in some embodiments, a plurality of UBM patterns 170 are formed on the redistribution structure 160. In certain embodiments, the UBM patterns 170 are formed on the exposed top surface of the topmost layer of the metallization layers 160b of the redistribution structure 160 for electrically connecting with conductive elements (e.g. a connecting module or the like) and/or semiconductor elements (e.g., passive components or active components). As shown in FIG. 5, for example, the exposed lowest layer of the metallization layers 160b of the redistribution layer 160 is physically and electrically connected to the through vias 120 and the conductive pillars 130d of the semiconductor die 130, and the exposed top surface of the topmost layer of the metallization layers 160b is physically and electrically connected to the UBM patterns 160.

In some embodiments, the material of the UBM patterns 170, for example, may include copper, nickel, titanium, tungsten, or alloys thereof or the like, and may be formed by an electroplating process, for example. As shown in FIG. 5, only four UBM patterns 170 are presented in FIG. 5 for illustrative purposes, however it should be noted that more than or less than four UBM patterns 170 may be formed; the disclosure is not limited thereto. In one embodiment, the material of the UBM patterns 170 and the material of the UBM patterns 118 may be the same. In one embodiment, the material of the UBM patterns 170 is different from the material of the UBM patterns 118.

Figure 6:
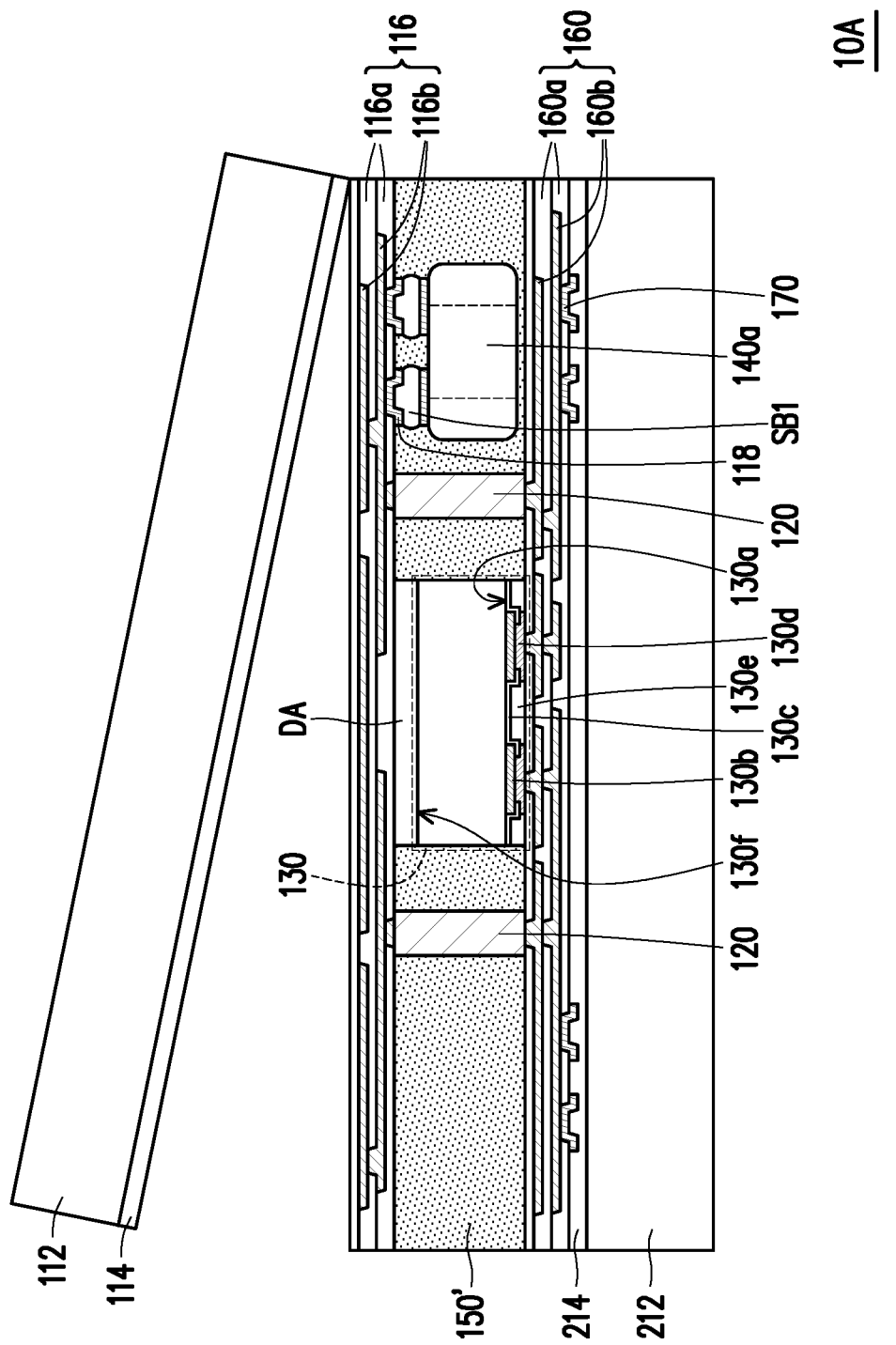

Referring to FIG. 6, in some embodiments, the whole package structure 10A along with the carrier 112 is flipped (turned upside down), and the redistribution layer 160 is placed on a carrier 212 provided with a debond layer 214. The material of the carrier 212 may be the same or similar to the material of the carrier 122, in some embodiments, thus may not repeated herein. As shown in FIG. 6, portions of the UBM patterns 170 are embedded in the debond layer 214 to ensure the position of the package strcutre 10A. The material of the debond layer 214, for example, may be the same or similar to the material of the debond layer 114. In certain embodiments, the material of the debond layer 114 may include a polymer film having sufficient elasticity to allow the UBM patterns 170 being embedded therein.

Continued on FIG. 6, in some embodiments, after the redistribution layer 160 is placed on the carrier 212, the carrier 112 is debonded from the redistribution layer 116. In some embodiments, the redistribution layer 116 is easily separated from the carrier 112 due to the debond layer 114, and the lowest layer of the polymer dielectric layers 116a of the redistribution layer 116 is exposed. In some embodiments, the carrier 112 is detached from the redistribution layer 116 through a debonding process, and the carrier 112 and the debond layer 114 are removed. In one embodiment, the debonding process is a laser debonding process.

Figure 7:
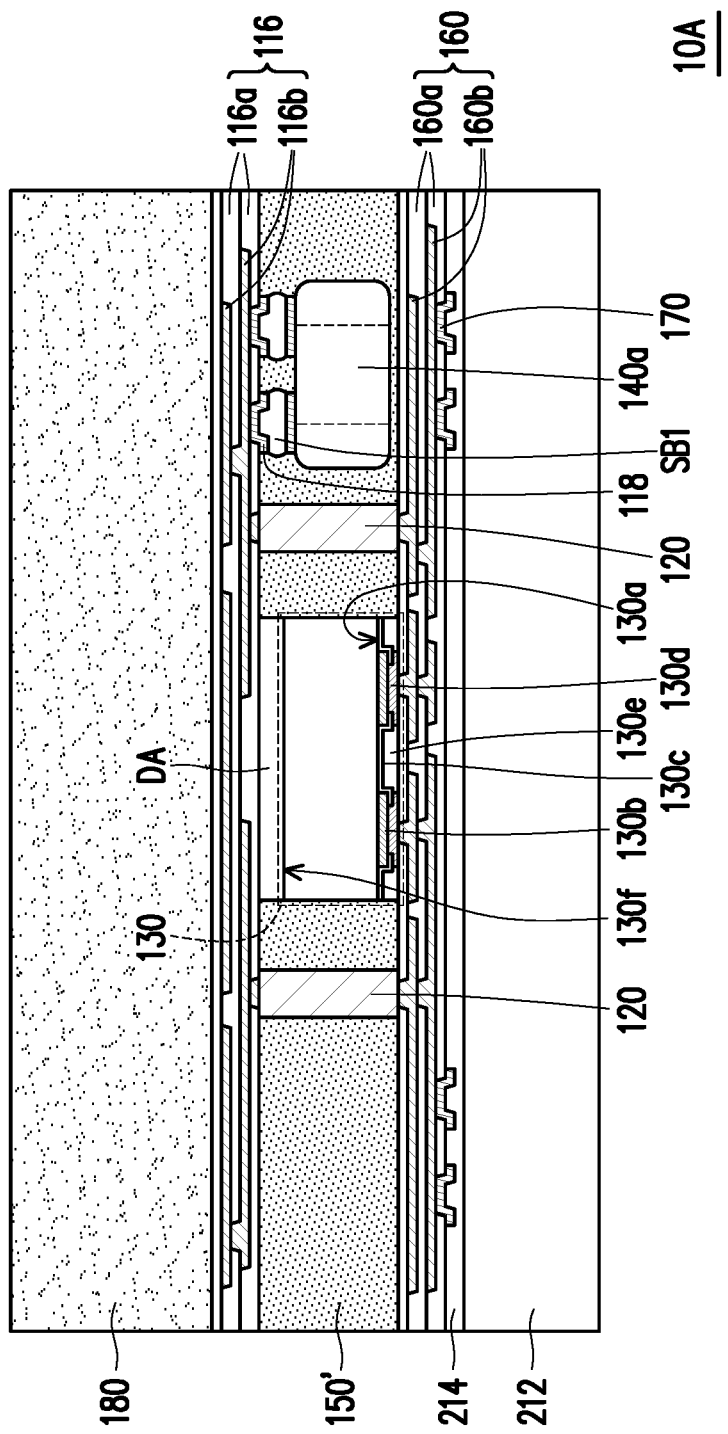

Referring to FIG. 7, in some embodiments, an encapsulant 180 is formed on the redistribution layer 116, where the redistribution layer 116 is located between the encapsulant 180 and the insulating encapsulation 150'. In some embodiments, the encapsulant 180 includes, for example, epoxy resins or any other suitable type of molding materials. In some embodiments, the material of the encapsulant 180 has low permittivity (Dk) and low loss tangent (Df) properties. Depending on the frequency range of the high-speed applications, suitable materials of the encapsulant may be selected based on the required electrical properties of the package. In some embodiments, the material of the encapsulant 180 and the material of the insulating encapsulation 150' may be the same. In an alternative embodiment, the material of the encapsulant 180 can be different from the material of the insulating encapsulation 150', the disclosure is not limited thereto.

Figure 8:
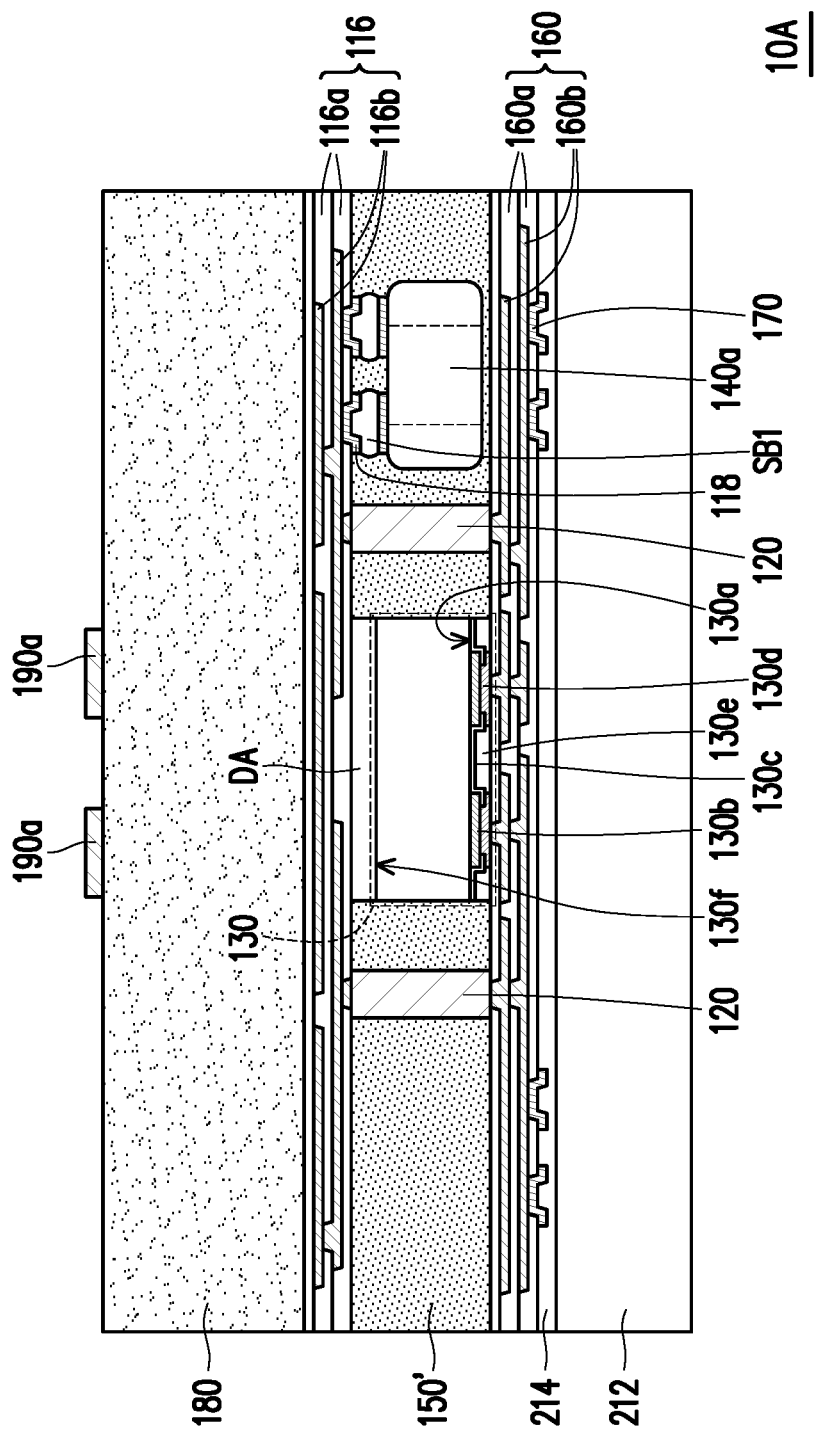

Referring to FIG. 8, in some embodiments, antenna elements 190a are formed on formed on the encapsulant 180. The encapsulant 180 is located between the antenna elements 190a and the redistribution layer 116. As shown in FIG. 8, the antenna elements 190a are formed on a surface of the encapsulant 180 facing away from the redistribution layer 116. In some embodiments, the antenna elements 190a are electrically coupled with the redistribution layer 116a which serves a feed-line for the antenna elements 190a, and a portion of the redistribution layer 116 overlapped with the antenna elements 190a serves as a ground plate for the antenna elements 190a. In some embodiment, the redistribution layer 116 is referred as a ground plate and/or a feed line.

In some embodiments, the antenna elements 190a are formed by forming a metallization layer (not shown) by electroplating or deposition over the encapsulant 180 and then patterning the metallization layer by photolithographic and etching processes. In an alternative embodiment, the antenna elements 190a are formed by forming a metallization layer (not shown) by plating process. In some embodiments, the material of the first metallization layer includes aluminum, titanium, copper, nickel, tungsten, and/or alloys thereof. In some embodiments, the antenna elements 190a are arranged in form of a matrix, such as the N×N array or N×M arrays (N, M>0, N may or may not be equal to M). The size of the array for antenna elements 190a can be designated and selected based on the demand. In some embodiment, the antenna elements 190a may include patch antennas.

Figure 9:
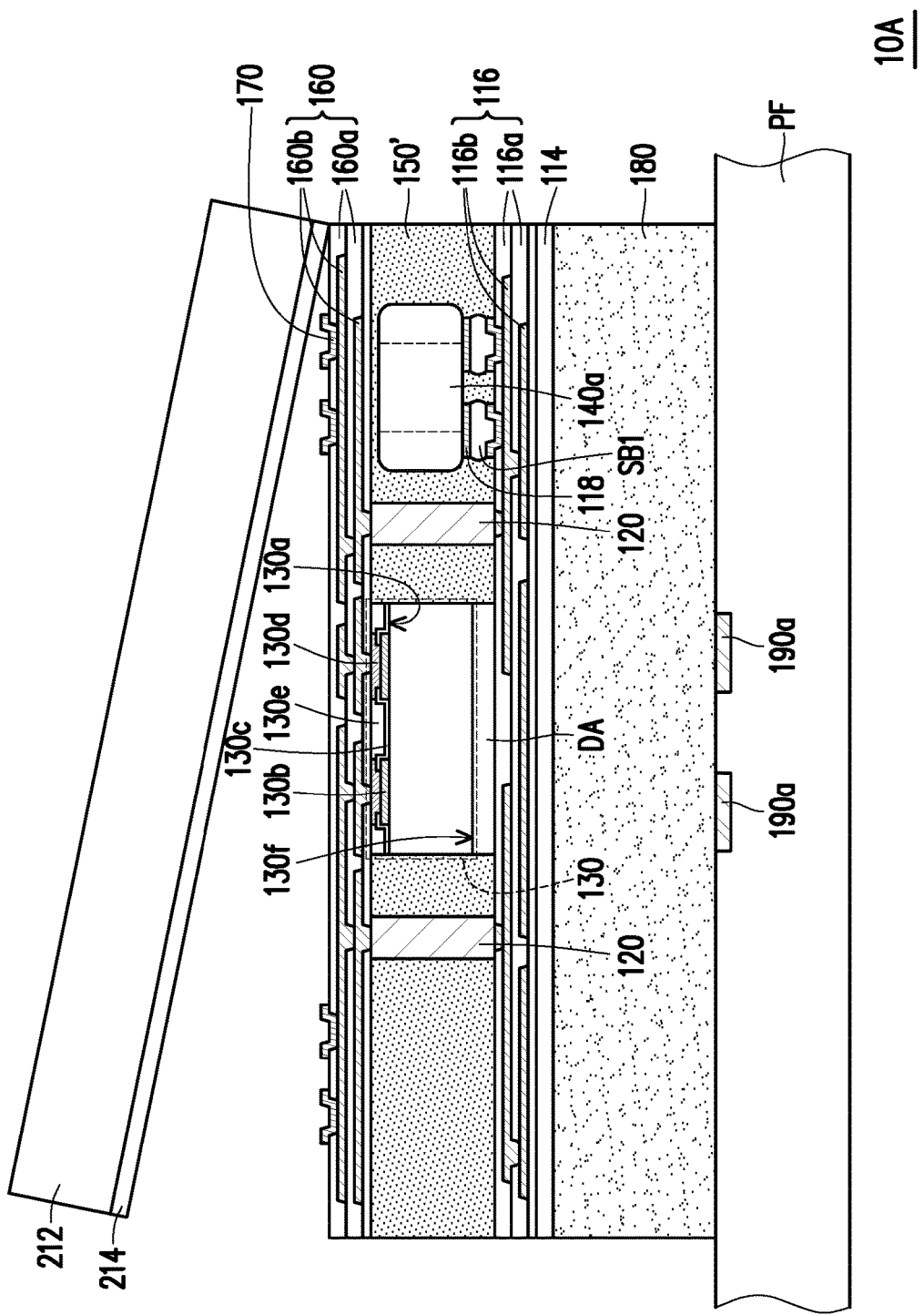

Referring to FIG. 9, in some embodiments, the whole package structure 10A along with the carrier 212 is flipped (turned upside down), and the antenna elements 190a are mounted into a polymer film PF. In certain embodiments, the antenna elements 190a are embedded in the polymer film PF. In some embodiments, the material of the polymer film PF may include a polymer film having sufficient elasticity to allow the antenna elements 190a being embedded therein. In some embodiments, the polymer film PF may be a parafilm or a film made of other suitable soft polymer materials or the like.

Continued on FIG. 9, in some embodiments, after the antenna elements 190a are mounted into the polymer film PF, the carrier 212 is debonded from the redistribution layer 160. In some embodiments, the redistribution layer 160 is easily separated from the carrier 212 due to the debond layer 214, and the UBM patterns 170 and the lowest layer of the polymer dielectric layers 160a of the redistribution layer 160 are exposed. In some embodiments, the carrier 212 is detached from the redistribution layer 160 through a debonding process, and the carrier 212 and the debond layer 214 are removed. In one embodiment, the debonding process is a laser debonding process.

Figure 10:
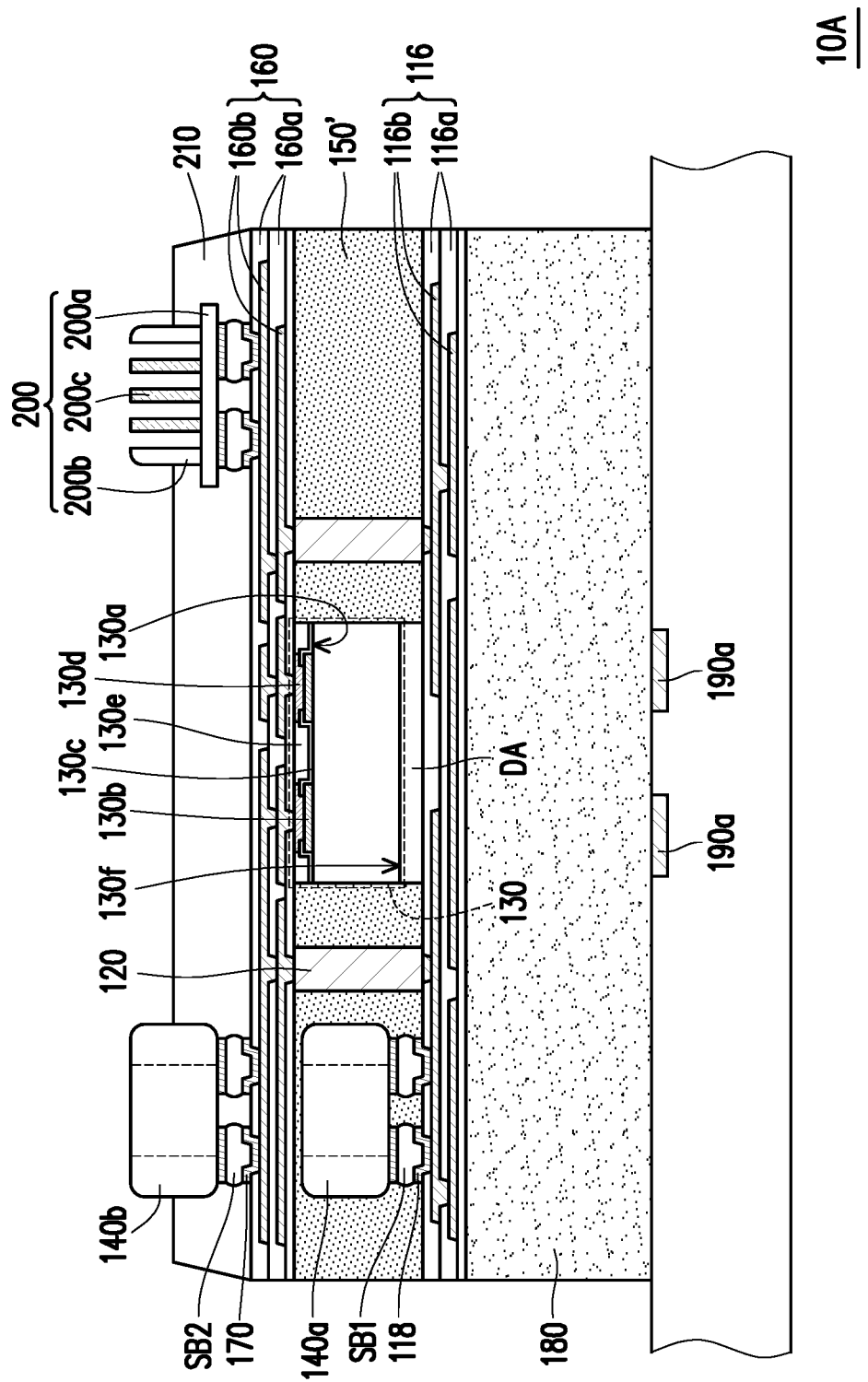

Referring to FIG. 10, in some embodiments, at least one surface mount device 140b and at least one connecting module 200 are mounted onto the UBM patterns 170 by solder balls SB2, and are electrically connected to the redistribution layer 160 through the UBM patterns 170 and the solder balls SB2. As shown in FIG. 10, the surface mount device 140b is electrically connected to the semiconductor die 130 through the solder balls SB2, the UBM patterns 170, and the redistribution layer 160, is electrically connect to the through vias 120 through the solder balls SB2, the UBM patterns 170, and the redistribution layer 160, and is electrically connected to the surface mount device 140a through the solder balls SB2, the UBM patterns 170, the redistribution layer 160, the through vias 120, the redistribution layer 116, the UBM pattern 118, and the solder balls SB1.

In some embodiments, the surface mount device 140b may be may include passive devices such as, capacitors, resistors, inductors, combinations thereof, or the like. The number of the surface mount device 140b can be selected to be more than one based on the demand. In an alternative embodiment, the surface mount device 140b may further include additional surface mount device (s) of the same type or different types, the disclosure is not limited thereto. In one embodiment, the surface mount device 140b may be the same as the surface mount device 140a. In an alternative embodiment, the surface mount device 140b may be different from the surface mount device 140a. The disclosure is not limited thereto.

In some embodiments, as shown in FIG. 10, the connecting module 200 is electrically connected to the semiconductor die 130 through the solder balls SB2, the UBM patterns 170, and the redistribution layer 160, is electrically connect to the through vias 120 through the solder balls SB2, the UBM patterns 170, and the redistribution layer 160, and is electrically connected to the surface mount device 140a through the solder balls SB2, the UBM patterns 170, the redistribution layer 160, the through vias 120, the redistribution layer 116, the UBM pattern 118, and the solder balls SB1. In some embodiments, the surface mount device 140b and the connecting module 200 are electrically connected to each other through the solder balls SB2, the UBM patterns 170, and the redistribution layer 160.

In some embodiments, the connecting module 200 includes a circuit board 200a, a frame structure 200b, and a plurality of pins 200c, where the frame structure 200b and the pins 200c are located on the circuit board 200a, and the pins 200c are surrounded by the frame structure 200b. In some embodiments, the circuit board 200a includes an interconnection circuitry structure comprising metal layers and dielectric layers arranged in alternation. In some embodiments, the pins 200c are distributed over a surface of the circuit board 210, where the pins 200c are electrically connected to the metal layers of the circuit board 200a, and a material of the pins 200c may include copper, copper alloy, or the like. In the disclosure, a dimension of the pins is significantly greater than a dimension of the metallization layers of the redistribution layer 116 and redistribution layer 160. In some embodiments, the frame structure 200b surrounds the pins 200c, where a material of the frame structure 200b may include a dielectric layer with suitable stiffness to protect the pins being damaged due to external forces. In one embodiment, the connecting module 200 may be surface mount devices (SMD), general radio frequency (RF) signal connectors (multiple pins (3-16 pins)), or the like, however the disclosure is not limited thereto. Due to the connecting module 200, the package structure 10A is capable of being electrically connected to additional external electronic device(s) while maintaining an impact volume and a small form factor.

Continued on FIG. 10, in some embodiments, after the surface mount device 140b and the connecting module 200 are mounted on the redistribution layer 160, a protection layer 210 is formed on the redistribution layer 160, where the connecting module 200 is accessibly exposed by the protection layer 210. In some embodiments, the protection layer 210 covers the redistribution layer 160 exposed by the solder balls SB2, the UBM patterns 170, the surface mount device 140b, and the connecting module 200, and the protection layer 210 at least covers sidewalls of the surface mount device 140b and the connecting module 200. In some embodiments, a material of the protection layer 210 may include a glue or a glue material, and the protection layer 210 is formed by glue dispensing. For example, the protection layer 210 may be dispensed as a liquid and cured or may be a laminate film laminated onto the redistribution layer 160, or may be the like. Due to the protection layer 210, the surface mount device 140b and the connecting module 200 are stably fixed on the redistribution layer 160, and the adhesion degrees of the surface mount device 140b and the connecting module 200 to the redistribution layer 116 are further enhanced. As shown in FIG. 10, the redistribution layer 160 is located between the protection layer 210 and the insulation encapsulation 150', between the protection layer 210 and the semiconductor die 130, between the protection layer 210 and the surface mount device 140a, and between the protection layer 210 and the through vias 120.

Figure 11:
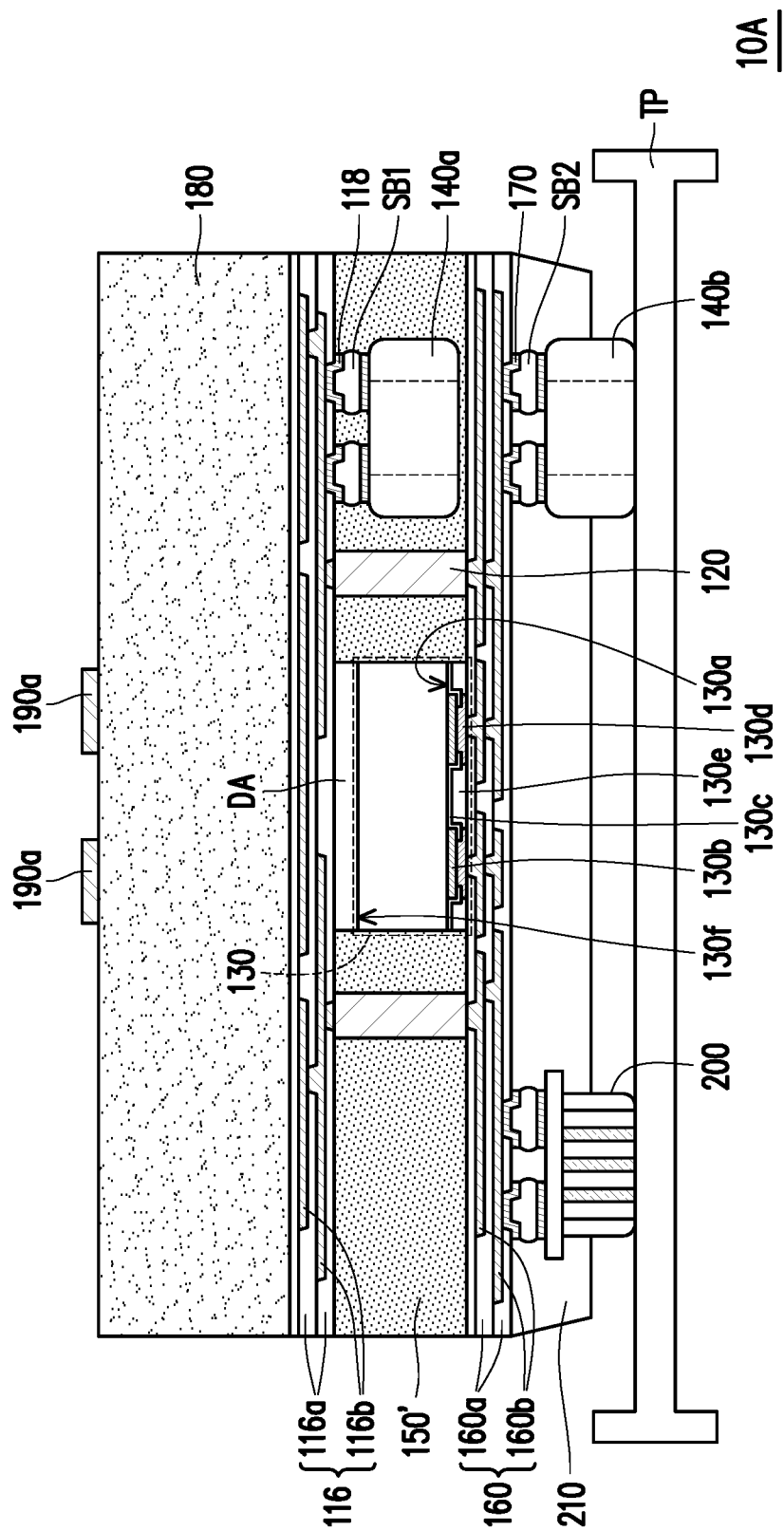

Referring to FIG. 11, in some embodiments, the whole package structure 10A along with the polymer film PF is flipped (turned upside down), and then the antenna elements 190a are released from the polymer film PF by removing the polymer film PF. In some embodiments, a holding device TP is adopted to secure the package structures 10A before releasing the antenna elements 190a (e.g. removing the polymer film PF). In some embodiments, the holding device TP may be an adhesive tape, a carrier film or a suction pad. As shown in FIG. 11, for example, the surface mount device 140b and the connecting module 200 are held by the holding device TP.

Figure 12:
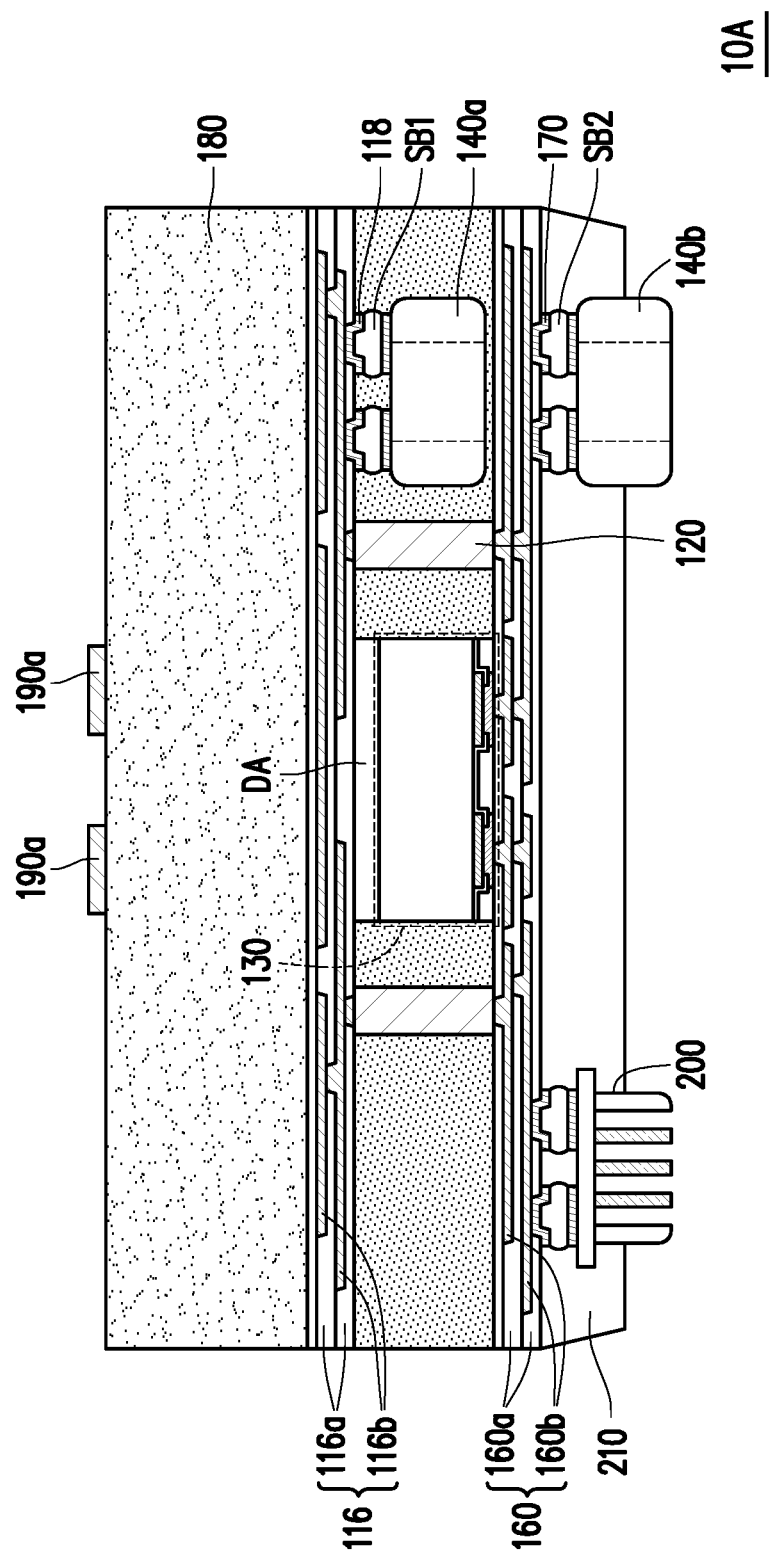

Referring to FIG. 12, in some embodiments, the surface mount device 140b and the connecting module 200 are released from the holding device TP to form the package structure 10A. Up to here, the manufacture of the package structures 10A is completed.

In some embodiments, prior to releasing the surface mount device 140b and the connecting module 200 from the holding device TP, a dicing process is performed to cut the wafer having a plurality of the package structures 10A into individual and separated package structures 10A. In one embodiment, the dicing process may be a wafer dicing process including mechanical blade sawing or laser cutting; the disclosure is not limited thereto.

Figure 13:
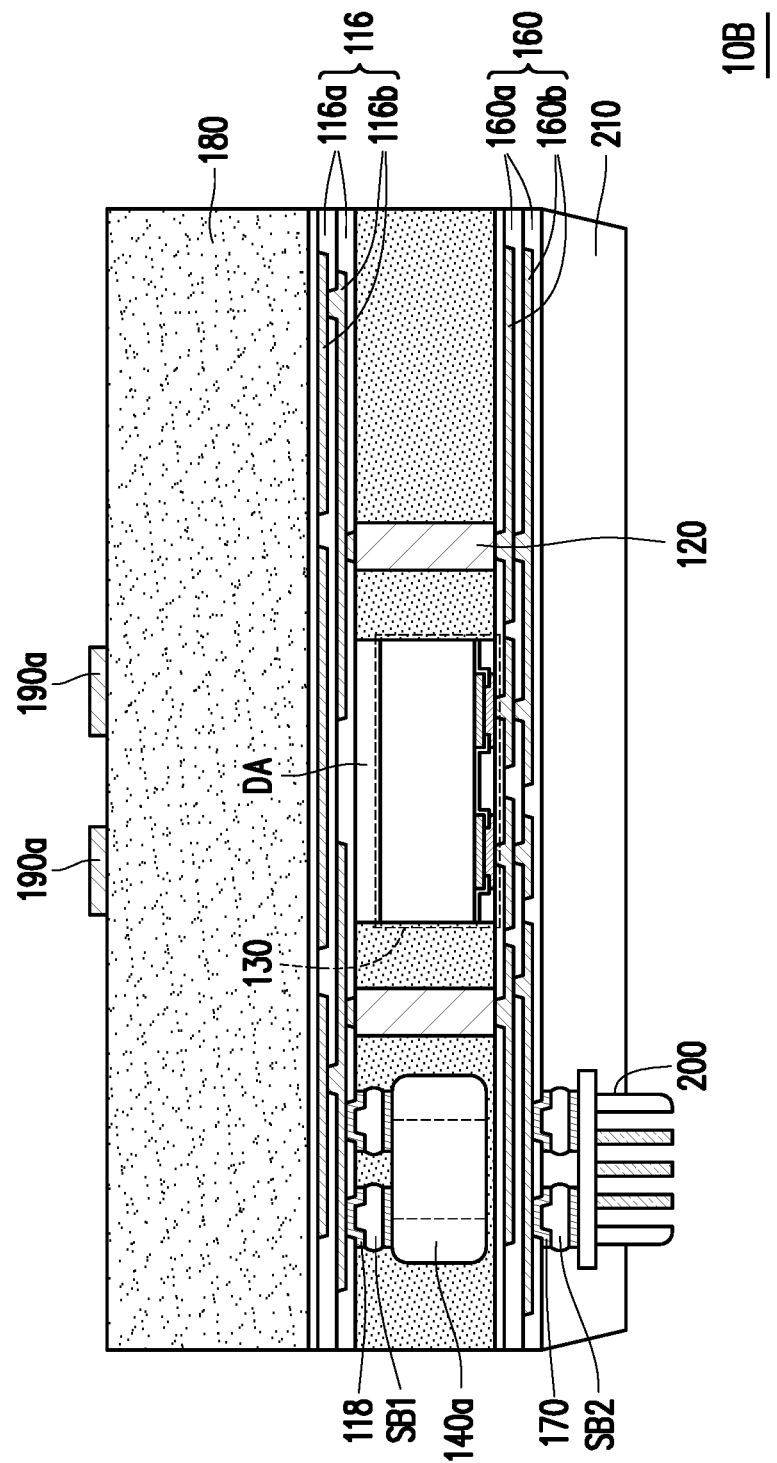
FIG. 13 is a schematic cross sectional view of a package structure according to some exemplary embodiments of the present disclosure.

FIG. 13 is a schematic cross sectional view of a package structure according to some exemplary embodiments of the present disclosure. Referring to FIG. 12 and FIG. 13 together, the package structure 10A depicted in FIG. 12 and the package structure 10B depicted in FIG. 13 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 12 and FIG. 13 together, the difference is that, for the package structure 10B depicted in FIG. 13, the package structure 10B may exclude the surface mount device 140b. In some embodiments, as shown in FIG. 13, since there is no surface mount device 140b presented in the package structure 10B, the connecting module 200 may be relocated to the position of the surface mount device 140b of the package structure 10A depicted in FIG. 12. However, the disclosure is not limited thereto. In an alternative embodiment, the connecting module 200 may be stayed at the same position as depicted in FIG. 12.

Figure 14:
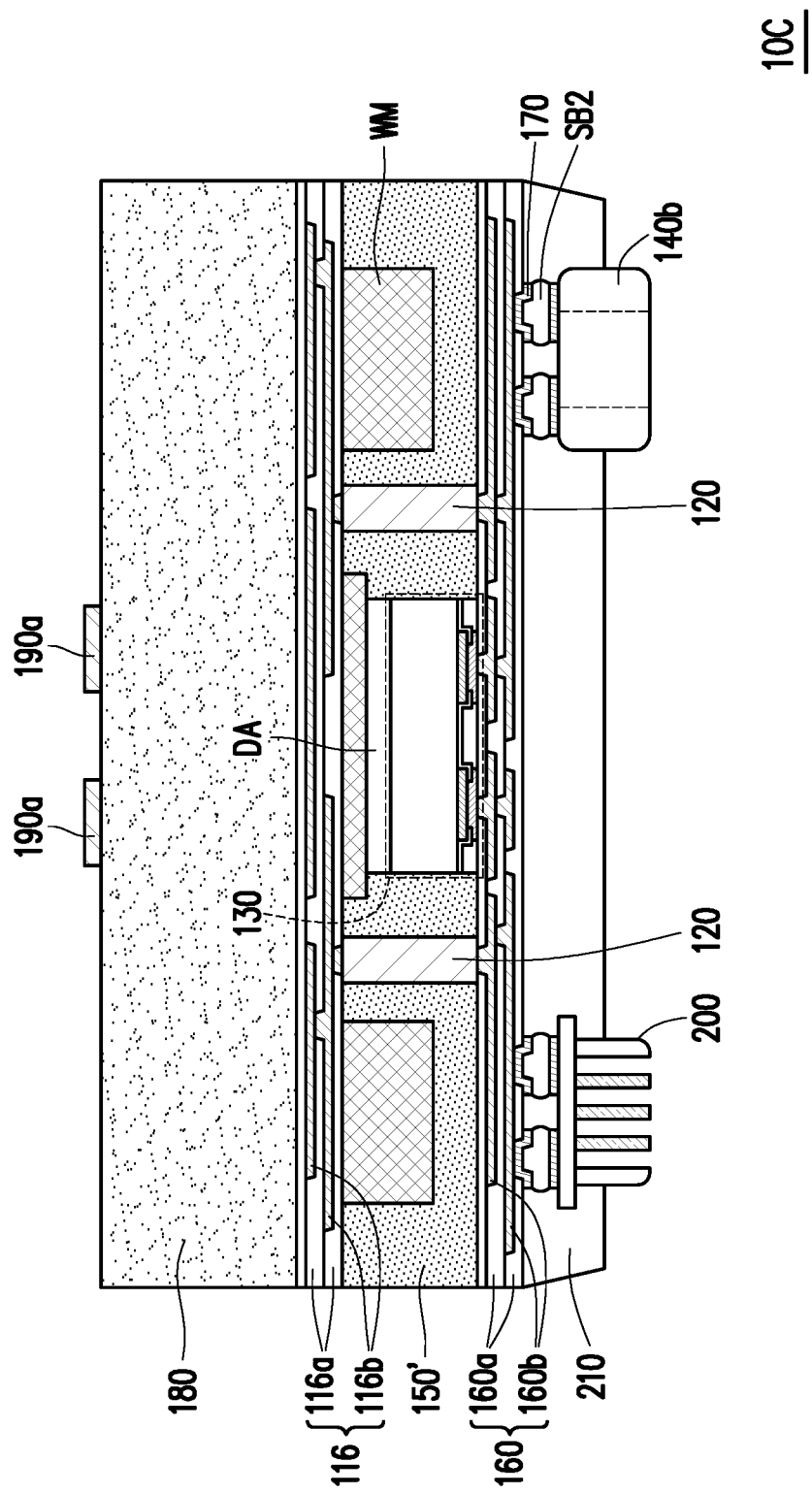
FIG. 14 is a schematic cross sectional view of a package structure according to some exemplary embodiments of the present disclosure.

FIG. 14 is a schematic cross sectional view of a package structure according to some exemplary embodiments of the present disclosure. Referring to FIG. 12 and FIG. 14 together, the package structure 10A depicted in FIG. 12 and the package structure 10C depicted in FIG. 14 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 12 and FIG. 14 together, the difference is that, for the package structure 10C depicted in FIG. 14, the package structure 10C may excludes the surface mount device 140b and further include an additional element, warpage control elements WM.

In some embodiments, the warpage control elements WM are formed on the redistribution layer 116 and encapsulated in the insulating encapsulation 150'. As shown in FIG. 14, the warpage control elements WM are located between the redistribution layer 116 and the redistributor layer 160 and between the redistribution layer 116 and the connecting film DA. In some embodiments, a coefficient of CTE of the warpage control elements WM is different from a coefficient of CTE of the insulating encapsulation 150'. Due to the warpage control elements WM, more control of the ratio of the encapsulant may be achieved, and thereby reducing the stress and warpage from the coefficient of CTE mismatch during any thermal process may be performed in the manufacture of the package structure 10C. In one embodiment, the warpage control elements WM may include dummy semiconductor die which is not electrically communicated with any components of the package structure 10C. In one embodiment, a material of the warpage control elements WM may include liquid molding compounds, polymer-based materials, substrate materials (e.g. prepreg, ABF, or the like), other suitable materials, or combinations thereof. For example, the formation of the warpage control elements WM may include disposing the warpage control elements WM on the redistribution layer 116 before disposing the semiconductor die 130 on the redistribution layer 116.

Figure 15:
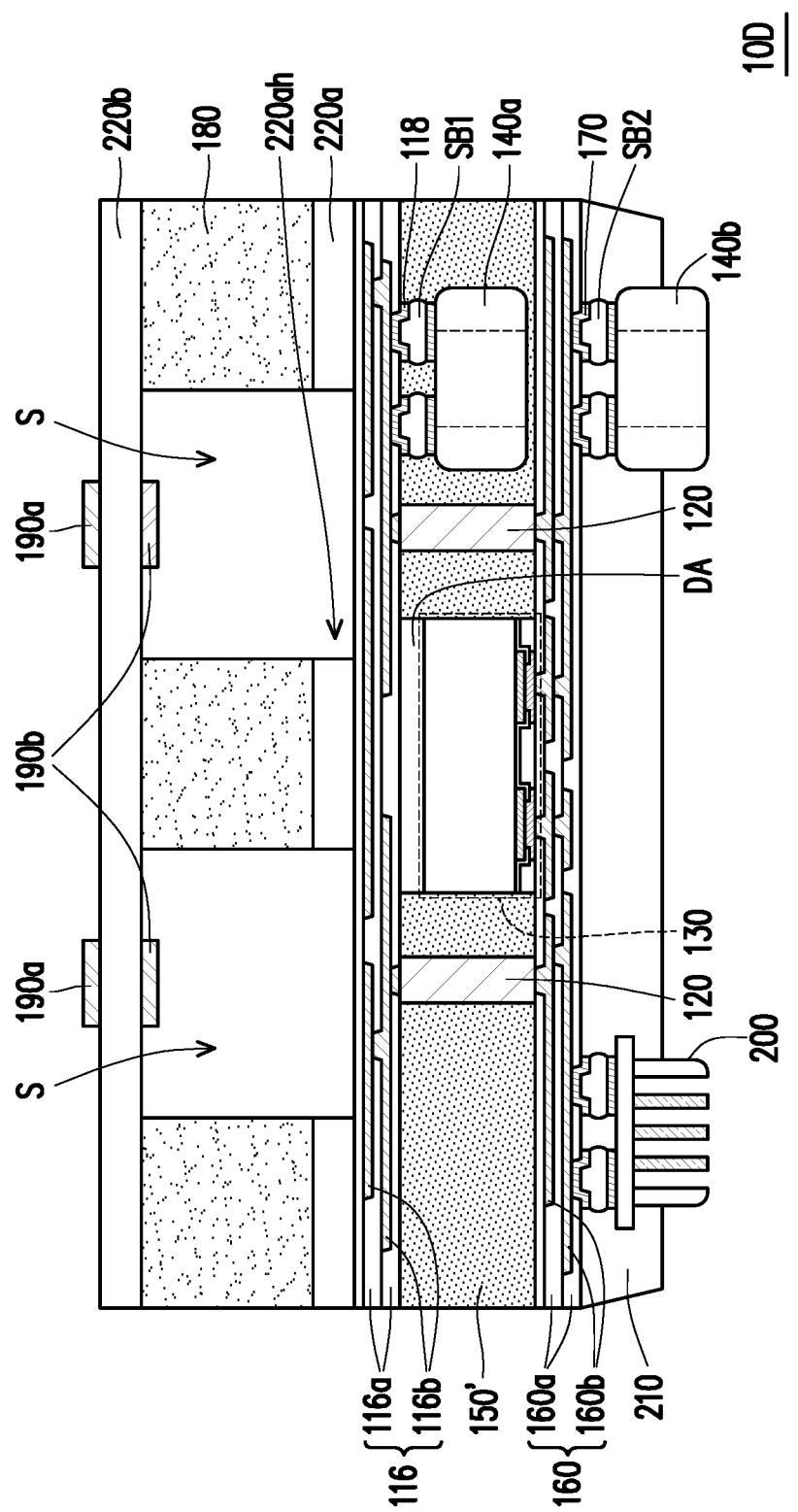
FIG. 15 is a schematic cross sectional view of a package structure according to some exemplary embodiments of the present disclosure.

FIG. 15 is a schematic cross sectional view of a package structure according to some exemplary embodiments of the present disclosure. Referring to FIG. 12 and FIG. 15 together, the package structure 10A depicted in FIG. 12 and the package structure 10D depicted in FIG. 15 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 12 and FIG. 15 together, the difference is that, for the package structure 10D depicted in FIG. 15, the package structure 10D may include antenna elements 190b, a dielectric layer 220a, a dielectric layer 220b, and air cavities S formed in the encapsulant 180.

In some embodiments, as shown in FIG. 15, the air cavities S are located in the encapsulant 180, where a location of each of the air cavities S is corresponding to a respective one of the antenna elements 190a. In other words, a location of each of the air cavities S is overlapped with a location of a respective one of the antenna elements 190a in the vertical projection on the redistribution layer 116. In some embodiments, the encapsulant 180 is sandwiched between the dielectric layer 220a and the dielectric layer 220b, where the dielectric layer 220a is located between the encapsulant 180 and the redistribution layer 116, and the dielectric layer 220b is located between the encapsulant 180 and the antenna elements 190a. As shown in FIG. 15, the dielectric layer 220a has openings 220ah, where each of the openings 220ah formed in the dielectric layer 220a is spatially communicated with a respective one of the air cavities S, for example. In some embodiments, the antenna elements 190b are formed on the dielectric layer 220b and respectively located in the air cavities S formed in the encapsulant 180, such that the antenna elements 190b are electrically coupled to the antenna elements 190a, respectively.

In one embodiment, materials of the dielectric layer 220a and the dielectric layer 220b may include a photo-sensitive material such as polybenzoxazole (PBO), polyimide, benzocyclobutene (BCB), a combination thereof or the like, which may be easily patterned using a lithography mask. In an alternative embodiment, the materials of the dielectric layer 220a and the dielectric layer 220b may include a nitride such as silicon nitride, an oxide such as silicon oxide, phosphosilicate glass (PSG), borosilicate glass (BSG), boron-doped phosphosilicate glass (BPSG), a combination thereof or the like. The dielectric layer 220a and the dielectric layer 220b, for example, may be formed by suitable fabrication techniques such as spin-coating, chemical vapor deposition (CVD), plasma-enhanced chemical vapor deposition (PECVD) or the like. In one embodiment, the material of the dielectric layer 220a and the material of the dielectric layer 220b may be the same. In an alternative embodiment, the material of the dielectric layer 220a is different from the material of the dielectric layer 220b.

In some embodiment, the antenna elements 190b may include patch antennas. In one embodiment, the material of the antenna elements 190b and the material of the antenna elements 190a may be the same. In an alternative embodiment, the material of antenna elements 190b is different from the material of the antenna elements 190a. In certain embodiments, as shown in FIG. 15, the antenna elements 190b are electrically coupled with the redistribution layer 116a which serves a feed-line for the antenna elements 190b, a portion of the redistribution layer 116 overlapped with the antenna elements 190b serves as a ground plate for the antenna elements 190b, and the antenna elements 190a and the antenna elements 190b are electrically coupled to each other. Due to the antenna elements 190a and the antenna elements 190b, a better antenna application can be achieved. Furthermore, since the air has low permittivity (Dk) and low loss tangent (Df) properties, the package structure 10D further achieves a low loss in gain for the antenna elements 190a and the antenna elements 190b due to the air cavities S.

FIG. 16 to FIG. 25 are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein. In FIG. 16 to FIG. 25, one semiconductor die is shown to represent plural semiconductor dies of the wafer, and a package structure 20A is shown to represent a package structure obtained following the manufacturing method, for example. In other embodiments, two chips or semiconductor dies are shown to represent plural chips or semiconductor dies of the wafer, and one or more package structures are shown to represent plural (semiconductor) package structures obtained following the (semiconductor) manufacturing method, the disclosure is not limited thereto. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure.

Figure 16:
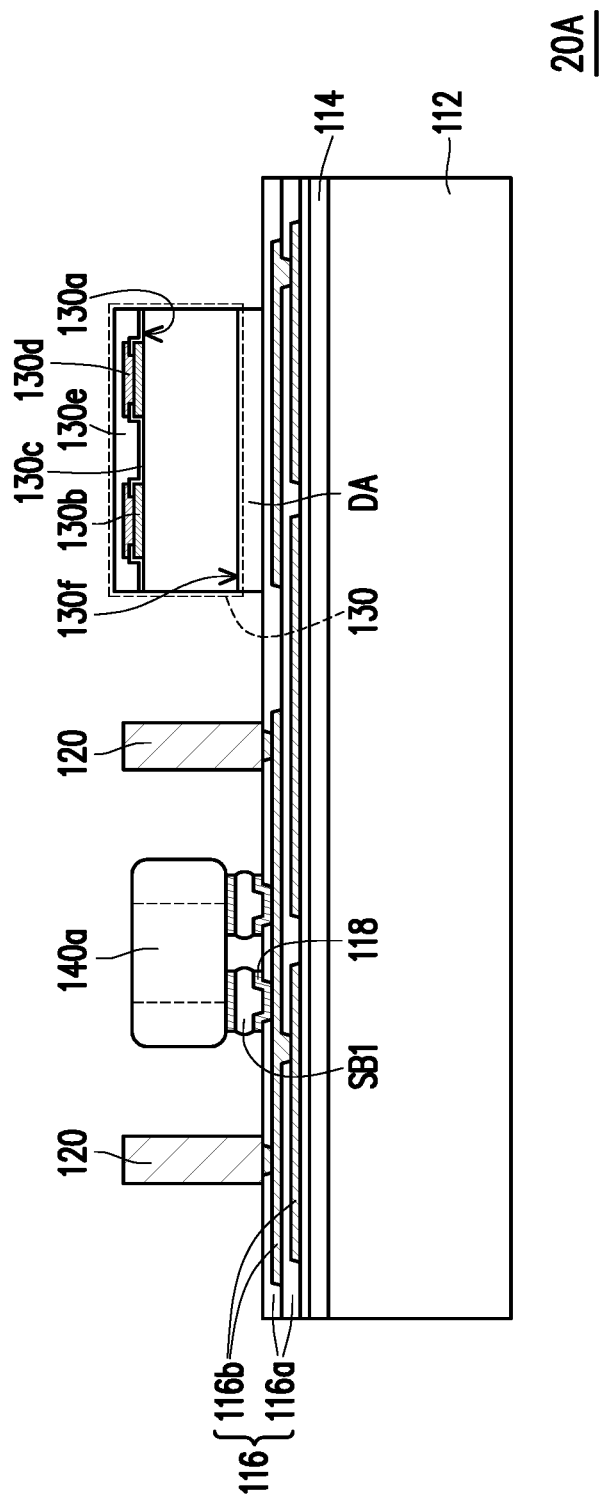
FIG. 16 to FIG. 25 are schematic cross sectional views of various stages in a manufacturing method of a package structure according to some exemplary embodiments of the present disclosure.

Referring to FIG. 16, in some embodiments, a carrier 112 is provided. In some embodiments, as shown in FIG. 16, the carrier 112 is provided with a debond layer 114 formed thereon. In one embodiment, the material of the debond layer 114 may be any material suitable for debonding the carrier 112 from the above layers or any wafer(s) disposed thereon. As shown in FIG. 16, in some embodiments, a redistribution layer 116 is formed on the debond layer 114, where the debond layer 114 is located between the carrier 12 and the redistribution layer 116.

In some embodiments, through vias 120 and UBM patterns 118 are formed on the redistribution layer 116. In one embodiment, the through vias 120 are formed prior to the formation of the UBM patterns 118. In an alternative embodiment, the UBM patterns 118 are formed prior to the formation of the through vias 120. In some embodiments, the redistribution layer 116 is mechanically connected to the through vias 120 and the UBM patterns 118 by direct contact. As shown in FIG. 16, in some embodiments, the redistribution layer 116 is electrically connected to the through vias 120.

In some embodiments, at least one semiconductor die 130 with a connecting film DA disposed thereon and at least one surface mount device 140a are provided. As shown in FIG. 16, the semiconductor die 130 is disposed on the redistribution layer 116 and over the carrier 112 through the connecting film DA. In some embodiments, the connecting film DA is located between the semiconductor die 130 and the redistribution layer 116, and the connecting film DA is physically contacts a backside surface 130f of the semiconductor die 130 and the redistribution layer 116. In some embodiments, due to the connecting film DA provided between the semiconductor die 130 and the redistribution layer 116, the semiconductor die 130 and the redistribution layer 116 are stably adhered to each other. In some embodiments, the redistribution layer 116 is referred as a back-side redistribution layer of the semiconductor die 130. As shown in FIG. 16, for example, the through vias 120 are located aside of a location of the semiconductor die 130. In some embodiments, the surface mount device 140a is mounted onto and electrically connected to the redistribution layer 116 by solder balls SB1 and the UBM patterns 118. As shown in FIG. 16, the surface mount device 140a is located aside of the locations of the semiconductor die 130 and the through vias 120, where the through vias 120, the semiconductor die 130, and the surface mount device 140a are located at the same side of the redistribution layer 116.

Figure 17:
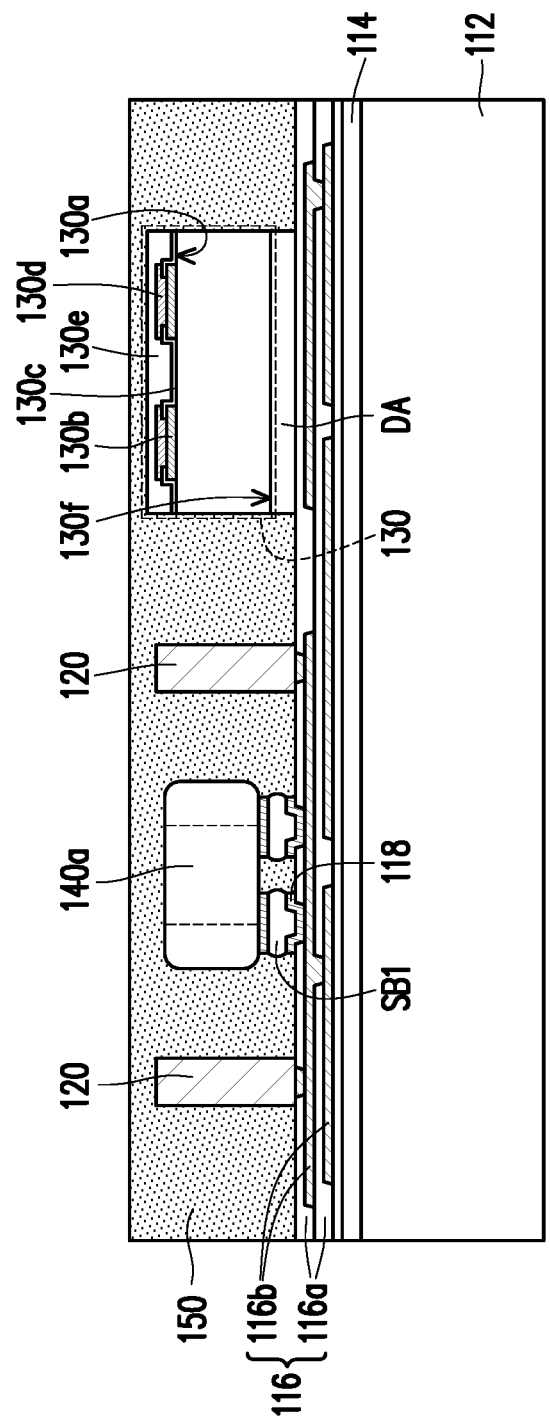

Referring to FIG. 17, in some embodiments, the through vias 120, the semiconductor die 130, and the surface mount device 140a are encapsulated in an insulating encapsulation 150. In some embodiments, the insulating encapsulation 150 is formed on the redistribution layer 116 and over the carrier 112. As shown in FIG. 17, the insulating encapsulation 150 at least fills up the gaps between the through vias 120, and between the through vias 120, the solder balls SB1, the semiconductor die 130, the surface mount device 140a, and the connecting film DA. In certain embodiments, as shown in FIG. 17, the through vias 120, the semiconductor die 130, and the surface mount device 140a are not accessibly revealed by the insulating encapsulation 150.

Figure 18:
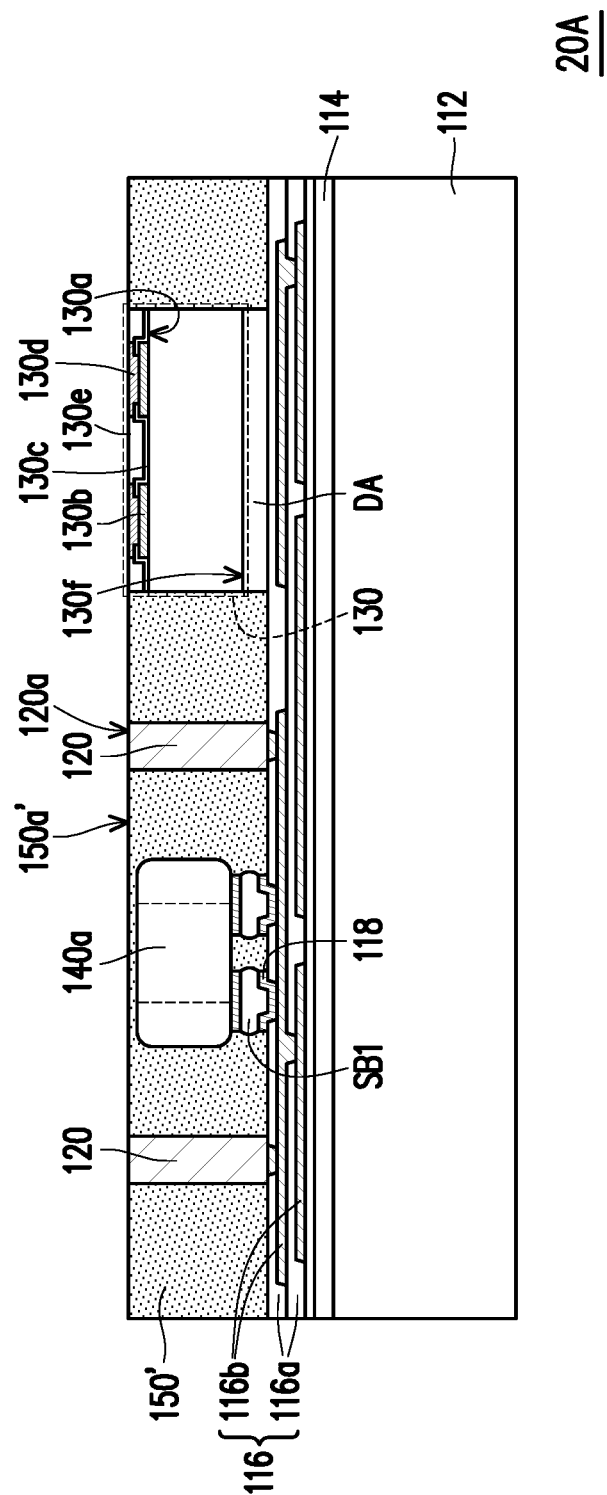

Referring to FIG. 18, in some embodiments, the insulating encapsulation 150 is planarized to form an insulating encapsulation 150' exposing the through vias 120 and the semiconductor die 130. In certain embodiments, as shown in FIG. 18, after the planarization, top surfaces 120a of the through vias 120 and top surfaces of the conductive pillars 130d and the protection layer 130e of the semiconductor die 130 are exposed by a top surface 150a' of the insulating encapsulation 150'. That is, for example, the top surfaces of the conductive pillars 130d and the protection layer 130e of the semiconductor die 130 and the top surfaces 120a of the through vias 120 become substantially leveled with the top surface 150a' of the insulating encapsulation 150'. In other words, the top surfaces of the conductive pillars 130d and the protection layer 130e of the semiconductor die 130, the top surfaces 120a of the through vias 120, and the top surface 150a' of the insulating encapsulation 150' are substantially coplanar to each other.

In some embodiments, after the planarizing step, a cleaning step may be optionally performed to clean and remove the residue generated from the planarizing step. However, the disclosure is not limited thereto, and the planarizing step may be performed through any other suitable method. In some embodiments, during planarizing the insulating encapsulation 150, the conductive pillars 130d and the protection layer 130e of the semiconductor die 130 and the through vias 120 may also be planarized.

Figure 19:
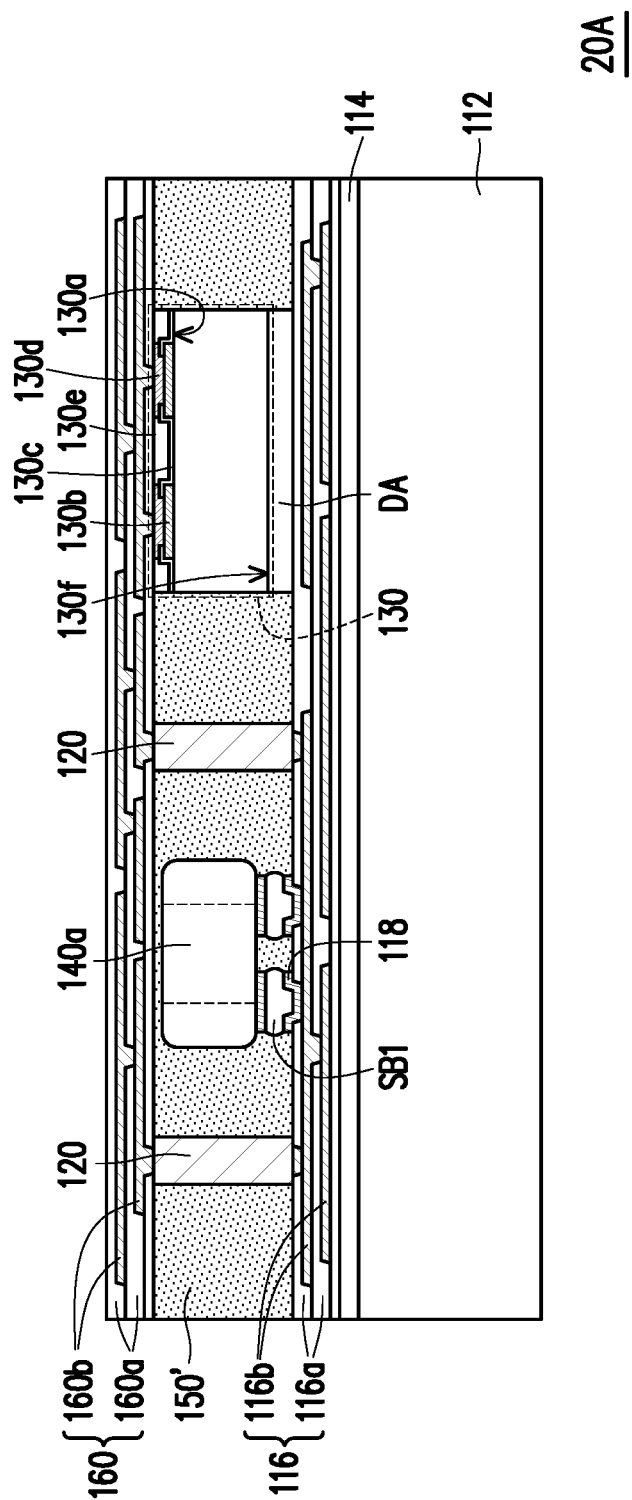

Referring to FIG. 19, in some embodiments, a redistribution layer 160 is formed on the through vias 120, the semiconductor die 130, the surface mount device 140, and the insulating encapsulation 150'. As shown in FIG. 19, the redistribution layer 160 is formed on the top surfaces 120a of the through vias 120, the top surfaces of the conductive pillars 130d and the protection layer 130e of the semiconductor die 130, and the top surface 150a' of the insulating encapsulation 150'. In some embodiments, the redistribution layer 160 is electrically connected to the through vias 120, is electrically connected to the semiconductor die 130 through the conductive pillars 130d, and is electrically connected to the surface mount device 140a through the through vias 120, the redistribution layer 116, the UBM patterns 118, and the solder balls SB1. In some embodiments, through the redistribution layer 160, the semiconductor die 130 is electrically connected to the through vias 120. In some embodiments, through the redistribution layer 160, the through vias 120, the redistribution layer 116, the UBM patterns 118, and the solder balls SB1, the semiconductor die 130 is electrically connected to the surface mount device 140a. As shown in FIG. 19, for example, the redistribution layer 160 is referred as a front-side redistribution layer of the semiconductor die 130. In some embodiments, as shown in FIG. 19, the semiconductor die 130 is directly located between the redistribution layer 160 and the connecting film DA, and the through vias 120, the surface mount devie 140a, and the insulating encapsulation 150' are directly located between the redistribution layer 160 and the redistribution layer 116. As shown in FIG. 19, in certain embodiments, the semiconductor die 130 is mechanically connected to the redistribution layer 160 by direct contact, and the surface mount device 140a is mechanically connected to the redistribution layer 116 by the solder balls SB1 and the UBM patterns 118.

Figure 20:
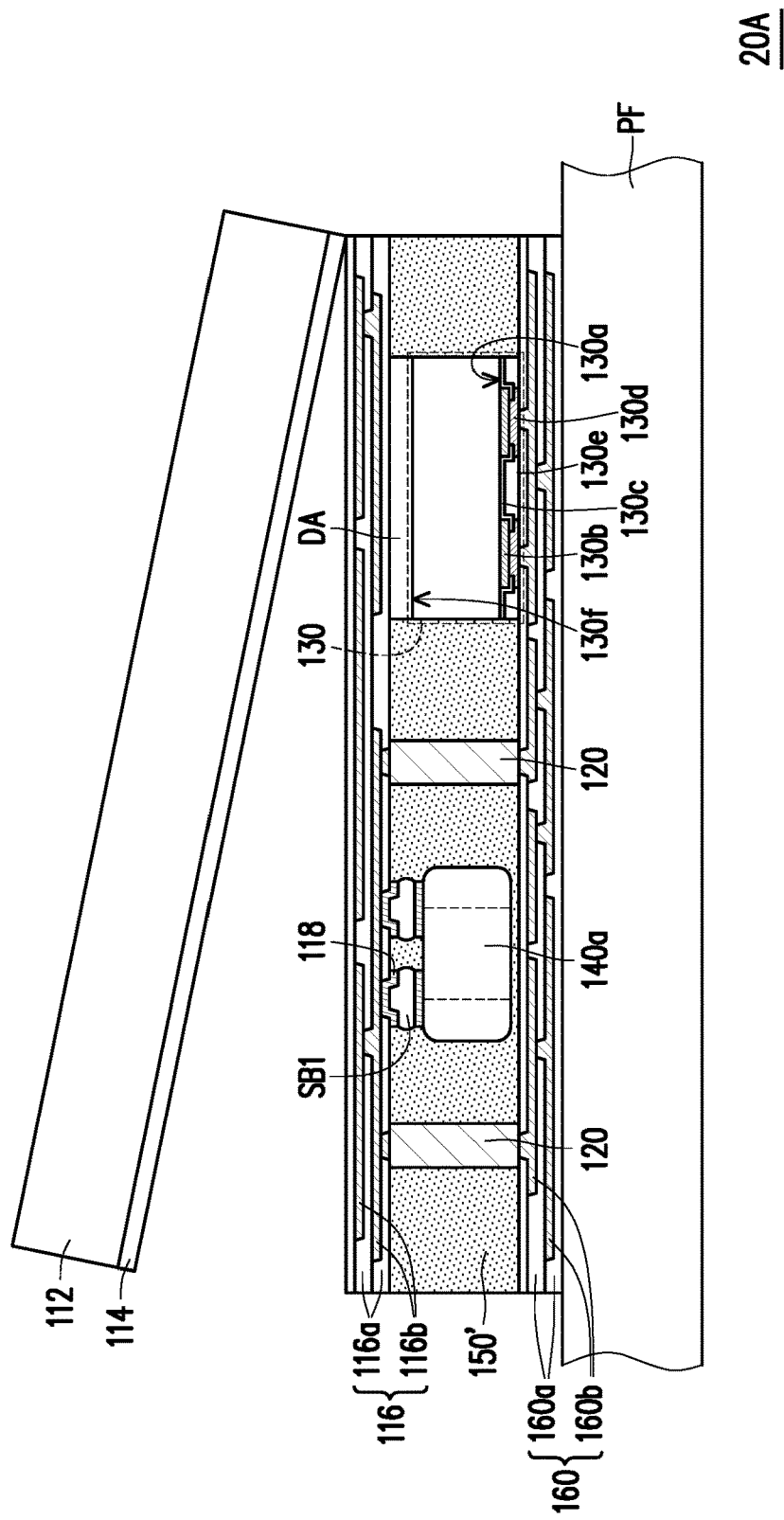

Referring to FIG. 20, in some embodiments, the whole package structure 20A along with the carrier 112 is flipped (turned upside down), and the redistribution layer 160 is placed on a polymer film PF. In certain embodiments, as shown in FIG. 20, the carrier 112 is debonded from the redistribution layer 116. In some embodiments, the redistribution layer 116 is easily separated from the carrier 112 due to the debond layer 114, and the lowest layer of the polymer dielectric layers 116a of the redistribution layer 116 is exposed. In some embodiments, the carrier 112 is detached from the redistribution layer 160 through a debonding process, and the carrier 112 and the debond layer 114 are removed. In one embodiment, the debonding process is a laser debonding process.

Figure 21:
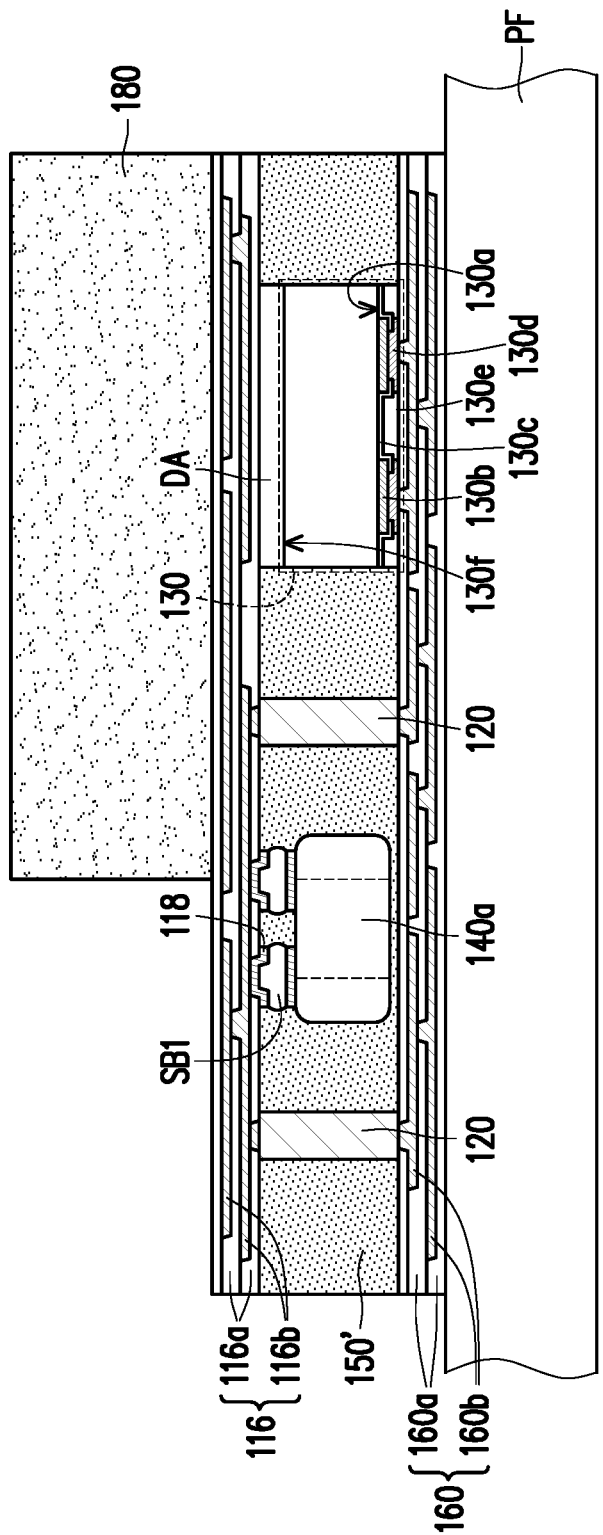

Referring to FIG. 21, in some embodiments, an encapsulant 180 is formed on the redistribution layer 116. In some embodiments, the redistribution layer 116 is located between the encapsulant 180 and the insulating encapsulation 150'.

Figure 22:
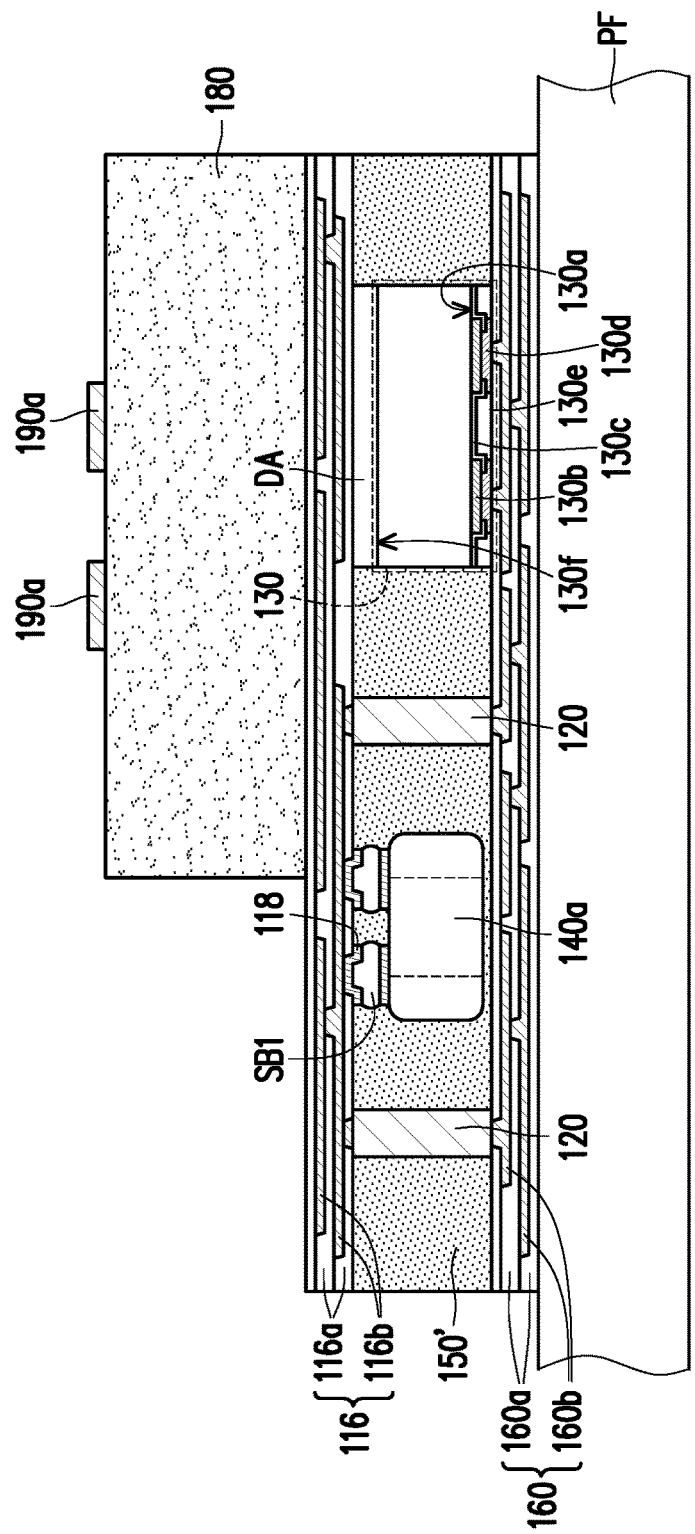

Referring to FIG. 22, in some embodiments, antenna elements 190a are formed on formed on the encapsulant 180. The encapsulant 180 is located between the antenna elements 190a and the redistribution layer 116. As shown in FIG. 22, the antenna elements 190a are formed on a surface of the encapsulant 180 facing away from the redistribution layer 116. In some embodiments, the antenna elements 190a are electrically coupled with the redistribution layer 116a which serves a feed-line for the antenna elements 190a, and a portion of the redistribution layer 116 overlapped with the antenna elements 190a serves as a ground plate for the antenna elements 190a. In some embodiment, the redistribution layer 116 is referred as a ground plate and/or a feed line.

Figure 23:
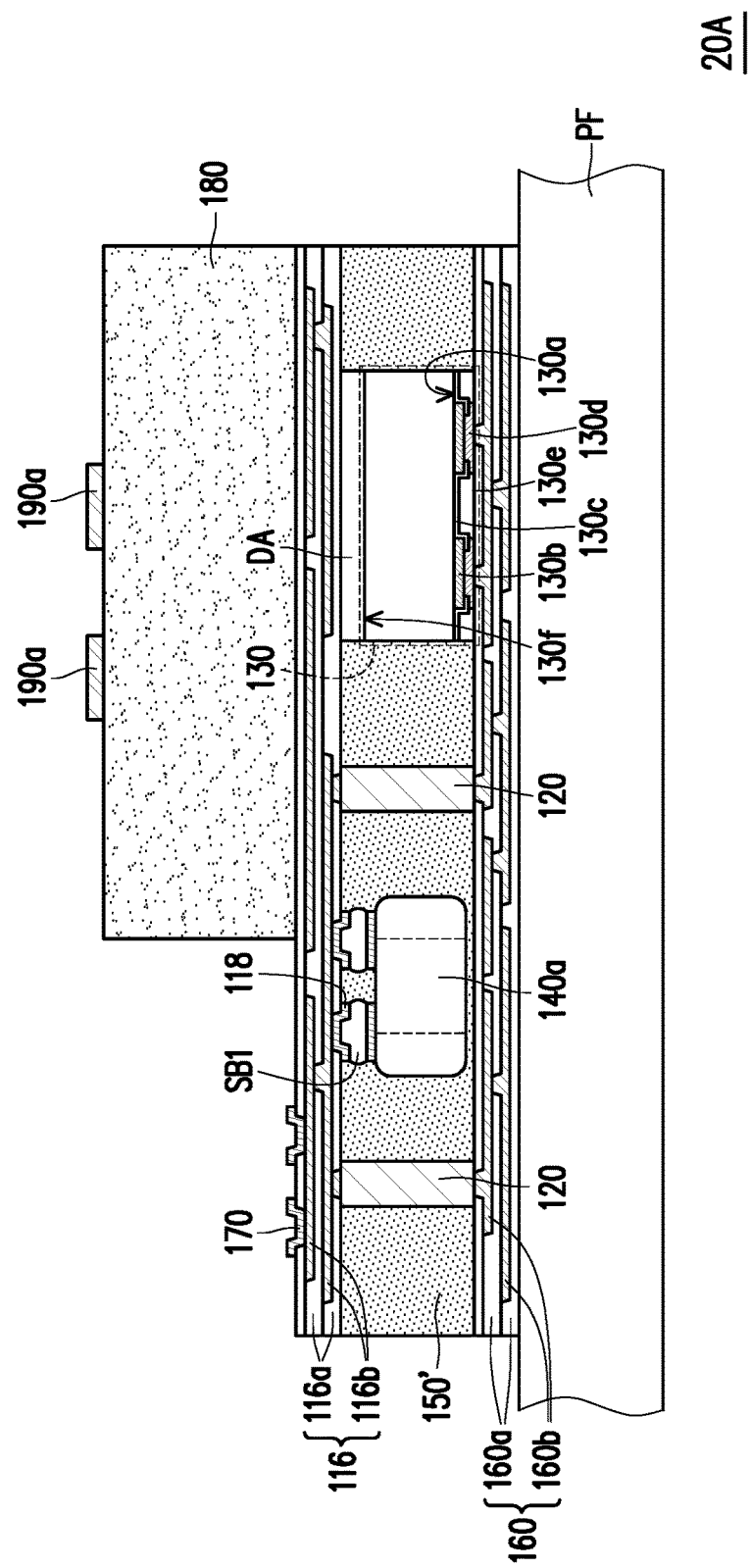

Referring to FIG. 23, in some embodiments, a plurality of UBM patterns 170 are formed on the redistribution structure 116. In certain embodiments, the UBM patterns 170 are formed on an exposed surface of the lowest layer (as depicted in FIG. 19) of the metallization layers 116b of the redistribution structure 116 for electrically connecting with conductive elements (e.g. a connecting module or the like) and/or semiconductor elements (e.g., passive components or active components).

Figure 24:
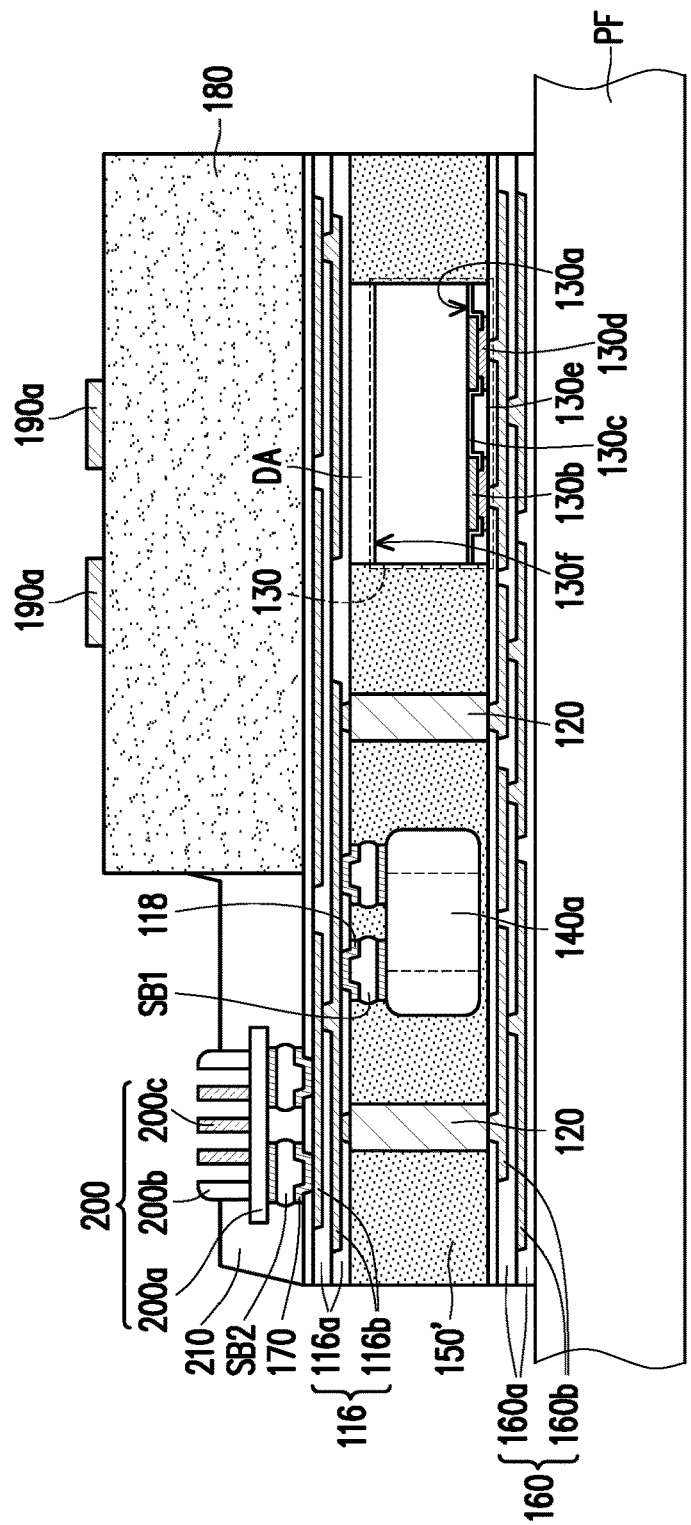

Referring to FIG. 24, in some embodiments, at least one connecting module 200 are mounted onto the UBM patterns 170 by solder balls SB2, and are electrically connected to the redistribution layer 116 through the UBM patterns 170 and the solder balls SB2. As shown in FIG. 24, the connecting module 200 is electrically connect to the through vias 120 through the solder balls SB2, the UBM patterns 170 and the redistribution layer 116, is electrically connected to the semiconductor die 130 through the solder balls SB2, the UBM patterns 170, and the redistribution layer 116, the through vias 120 and the redistribution layer 160, and is electrically connected to the surface mount device 140a through the solder balls SB2, the UBM patterns 170, the redistribution layer 116, the UBM pattern 118 and the solder balls SB1.

In some embodiments, the connecting module 200 includes a circuit board 200a, a frame structure 200b, and a plurality of pins 200c, where the frame structure 200b and the pins 200c are located on the circuit board 200a, and the pins 200c are surrounded by the frame structure 200b. It is noted that the certain details or descriptions of the connecting module 200 are described in FIG. 10, and thus will not be repeated herein, for simplicity. Due to the connecting module 200, the package structure 20A is capable of being electrically connected to additional external electronic device(s) while maintaining an impact volume and a small form factor.

Continued on FIG. 24, in some embodiments, after the connecting module 200 is mounted on the redistribution layer 116, a protection layer 210 is formed on the redistribution layer 116, where the connecting module 200 is accessibly exposed by the protection layer 210. In some embodiments, the protection layer 210 covers the redistribution layer 116 exposed by the solder balls SB2, the UBM patterns 170, the encapsulant 180, and the connecting module 200, where the protection layer 210 at least covers sidewalls of the connecting module 200. Due to the protection layer 210, the connecting module 200 is more stably fixed on the redistribution layer 116, and the adhesion degree of the connecting module 200 to the redistribution layer 116 is further enhanced. As shown in FIG. 24, the redistribution layer 116 is located between the protection layer 210 and the insulation encapsulation 150', between the protection layer 210 and the semiconductor die 130, between the protection layer 210 and the surface mount device 140a, and between the protection layer 210 and the through vias 120.

Figure 25:
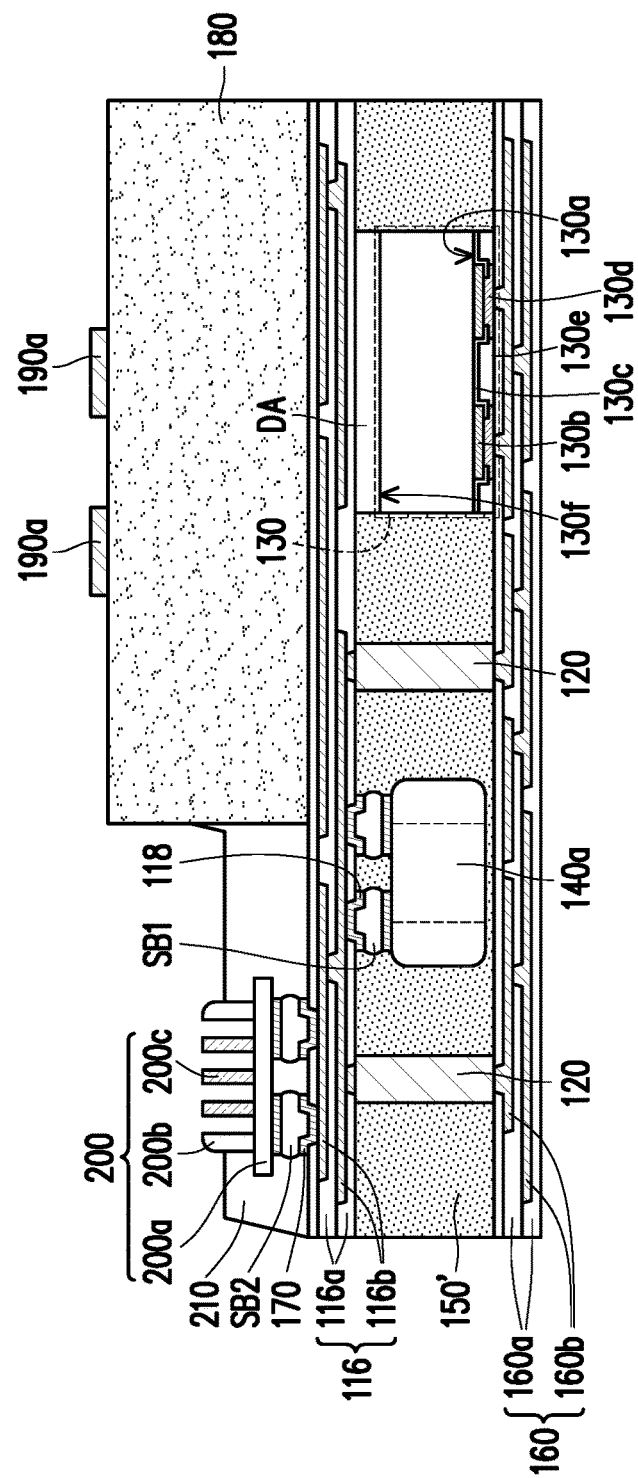

Referring to FIG. 25, in some embodiments, the polymer film PF is removed from the redistribution layer 160 to form the package structure 20A. Up to here, the manufacture of the package structures 20A is completed. In certain embodiments, the whole package structure 20A along with the polymer film PF is first flipped (turned upside down), and then the redistribution layer 160 is released from the polymer film PF by removing the polymer film PF.

In some embodiments, a holding device (not shown) is adopted to secure the package structures 20A by holding the antenna elements 190a before releasing the redistribution layer 160 (e.g. removing the polymer film PF). It is noted that the certain details or descriptions of the holding device are described in FIG. 11, and thus will not be repeated herein, for simplicity. In such embodiments, after the polymer film PF is removed, the antenna elements 190a are then released from the holding device to form the package structure 20A. In certain embodiments, prior to releasing the antenna elements 190a from the holding device, a dicing process is performed to cut the wafer having a plurality of the package structures 20A into individual and separated package structures 20A.

Figure 26:
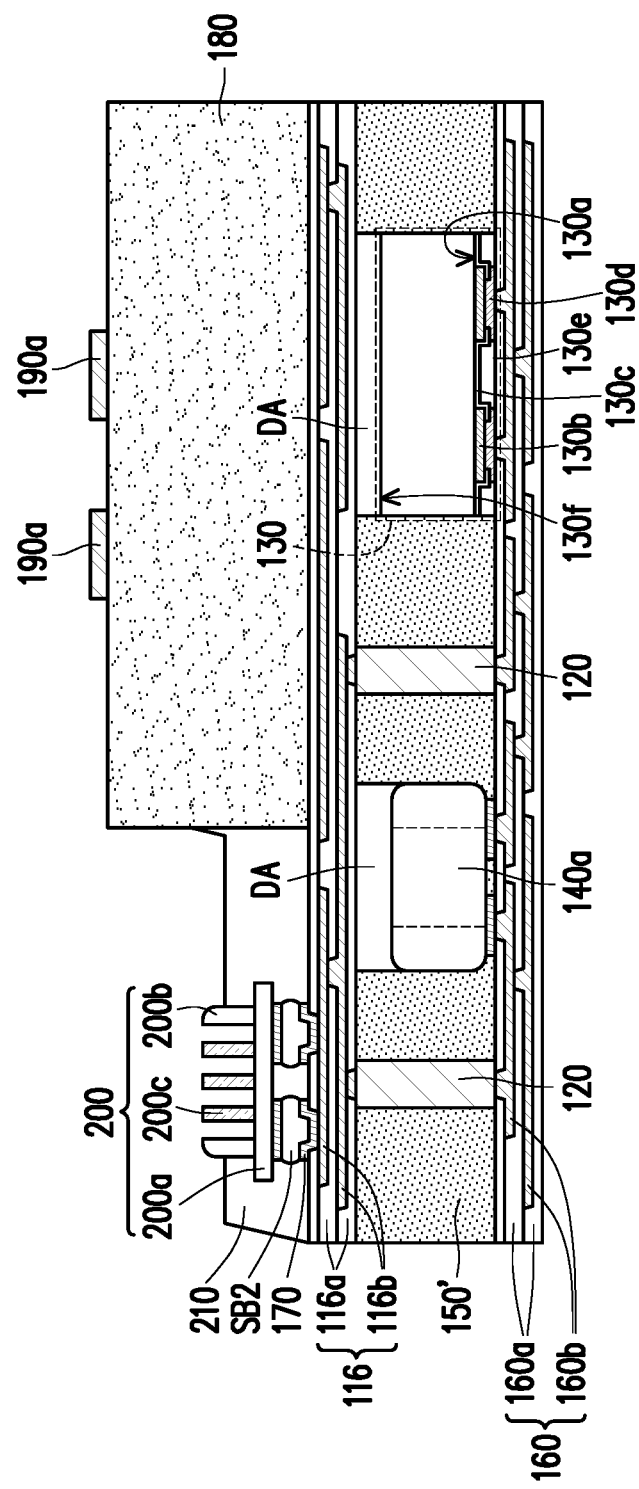
FIG. 26 is a schematic cross sectional view of a package structure according to some exemplary embodiments of the present disclosure.

FIG. 26 is a schematic cross sectional view of a package structure according to some exemplary embodiments of the present disclosure. Referring to FIG. 25 and FIG. 26 together, the package structure 20A depicted in FIG. 25 and the package structure 20B depicted in FIG. 26 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 25 and FIG. 26 together, the difference is that, for the package structure 20B depicted in FIG. 26, the semiconductor die 130 is mechanically connected to the redistribution layer 160 by directly contact while the surface mount device 140a is mechanically connected to the redistribution layer 160 by directly contact. In other words, the package structure 20B, for example, exclude the solder balls SB1 and the UBM patterns 118. As shown in FIG. 26, in certain embodiments, the semiconductor die 130 is electrically connected to the through vias 120 and the surface mount device 140a through the redistribution layer 160, and is electrically connected to the connecting module 200 through the redistribution layer 160, the through vias 120, the redistribution layer 116, the UBM patterns 170 and the solder balls SB2. In certain embodiments, the surface mount device 140a is electrically connected to the connecting module 200 through the redistribution layer 160, the through vias 120, the redistribution layer 116, the UBM patterns 170 and the solder balls SB2.

Figure 27:
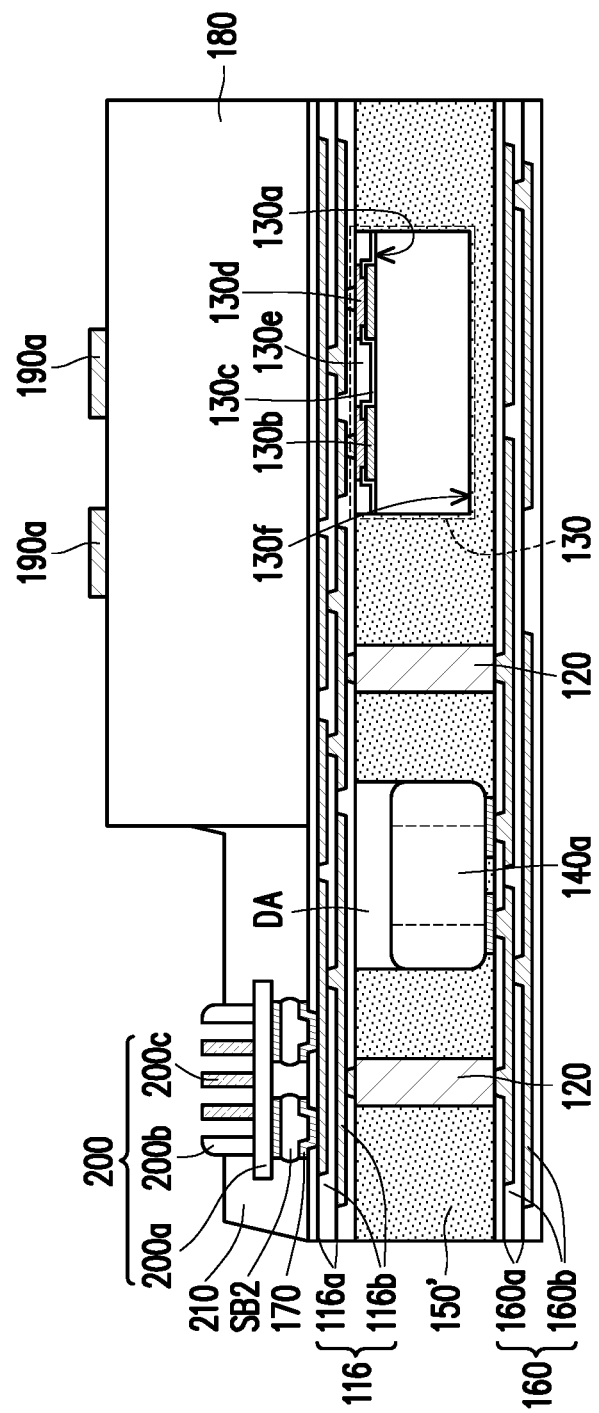
FIG. 27 is a schematic cross sectional view of a package structure according to some exemplary embodiments of the present disclosure.

FIG. 27 is a schematic cross sectional view of a package structure according to some exemplary embodiments of the present disclosure. Referring to FIG. 25 and FIG. 27 together, the package structure 20A depicted in FIG. 25 and the package structure 20C depicted in FIG. 27 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 25 and FIG. 27 together, the difference is that, for the package structure 20C depicted in FIG. 27, the semiconductor die 130 is mechanically connected to the redistribution layer 116 by directly contact while the surface mount device 140a is mechanically connected to the redistribution layer 160 by directly contact. In other words, the package structure 20C, for example, exclude the solder balls SB1 and the UBM patterns 118. As shown in FIG. 27, in certain embodiments, the semiconductor die 130 is electrically connected to the through vias 120 through the redistribution layer 116, is electrically connected to the surface mount device 140a through the redistribution layer 116, the through vias 120 and the redistribution layer 160, and is electrically connected to the connecting module 200 through the redistribution layer 116, the UBM patterns 170 and the solder balls SB2. In certain embodiments, the surface mount device 140a is electrically connected to the connecting module 200 through the redistribution layer 160, the through vias 120, the redistribution layer 116, the UBM patterns 170 and the solder balls SB2.

Figure 28:
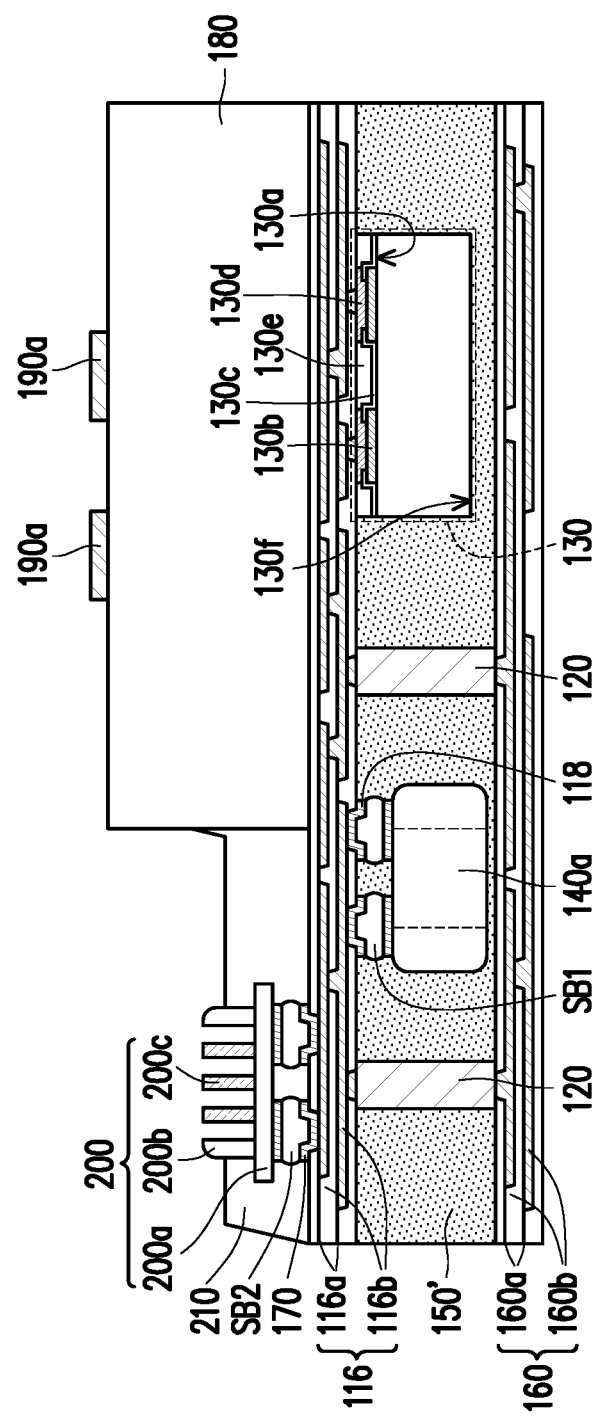
FIG. 28 is a schematic cross sectional view of a package structure according to some exemplary embodiments of the present disclosure.

FIG. 28 is a schematic cross sectional view of a package structure according to some exemplary embodiments of the present disclosure. Referring to FIG. 25 and FIG. 28 together, the package structure 20A depicted in FIG. 25 and the package structure 20D depicted in FIG. 28 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 25 and FIG. 28 together, the difference is that, for the package structure 20D depicted in FIG. 28, the semiconductor die 130 is mechanically connected to the redistribution layer 116 by directly contact while the surface mount device 140a is mechanically connected to the redistribution layer 160 by the solder balls SB1 and the UBM patterns 118. As shown in FIG. 28, in certain embodiments, the semiconductor die 130 is electrically connected to the through vias 120 through the redistribution layer 116, is electrically connected to the surface mount device 140a through the redistribution layer 116, the UBM patterns 118 and the solder balls SB1, and is electrically connected to the connecting module 200 through the redistribution layer 116, the UBM patterns 170 and the solder balls SB2 or through the redistribution layer 116, the through vias 120, the redistribution layer 160, the UBM patterns 170 and the solder balls SB2. In certain embodiments, the surface mount device 140a is electrically connected to the connecting module 200 through the solder balls SB1, the UBM patterns 118, the redistribution layer 116, the UBM patterns 170 and the solder balls SB2.

FIG. 29 to FIG. 38 are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein. In FIG. 29 to FIG. 38, one semiconductor die is shown to represent plural semiconductor dies of the wafer, and a package structure 30A is shown to represent a package structure obtained following the manufacturing method, for example. In other embodiments, two chips or semiconductor dies are shown to represent plural chips or semiconductor dies of the wafer, and one or more package structures are shown to represent plural (semiconductor) package structures obtained following the (semiconductor) manufacturing method, the disclosure is not limited thereto. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure.

Figure 29:
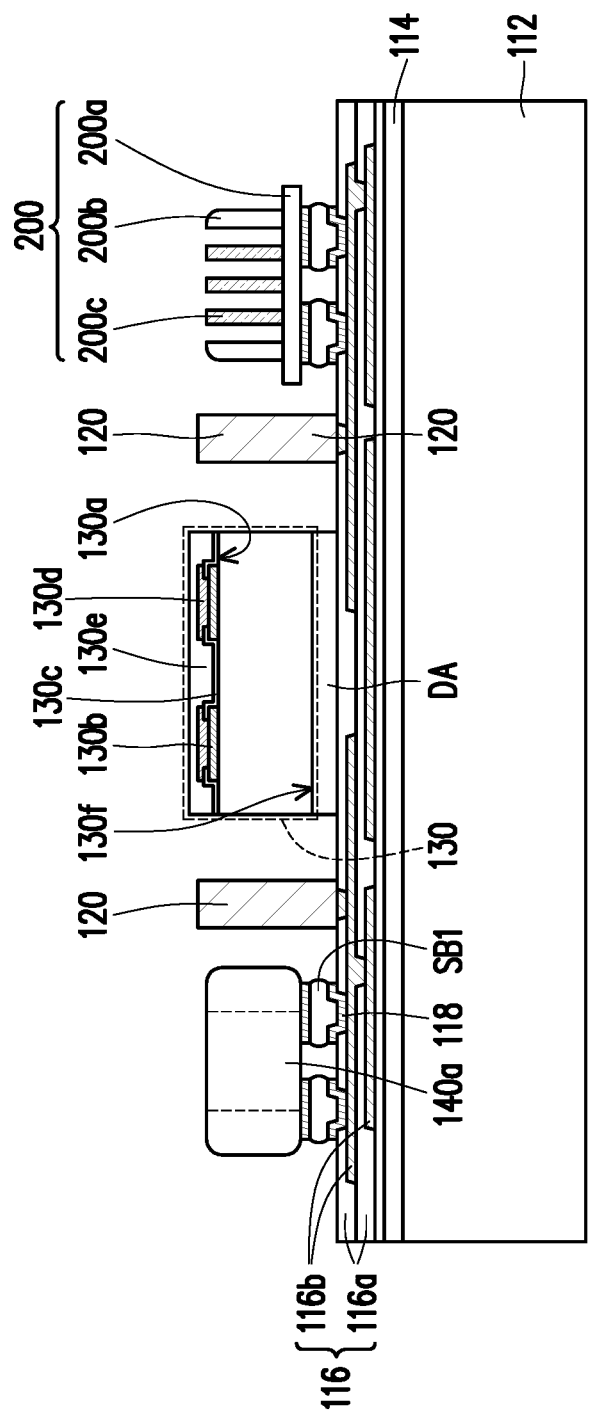
FIG. 29 to FIG. 38 are schematic cross sectional views of various stages in a manufacturing method of a package structure according to some exemplary embodiments of the present disclosure.

Referring to FIG. 29, in some embodiments, a carrier 112 is provided. In some embodiments, as shown in FIG. 29, the carrier 112 is provided with a debond layer 114 formed thereon. In one embodiment, the material of the debond layer 114 may be any material suitable for debonding the carrier 112 from the above layers or any wafer(s) disposed thereon. As shown in FIG. 29, in some embodiments, a redistribution layer 116 is formed on the debond layer 114, where the debond layer 114 is located between the carrier 12 and the redistribution layer 116.

In some embodiments, through vias 120 and UBM patterns 118 are formed on the redistribution layer 116. In one embodiment, the through vias 120 are formed prior to the formation of the UBM patterns 118. In an alternative embodiment, the UBM patterns 118 are formed prior to the formation of the through vias 120. In some embodiments, the redistribution layer 116 is mechanically connected to the through vias 120 and the UBM patterns 118 by direct contact. As shown in FIG. 29, in some embodiments, the redistribution layer 116 is electrically connected to the through vias 120.

In some embodiments, at least one semiconductor die 130 with a connecting film DA disposed thereon, at least one surface mount device 140a, and at least one connecting module 200 are provided. As shown in FIG. 29, the semiconductor die 130 is disposed on the redistribution layer 116 and over the carrier 112 through the connecting film DA. In some embodiments, the connecting film DA is located between the semiconductor die 130 and the redistribution layer 116, and the connecting film DA is physically contacts a backside surface 130f of the semiconductor die 130 and the redistribution layer 116. In some embodiments, due to the connecting film DA provided between the semiconductor die 130 and the redistribution layer 116, the semiconductor die 130 and the redistribution layer 116 are stably adhered to each other. In some embodiments, the redistribution layer 116 is referred as a back-side redistribution layer of the semiconductor die 130. As shown in FIG. 29, for example, the through vias 120 are located aside of a location of the semiconductor die 130. In some embodiments, the surface mount device 140a and the connecting module 200 are mounted onto and electrically connected to the redistribution layer 116 by solder balls SB1 and the UBM patterns 118. As shown in FIG. 29, the surface mount device 140a and the connecting module 200 are located aside of the locations of the semiconductor die 130 and the through vias 120, where the through vias 120, the semiconductor die 130, the surface mount device 140a, and the connecting module 200 are located at the same side of the redistribution layer 116. Due to such configuration, the package structure 30A is capable of being electrically connected to additional external electronic device(s) while maintaining an impact volume and a small form factor.

In some embodiments, the connecting module 200 includes a circuit board 200a, a frame structure 200b, and a plurality of pins 200c, where the frame structure 200b and the pins 200c are located on the circuit board 200a, and the pins 200c are surrounded by the frame structure 200b. It is noted that the certain details or descriptions of the connecting module 200 are described in FIG. 10, and thus will not be repeated herein, for simplicity.

Figure 30:
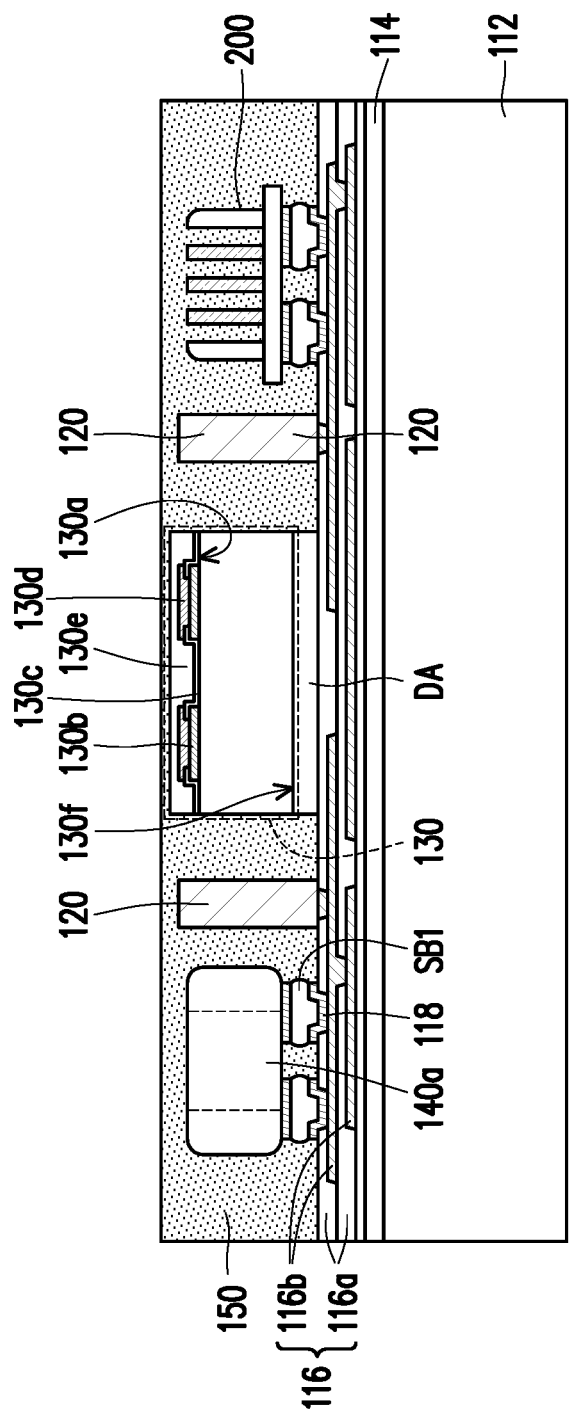

Referring to FIG. 30, in some embodiments, the through vias 120, the semiconductor die 130, the surface mount device 140a, and the connecting module 200 are encapsulated in an insulating encapsulation 150. In some embodiments, the insulating encapsulation 150 is formed on the redistribution layer 116 and over the carrier 112. As shown in FIG. 30, the insulating encapsulation 150 at least fills up the gaps between the through vias 120, and between the through vias 120, the solder balls SB1, the semiconductor die 130, the connecting film DA, the surface mount device 140a, and the connecting module 200. In certain embodiments, as shown in FIG. 30, the through vias 120, the semiconductor die 130, the surface mount device 140a, and the connecting module 200 are not accessibly revealed by the insulating encapsulation 150.

Figure 31:
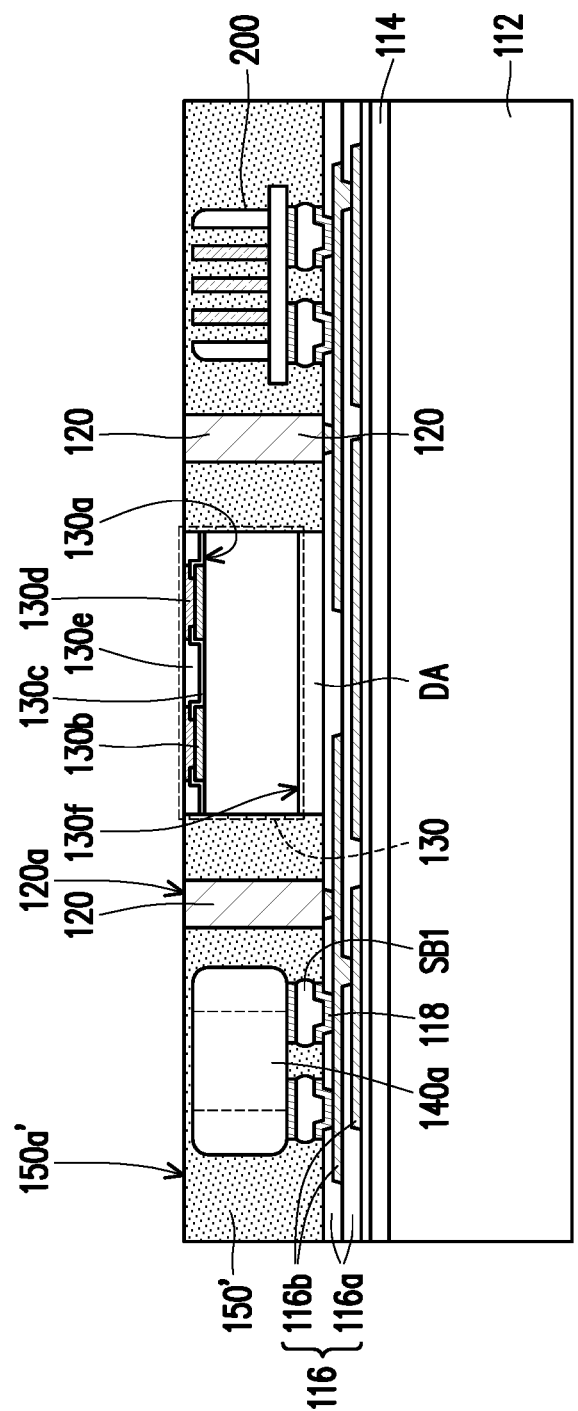

Referring to FIG. 31, in some embodiments, the insulating encapsulation 150 is planarized to form an insulating encapsulation 150' exposing the through vias 120 and the semiconductor die 130. In certain embodiments, as shown in FIG. 31, after the planarization, top surfaces 120a of the through vias 120 and top surfaces of the conductive pillars 130d and the protection layer 130e of the semiconductor die 130 are exposed by a top surface 150a' of the insulating encapsulation 150'. That is, for example, the top surfaces of the conductive pillars 130d and the protection layer 130e of the semiconductor die 130 and the top surfaces 120a of the through vias 120 become substantially leveled with the top surface 150a' of the insulating encapsulation 150'. In other words, the top surfaces of the conductive pillars 130d and the protection layer 130e of the semiconductor die 130, the top surfaces 120a of the through vias 120, and the top surface 150a' of the insulating encapsulation 150' are substantially coplanar to each other.

In some embodiments, after the planarizing step, a cleaning step may be optionally performed to clean and remove the residue generated from the planarizing step. However, the disclosure is not limited thereto, and the planarizing step may be performed through any other suitable method. In some embodiments, during planarizing the insulating encapsulation 150, the conductive pillars 130d and the protection layer 130e of the semiconductor die 130 and the through vias 120 may also be planarized.

Figure 32:
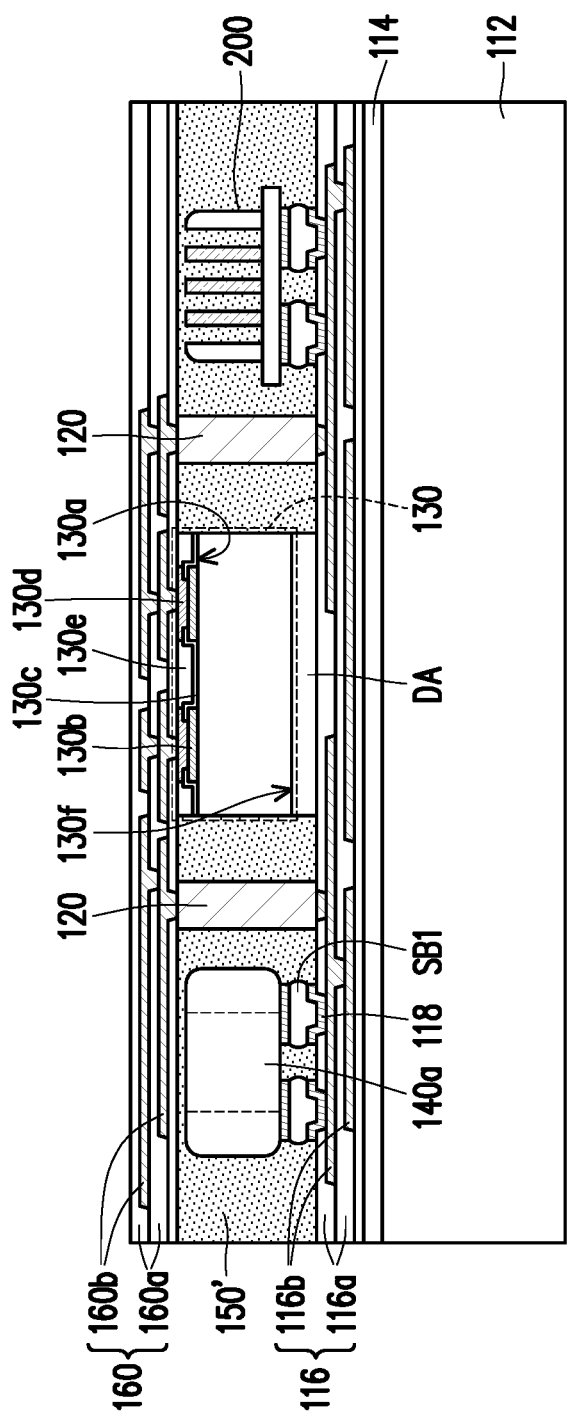

Referring to FIG. 32, in some embodiments, a redistribution layer 160 is formed on the through vias 120, the semiconductor die 130, the surface mount device 140, the insulating encapsulation 150', and the connecting module 200. As shown in FIG. 32, the redistribution layer 160 is formed on the top surfaces 120a of the through vias 120, the top surfaces of the conductive pillars 130d and the protection layer 130e of the semiconductor die 130, and the top surface 150a' of the insulating encapsulation 150'. In some embodiments, the redistribution layer 160 is electrically connected to the through vias 120, is electrically connected to the semiconductor die 130 through the conductive pillars 130d, and is electrically connected to the surface mount device 140a and the connecting module 200 through the through vias 120, the redistribution layer 116, the UBM patterns 118, and the solder balls SB1. In some embodiments, through the redistribution layer 160, the semiconductor die 130 is electrically connected to the through vias 120. In some embodiments, through the redistribution layer 160, the through vias 120, the redistribution layer 116, the UBM patterns 118, and the solder balls SB1, the semiconductor die 130 is electrically connected to the surface mount device 140a and the connecting module 200. As shown in FIG. 32, for example, the redistribution layer 160 is referred as a front-side redistribution layer of the semiconductor die 130. In some embodiments, as shown in FIG. 32, the semiconductor die 130 is directly located between the redistribution layer 160 and the connecting film DA, and the through vias 120, the surface mount devie 140a, the connecting module 200, and the insulating encapsulation 150' are directly located between the redistribution layer 160 and the redistribution layer 116. As shown in FIG. 32, in certain embodiments, the semiconductor die 130 is mechanically connected to the redistribution layer 160 by direct contact, and the surface mount device 140a and the connecting module 200 each are mechanically connected to the redistribution layer 116 by the solder balls SB1 and the UBM patterns 118.

Figure 33:
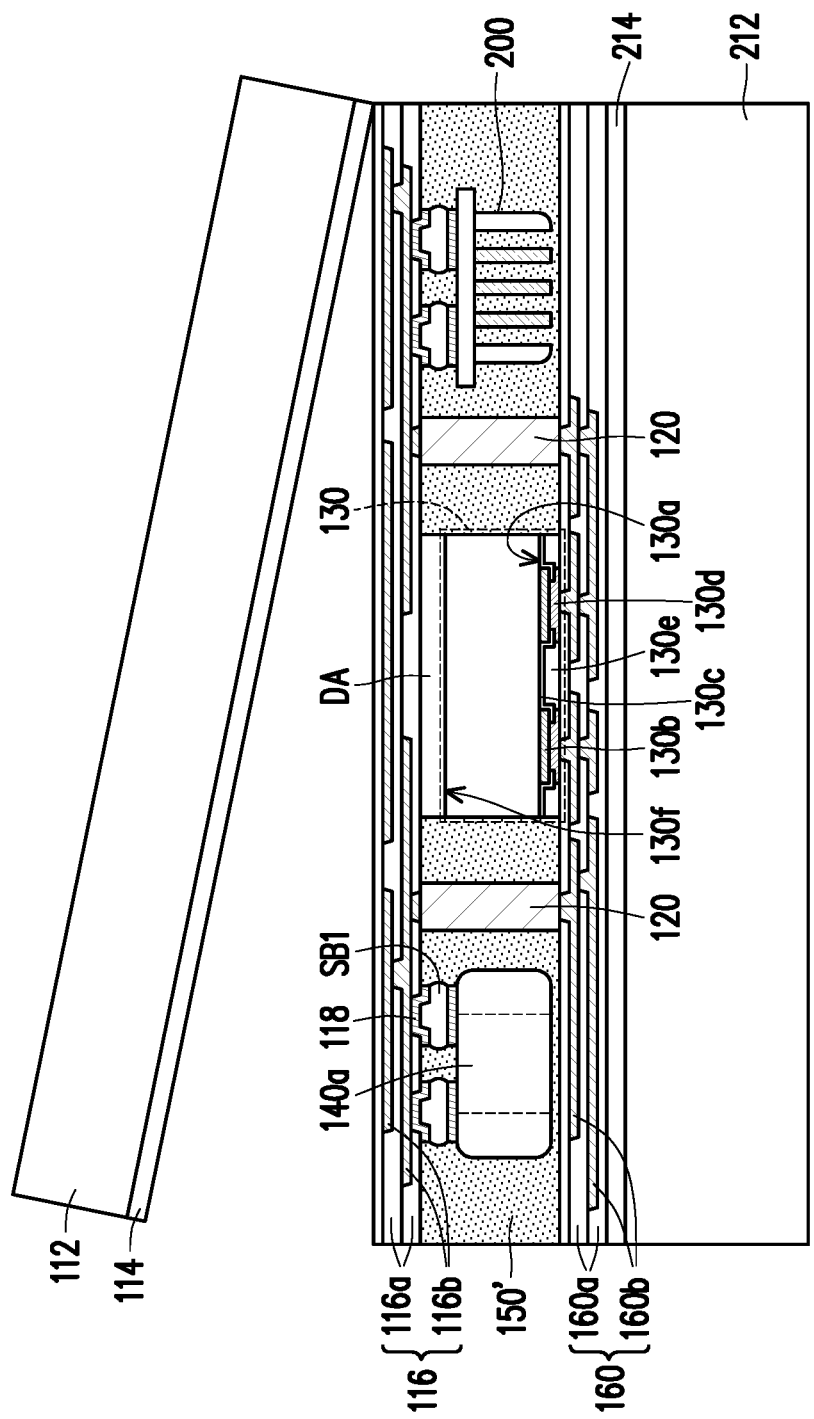

Referring to FIG. 33, in some embodiments, the whole package structure 30A along with the carrier 112 is flipped (turned upside down) and the redistribution layer 160 is placed on a carrier 212 provided with a debond layer 214. In certain embodiments, as shown in FIG. 33, the carrier 112 is debonded from the redistribution layer 116. In some embodiments, the redistribution layer 116 is easily separated from the carrier 112 due to the debond layer 114, and the lowest layer of the polymer dielectric layers 116a of the redistribution layer 116 is exposed. In some embodiments, the carrier 112 is detached from the redistribution layer 116 through a debonding process, and the carrier 112 and the debond layer 114 are removed. In one embodiment, the debonding process is a laser debonding process.

Figure 34:
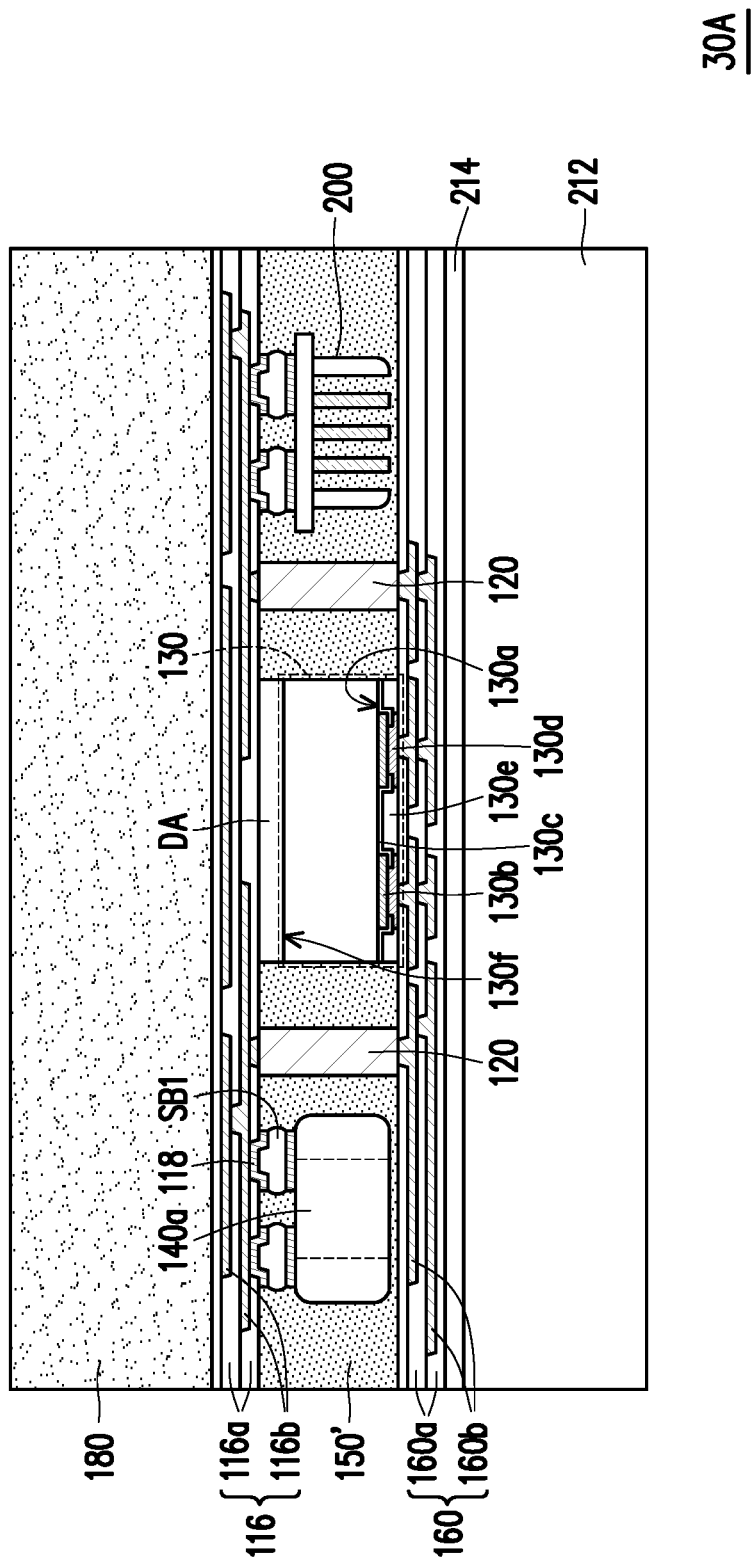

Referring to FIG. 34, in some embodiments, an encapsulant 180 is formed on the redistribution layer 116. In some embodiments, the redistribution layer 116 is located between the encapsulant 180 and the insulating encapsulation 150'.

Figure 35:
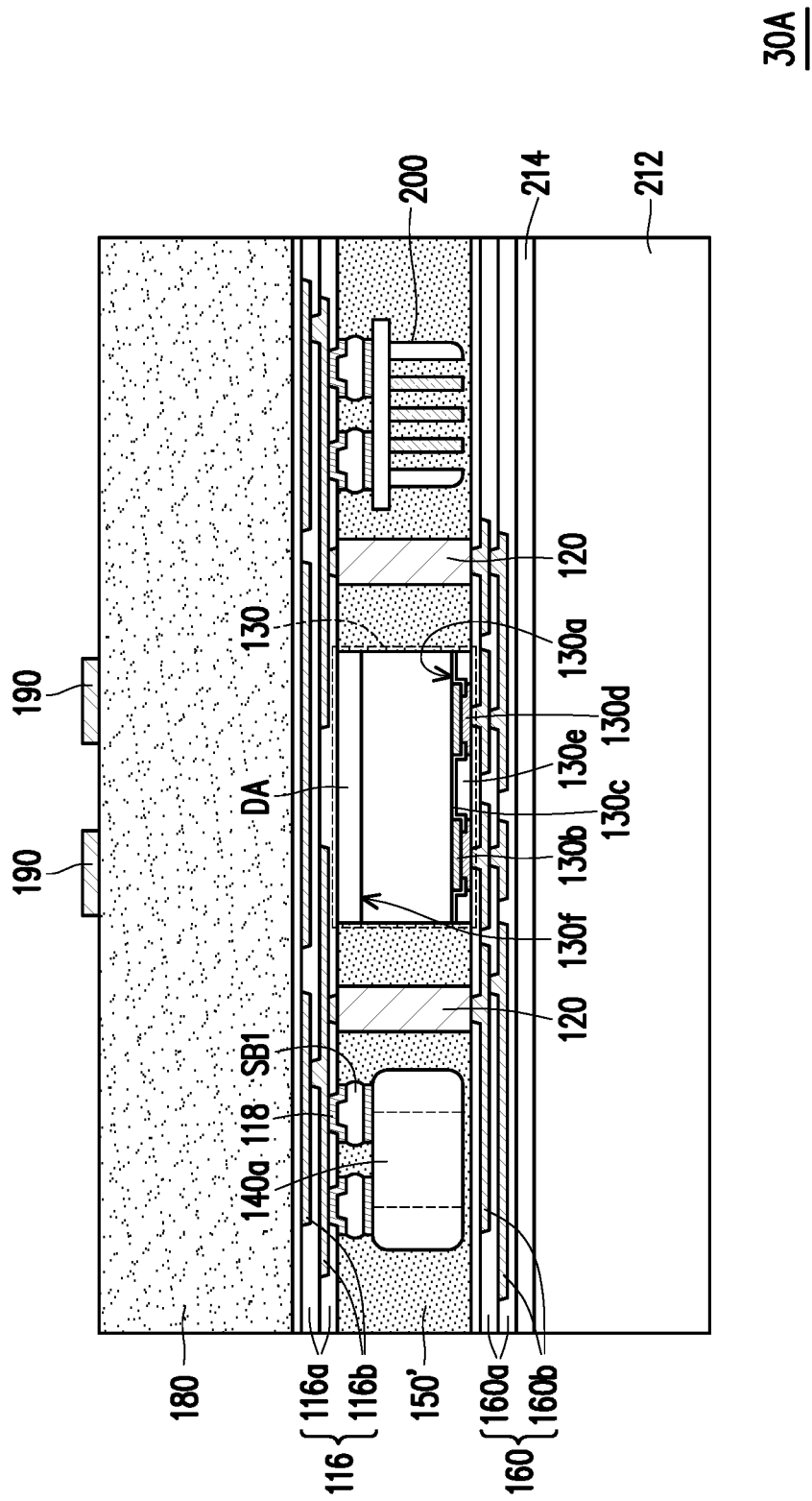

Referring to FIG. 35, in some embodiments, antenna elements 190a are formed on formed on the encapsulant 180. The encapsulant 180 is located between the antenna elements 190a and the redistribution layer 116. As shown in FIG. 35, the antenna elements 190a are formed on a surface of the encapsulant 180 facing away from the redistribution layer 116. In some embodiments, the antenna elements 190a are electrically coupled with the redistribution layer 116a which serves a feed-line for the antenna elements 190a, and a portion of the redistribution layer 116 overlapped with the antenna elements 190a serves as a ground plate for the antenna elements 190a. In some embodiment, the redistribution layer 116 is referred as a ground plate and/or a feed line.

Figure 36:
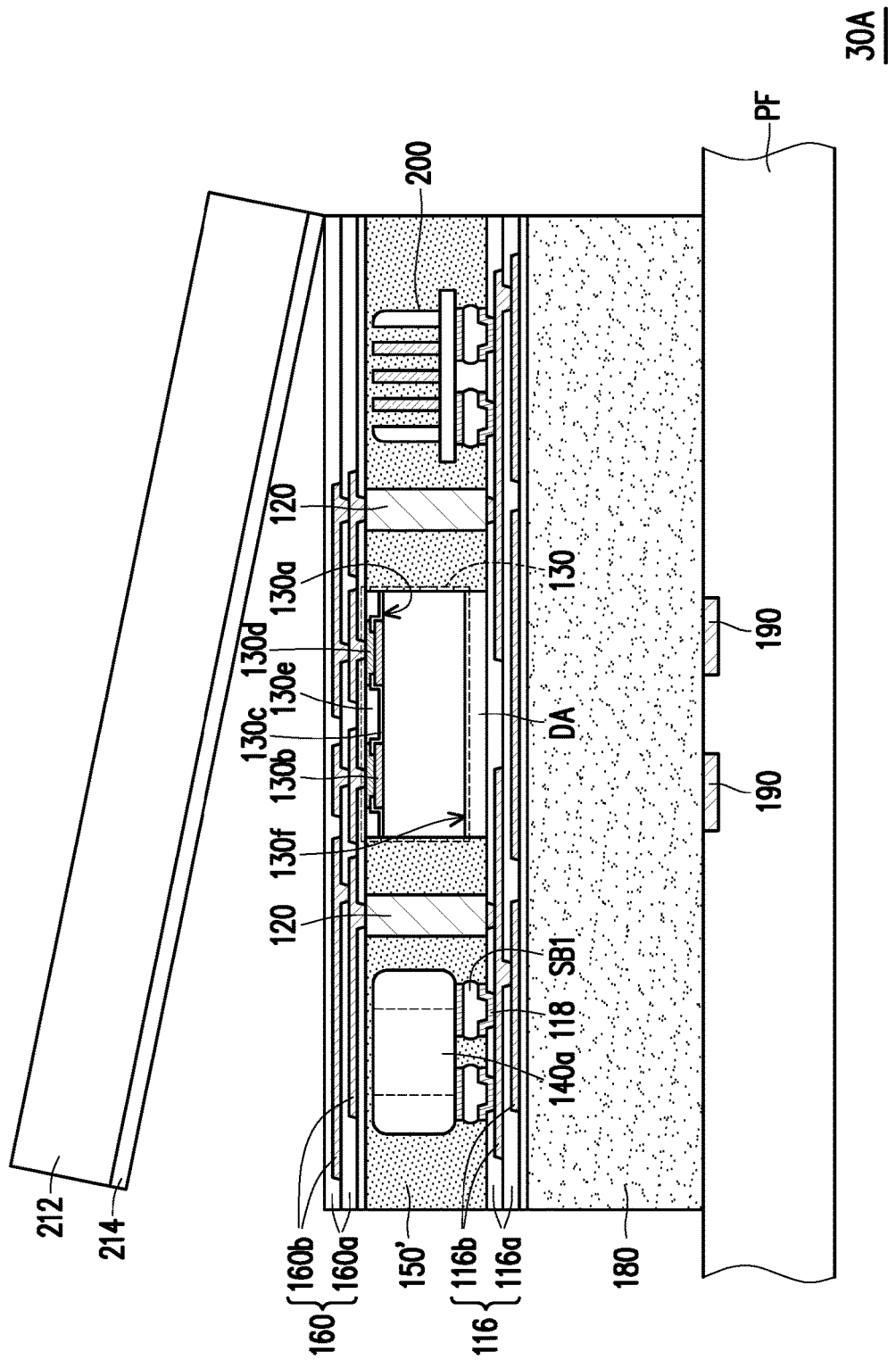

Referring to FIG. 36, in some embodiments, the whole package structure 30A along with the carrier 212 is flipped (turned upside down), and the antenna elements 190a are mounted into a polymer film PF. In certain embodiments, the antenna elements 190a are embedded in the polymer film PF. In some embodiments, after the antenna elements 190a are mounted into the polymer film PF, the carrier 212 is debonded from the redistribution layer 160. In some embodiments, the redistribution layer 160 is easily separated from the carrier 212 due to the debond layer 214, and the lowest layer of the polymer dielectric layers 160a of the redistribution layer 160 are exposed. In some embodiments, the carrier 212 is detached from the redistribution layer 160 through a debonding process, and the carrier 212 and the debond layer 214 are removed. In one embodiment, the debonding process is a laser debonding process.

Figure 37:
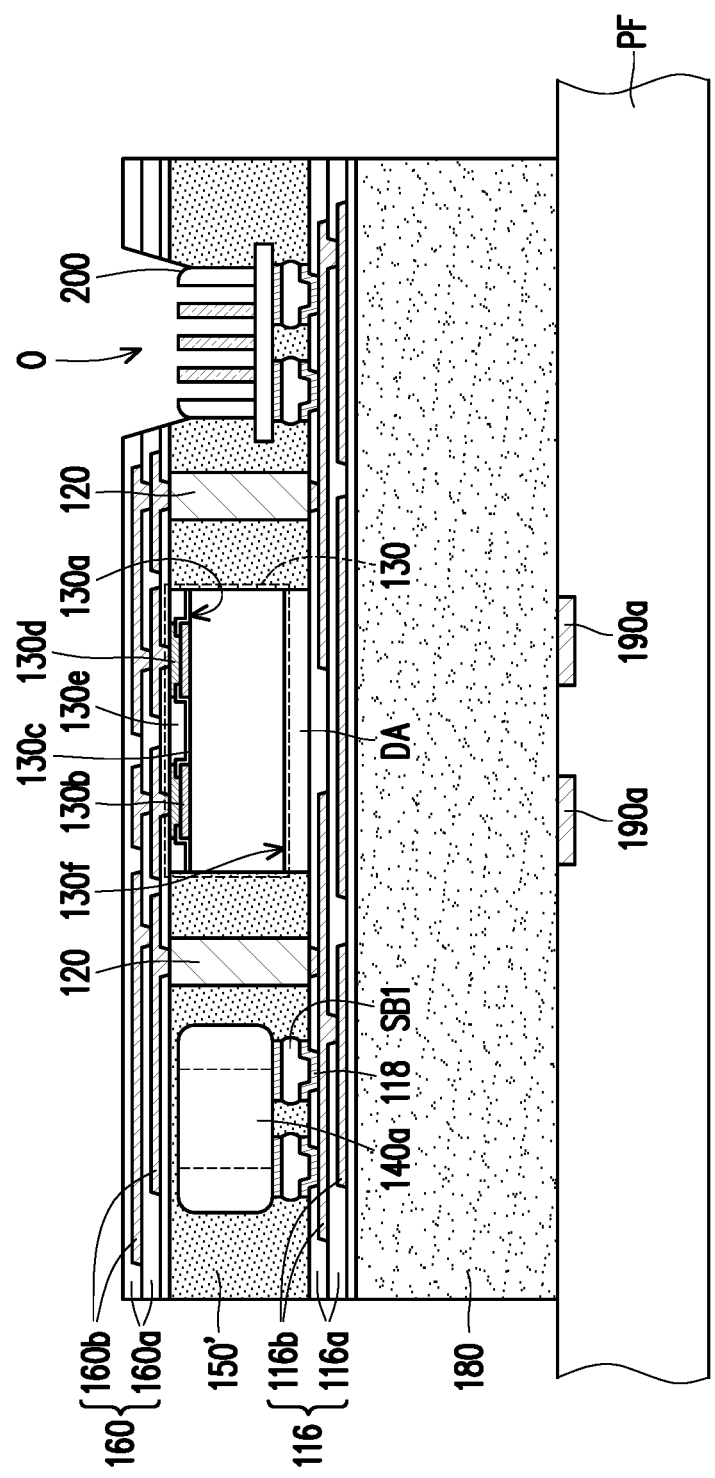

Referring to FIG. 37, in some embodiments, after removing the carrier 212 and the debond layer 214, at least one trench O is formed in the redistribution layer 160 and the insulating encapsulation 150' to accessibly expose the connecting module 200. In some embodiments, the trench O is, for example, formed by a laser drilling process. For example, in FIG. 37, only one trench O is shown, however the disclosure is not limited thereto. The number of the trench O may be one or more than one depending on the demand (e.g. the number of the connecting module 200). In some embodiments, if considering the trench O is a hole with substantially round-shaped from a top view of the package structure 30A, the trench O includes a slant sidewall in the cross-section view depicted in FIG. 37. However, the cross-sectional shape of the trench O is not limited to be round and may be elliptical, oval, tetragonal, octagonal or any suitable polygonal shape. Due to the insulating encapsulation 150', the connecting module 200 is more stably fixed on the redistribution layer 116, and the adhesion degree of the connecting module 200 to the redistribution layer 116 is further enhanced.

Figure 38:
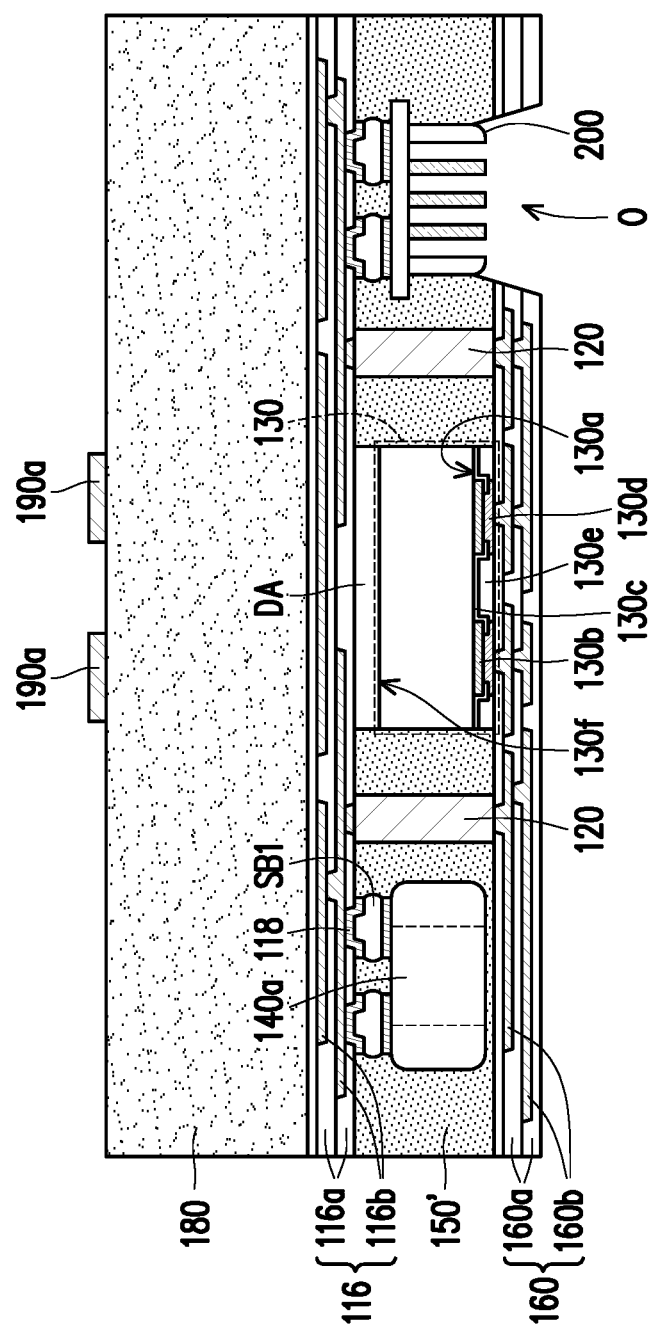

Referring to FIG. 38, in some embodiments, the polymer film PF is removed from the antenna elements 190a to form the package structure 30A. Up to here, the manufacture of the package structures 30A is completed. In certain embodiments, the whole package structure 30A along with the polymer film PF is first flipped (turned upside down), and then the antenna elements 190a are released from the polymer film PF by removing the polymer film PF.

In some embodiments, a holding device (not shown) is adopted to secure the package structures 30A by holding the redistribution layer 160 before releasing the antenna elements 190a (e.g. removing the polymer film PF). It is noted that the certain details or descriptions of the holding device are described in FIG. 11, and thus will not be repeated herein, for simplicity. In such embodiments, after the polymer film PF is removed, the redistribution layer 160 is then released from the holding device to form the package structure 30A. In certain embodiments, prior to releasing the redistribution layer 160 from the holding device, a dicing process is performed to cut the wafer having a plurality of the package structures 30A into individual and separated package structures 30A.

FIG. 39 to FIG. 47 are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein. In FIG. 39 to FIG. 47, one semiconductor die is shown to represent plural semiconductor dies of the wafer, and a package structure 30B is shown to represent a package structure obtained following the manufacturing method, for example. In other embodiments, two chips or semiconductor dies are shown to represent plural chips or semiconductor dies of the wafer, and one or more package structures are shown to represent plural (semiconductor) package structures obtained following the (semiconductor) manufacturing method, the disclosure is not limited thereto. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure.

Figure 39:
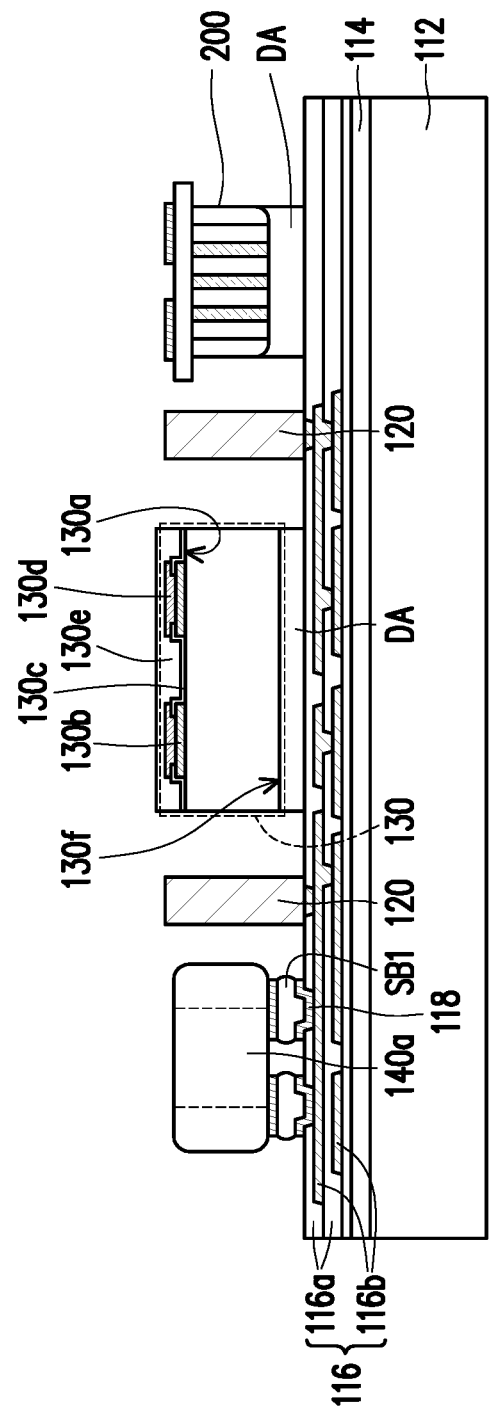
FIG. 39 to FIG. 47 are schematic cross sectional views of various stages in a manufacturing method of a package structure according to some exemplary embodiments of the present disclosure.

Referring to FIG. 39, in some embodiments, a carrier 112 with a debond layer 114 formed thereon is provided. As shown in FIG. 39, in some embodiments, a redistribution layer 116 is formed on the debond layer 114, where the debond layer 114 is located between the carrier 12 and the redistribution layer 116. In some embodiments, through vias 120 and UBM patterns 118 are formed on the redistribution layer 116. In some embodiments, the redistribution layer 116 is mechanically connected to the through vias 120 and the UBM patterns 118 by direct contact. As shown in FIG. 39, in some embodiments, the redistribution layer 116 is electrically connected to the through vias 120.

In some embodiments, at least one semiconductor die 130, at least one surface mount device 140a, and at least one connecting module 200 are provided. As shown in FIG. 39, the semiconductor die 130 and the connecting module 200 are disposed on the redistribution layer 116 and over the carrier 112 through different connecting films DA. In some embodiments, the connecting films DA are respectively located between the semiconductor die 130 and the redistribution layer 116 and between the connecting module 200 and the redistribution layer 116. It is noted that the certain details or descriptions of the connecting module 200 are described in FIG. 10, and thus will not be repeated herein, for simplicity. In some embodiments, due to the connecting films DA, the semiconductor die 130 and the connecting module 200 are stably adhered to the redistribution layer 116. In some embodiments, the redistribution layer 116 is referred as a back-side redistribution layer of the semiconductor die 130. As shown in FIG. 39, for example, the through vias 120 are located aside of the locations of the semiconductor die 130 and the connecting module 200.

In some embodiments, the surface mount device 140a is mounted onto and electrically connected to the redistribution layer 116 by solder balls SB1 and the UBM patterns 118. As shown in FIG. 39, the surface mount device 140a is located aside of the locations of the semiconductor die 130, the connecting module 200, and the through vias 120, where the through vias 120, the semiconductor die 130, the surface mount device 140a, and the connecting module 200 are located at the same side of the redistribution layer 116. Due to such configuration, the package structure 30B is capable of being electrically connected to additional external electronic device(s) while maintaining an impact volume and a small form factor.

Figure 40:
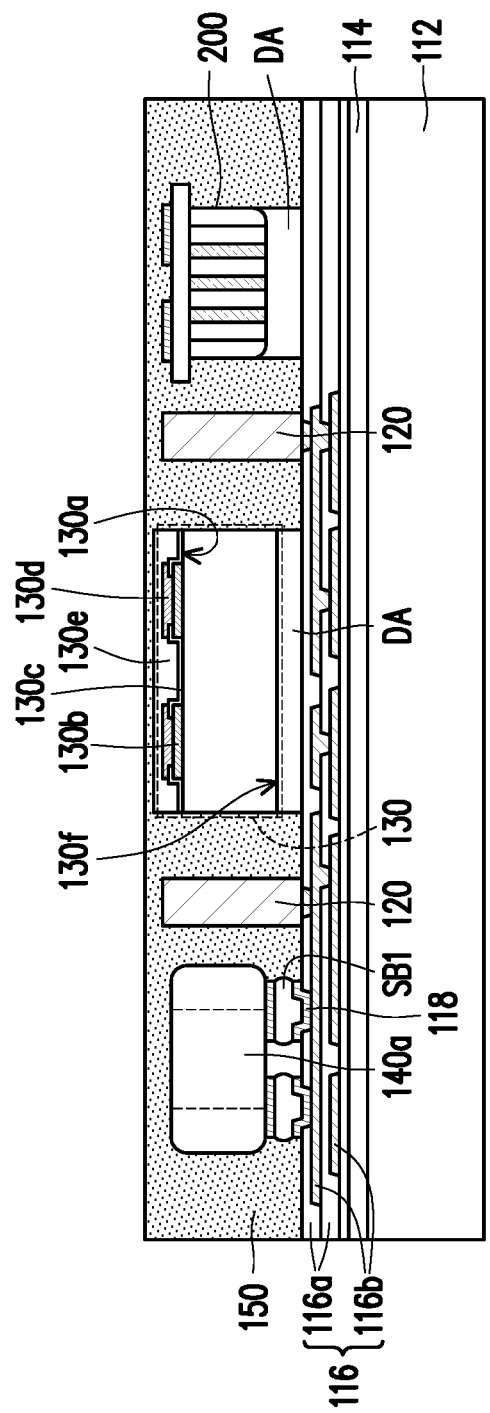

Referring to FIG. 40, in some embodiments, the through vias 120, the semiconductor die 130, the surface mount device 140a, and the connecting module 200 are encapsulated in an insulating encapsulation 150. In some embodiments, the insulating encapsulation 150 is formed on the redistribution layer 116 and over the carrier 112. As shown in FIG. 40, the insulating encapsulation 150 at least fills up the gaps between the through vias 120, and between the through vias 120, the solder balls SB1, the semiconductor die 130, the connecting films DA, the surface mount device 140a, and the connecting module 200. In certain embodiments, as shown in FIG. 40, the through vias 120, the semiconductor die 130, the surface mount device 140a, and the connecting module 200 are not accessibly revealed by the insulating encapsulation 150.

Figure 41:
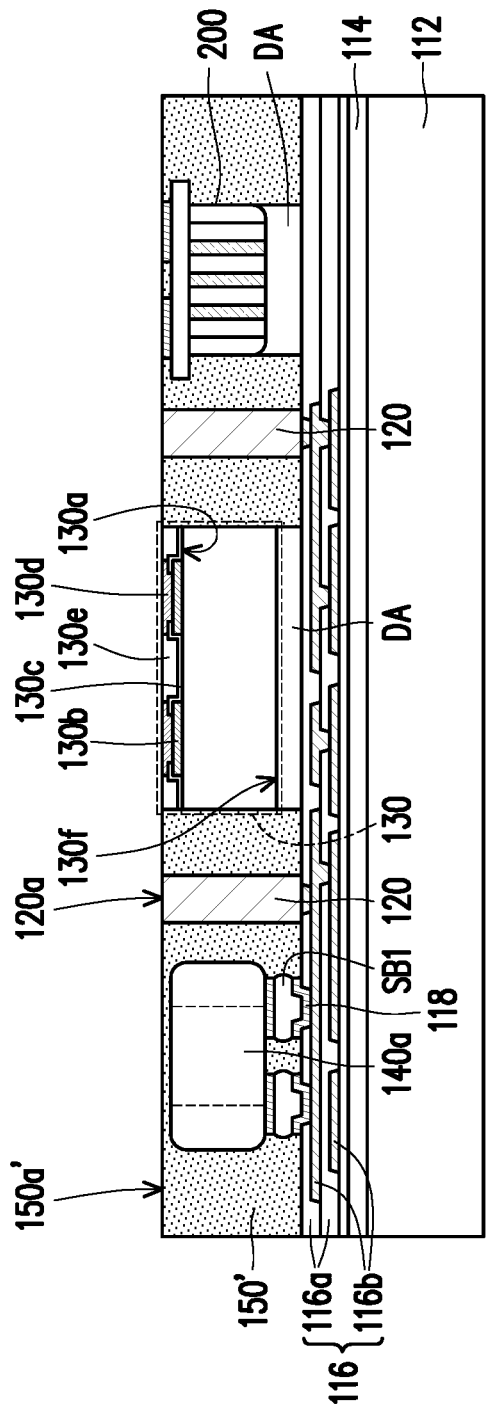

Referring to FIG. 41, in some embodiments, the insulating encapsulation 150 is planarized to form an insulating encapsulation 150' exposing the through vias 120 and the semiconductor die 130. In certain embodiments, as shown in FIG. 41, after the planarization, top surfaces 120a of the through vias 120 and top surfaces of the conductive pillars 130d and the protection layer 130e of the semiconductor die 130 are exposed by a top surface 150a' of the insulating encapsulation 150'. That is, for example, the top surfaces of the conductive pillars 130d and the protection layer 130e of the semiconductor die 130 and the top surfaces 120a of the through vias 120 become substantially leveled with the top surface 150a' of the insulating encapsulation 150'. In other words, the top surfaces of the conductive pillars 130d and the protection layer 130e of the semiconductor die 130, the top surfaces 120a of the through vias 120, and the top surface 150a' of the insulating encapsulation 150' are substantially coplanar to each other.

Figure 42:
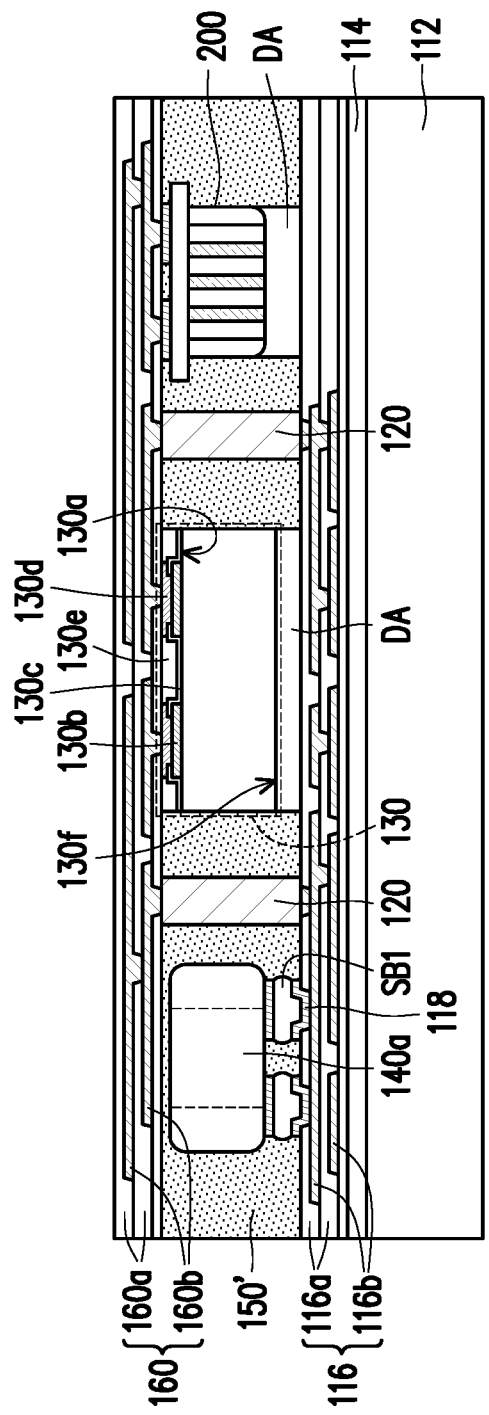

Referring to FIG. 42, in some embodiments, a redistribution layer 160 is formed on the through vias 120, the semiconductor die 130, the surface mount device 140, the insulating encapsulation 150', and the connecting module 200. In some embodiments, the redistribution layer 160 is electrically connected to the through vias 120 and the connecting module 200, is electrically connected to the semiconductor die 130 through the conductive pillars 130d, and is electrically connected to the surface mount device 140a through the through vias 120, the redistribution layer 116, the UBM patterns 118, and the solder balls SB1. In some embodiments, through the redistribution layer 160, the semiconductor die 130 is electrically connected to the through vias 120 and the connecting module 200. In some embodiments, through the redistribution layer 160, the through vias 120, the redistribution layer 116, the UBM patterns 118, and the solder balls SB1, the semiconductor die 130 is electrically connected to the surface mount device 140a. As shown in FIG. 42, for example, the redistribution layer 160 is referred as a front-side redistribution layer of the semiconductor die 130. As shown in FIG. 42, in certain embodiments, the semiconductor die 130 and the connecting module 200 are mechanically connected to the redistribution layer 160 by direct contact, and the surface mount device 140a is mechanically connected to the redistribution layer 116 by the solder balls SB1 and the UBM patterns 118.

Figure 43:
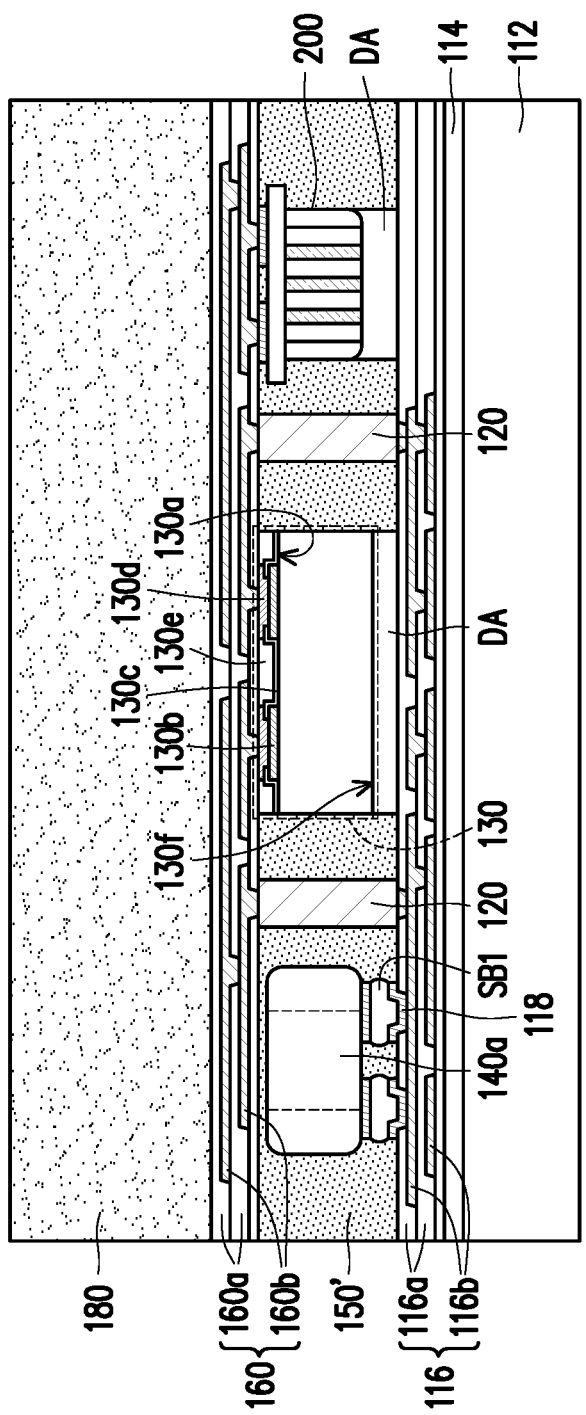

Referring to FIG. 43, in some embodiments, an encapsulant 180 is formed on the redistribution layer 160. In some embodiments, the redistribution layer 160 is located between the encapsulant 180 and the insulating encapsulation 150'.

Figure 44:
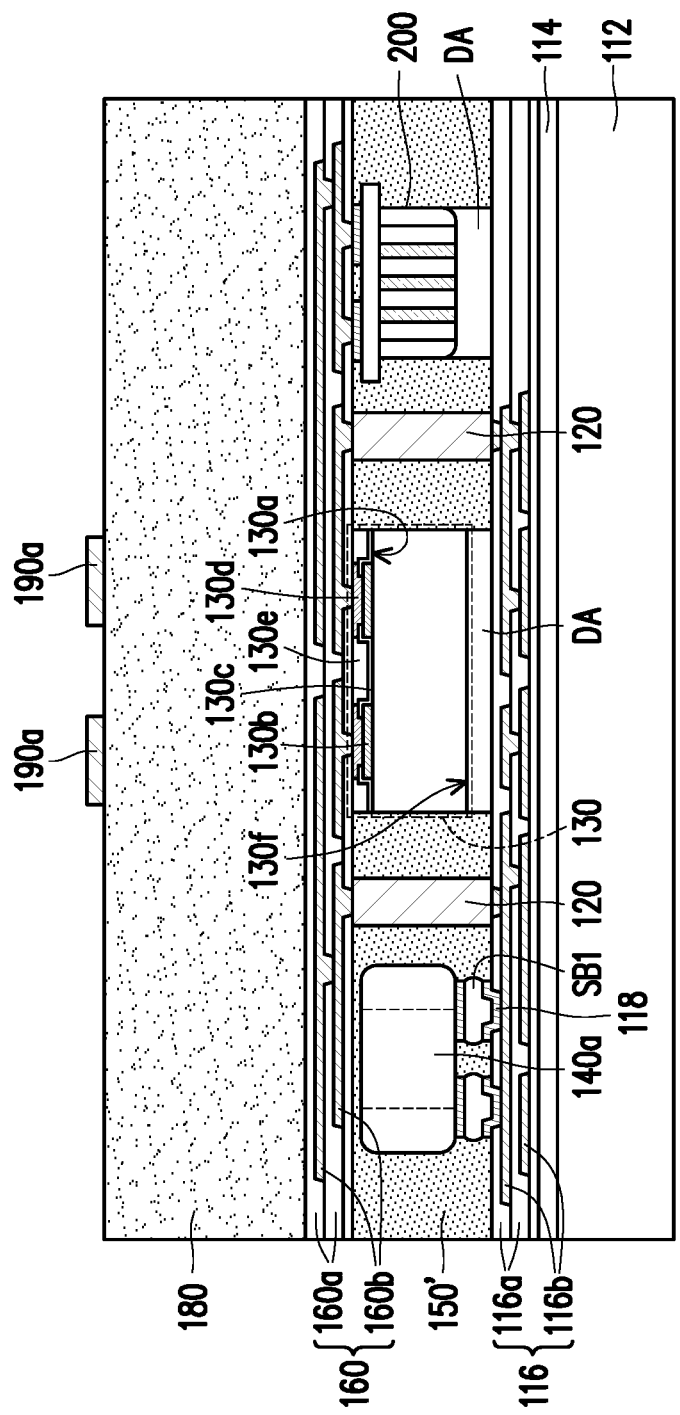

Referring to FIG. 44, in some embodiments, antenna elements 190a are formed on formed on the encapsulant 180. The encapsulant 180 is located between the antenna elements 190a and the redistribution layer 160. As shown in FIG. 44, the antenna elements 190a are formed on a surface of the encapsulant 180 facing away from the redistribution layer 160. In some embodiments, the antenna elements 190a are electrically coupled with the redistribution layer 160a which serves a feed-line for the antenna elements 190a, and a portion of the redistribution layer 160 overlapped with the antenna elements 190a serves as a ground plate for the antenna elements 190a. In some embodiment, the redistribution layer 160 is referred as a ground plate and/or a feed line.

Figure 45:
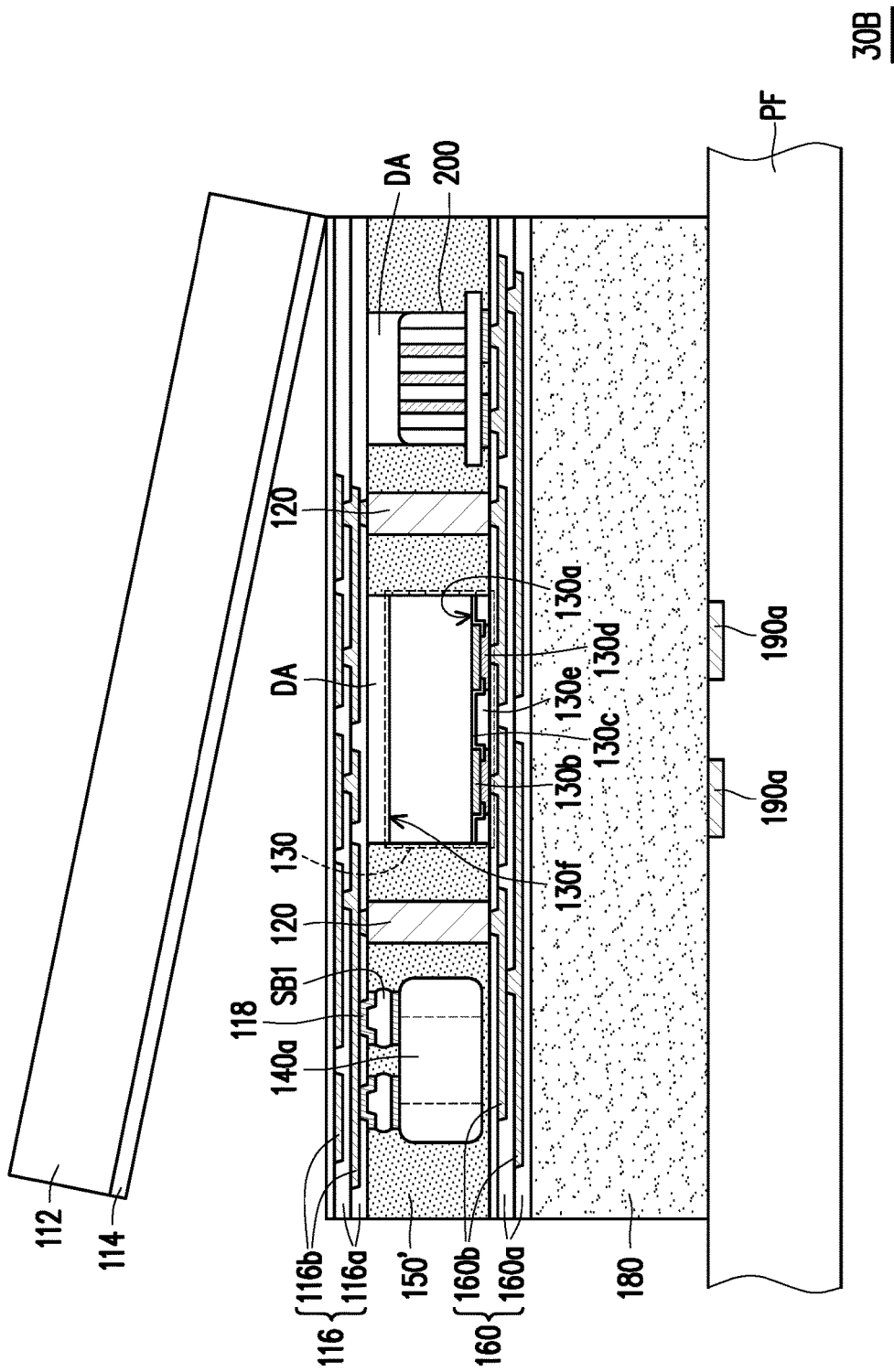

Referring to FIG. 45, in some embodiments, the whole package structure 30B along with the carrier 112 is flipped (turned upside down), and the antenna elements 190a are mounted into a polymer film PF. In certain embodiments, the antenna elements 190a are embedded in the polymer film PF. In some embodiments, after the antenna elements 190a are mounted into the polymer film PF, the carrier 112 is easily debonded from the redistribution layer 116 due to the debond layer 114, and the lowest layer of the polymer dielectric layers 116a of the redistribution layer 116 is exposed. In some embodiments, the carrier 112 is detached from the redistribution layer 116 through a debonding process, and the carrier 112 and the debond layer 114 are removed. In one embodiment, the debonding process is a laser debonding process.

Figure 46:
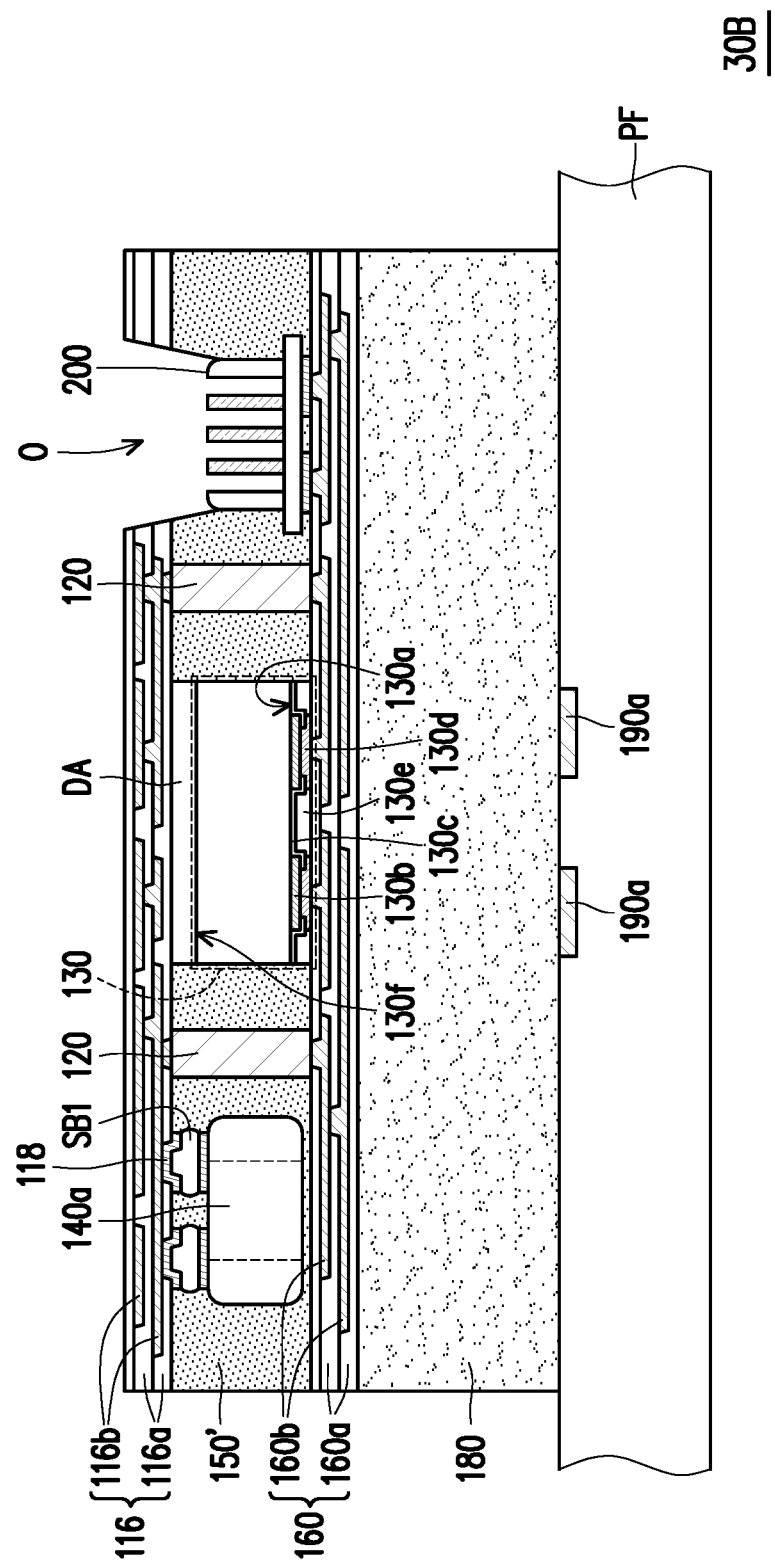

Referring to FIG. 46, in some embodiments, after removing the carrier 112 and the debond layer 114, at least one trench O is formed in the redistribution layer 116 and the insulating encapsulation 150' to accessibly expose the connecting module 200. As shown in FIG. 46, in certain embodiments, during the formation of the trench O, the connecting film DA adhered to the connecting module 200 is removed. Due to the insulating encapsulation 150', the connecting module 200 is more stably fixed on the redistribution layer 160, and the adhesion degree of the connecting module 200 to the redistribution layer 160 is further enhanced.

Figure 47:
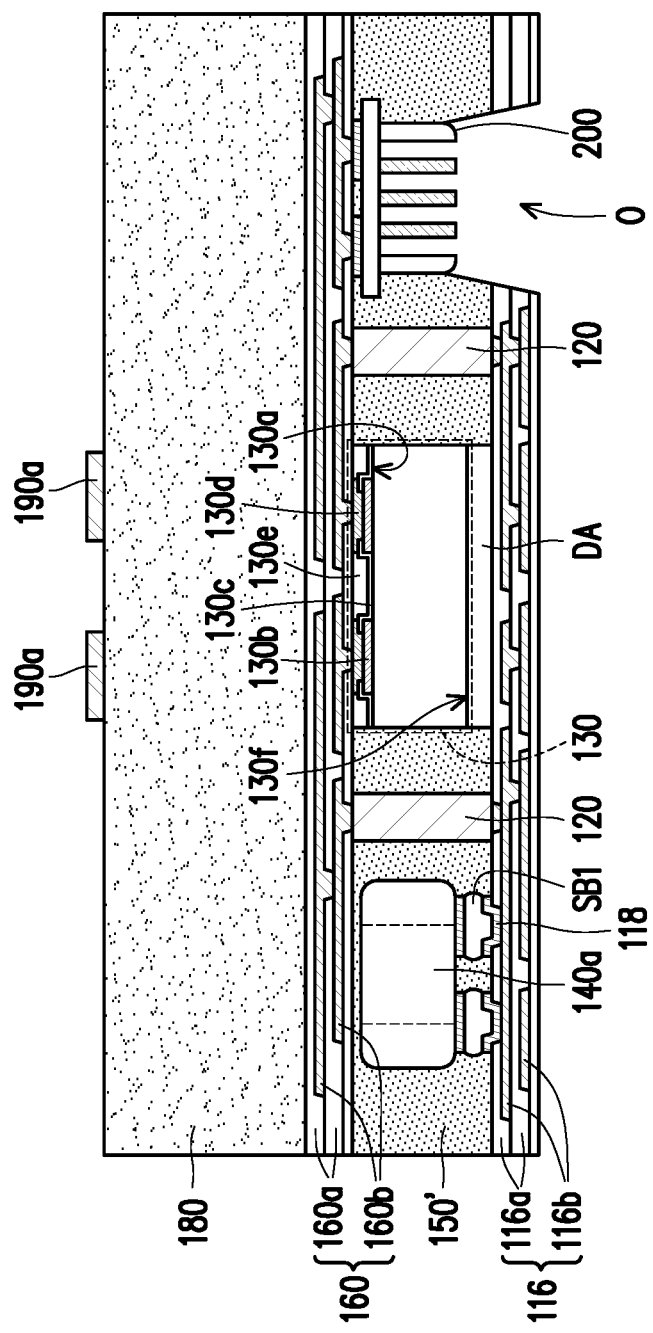

Referring to FIG. 47, in some embodiments, the polymer film PF is removed from the antenna elements 190a to form the package structure 30B. Up to here, the manufacture of the package structures 30B is completed. In certain embodiments, the whole package structure 30B along with the polymer film PF is first flipped (turned upside down), and then the antenna elements 190a are released from the polymer film PF by removing the polymer film PF.

In some embodiments, a holding device (not shown) is adopted to secure the package structures 30B by holding the redistribution layer 116 before releasing the antenna elements 190a (e.g. removing the polymer film PF). In such embodiments, after the polymer film PF is removed, the redistribution layer 116 is then released from the holding device to form the package structure 30B. In certain embodiments, prior to releasing the redistribution layer 116 from the holding device, a dicing process is performed to cut the wafer having a plurality of the package structures 30B into individual and separated package structures 30B.

FIG. 48 to FIG. 56 are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein. In FIG. 48 to FIG. 56, one semiconductor die is shown to represent plural semiconductor dies of the wafer, and a package structure 30C is shown to represent a package structure obtained following the manufacturing method, for example. In other embodiments, two chips or semiconductor dies are shown to represent plural chips or semiconductor dies of the wafer, and one or more package structures are shown to represent plural (semiconductor) package structures obtained following the (semiconductor) manufacturing method, the disclosure is not limited thereto. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure.

Figure 48:
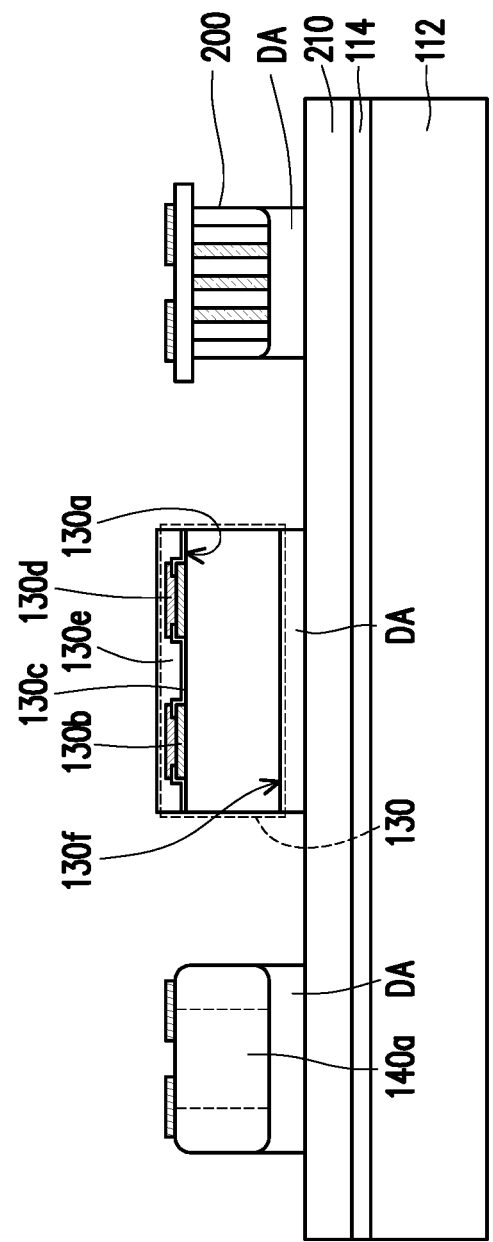
FIG. 48 to FIG. 56 are schematic cross sectional views of various stages in a manufacturing method of a package structure according to some exemplary embodiments of the present disclosure.

Referring to FIG. 48, in some embodiments, a carrier 112 with a debond layer 114 formed thereon is provided. As shown in FIG. 48, in some embodiments, a protection layer 210 is formed on the debond layer 114, where the debond layer 114 is located between the carrier 12 and the protection layer 210. It is noted that the certain details or descriptions of the protection layer 210 are described in FIG. 10, and thus will not be repeated herein, for simplicity.

In some embodiments, at least one semiconductor die 130, at least one surface mount device 140a, and at least one connecting module 200 are provided. As shown in FIG. 48, at least one semiconductor die 130, at least one surface mount device 140a, and at least one connecting module 200 are disposed on the protection layer 210 through different connecting films DA. In some embodiments, the connecting films DA are respectively located between the semiconductor die 130 and the protection layer 210, between the surface mount device 140a and the protection layer 210 and between the connecting module 200 and the protection layer 210. It is noted that the certain details or descriptions of the connecting module 200 are described in FIG. 10, and thus will not be repeated herein, for simplicity. In some embodiments, due to the connecting films DA, the semiconductor die 130, the surface mount device 140a, and the connecting module 200 are stably adhered to the protection layer 210. As shown in FIG. 48, the semiconductor die 130, the surface mount device 140a, and the connecting module 200 are located at the same side of the protection layer 210. Due to such configuration, the package structure 30C is capable of being electrically connected to additional external electronic device(s) while maintaining an impact volume and a small form factor.

Figure 49:
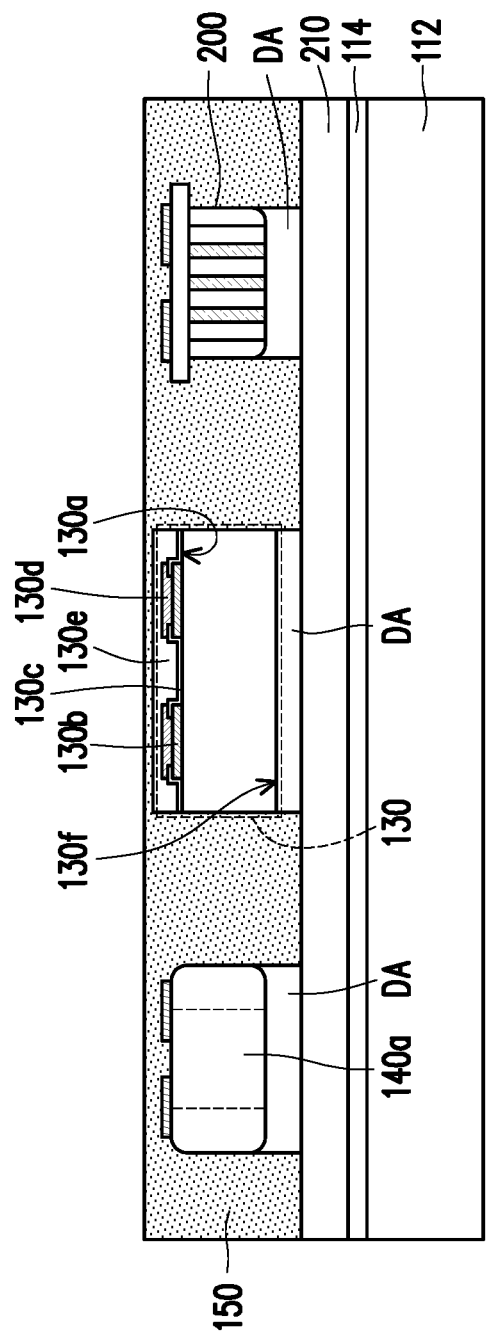

Referring to FIG. 49, in some embodiments, the semiconductor die 130, the surface mount device 140a, and the connecting module 200 are encapsulated in an insulating encapsulation 150. In some embodiments, the insulating encapsulation 150 is formed on the protection layer 210 and over the carrier 112. As shown in FIG. 49, the insulating encapsulation 150 at least fills up the gaps between the connecting films DA, the semiconductor die 130, the surface mount device 140a, and the connecting module 200. In certain embodiments, as shown in FIG. 49, the semiconductor die 130, the surface mount device 140a, and the connecting module 200 are not accessibly revealed by the insulating encapsulation 150.

Figure 50:
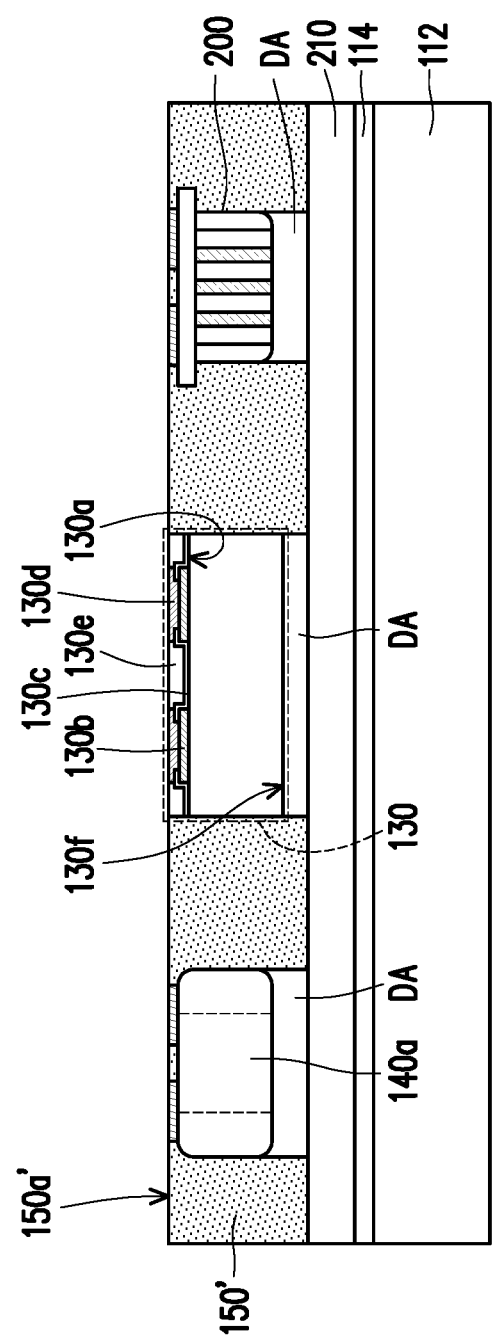

Referring to FIG. 50, in some embodiments, the insulating encapsulation 150 is planarized to form an insulating encapsulation 150' exposing the semiconductor die 130, the surface mount device 140a, and the connecting module 200. In certain embodiments, as shown in FIG. 50, after the planarization, top surfaces of the conductive pillars 130d and the protection layer 130e of the semiconductor die 130 are exposed by a top surface 150a' of the insulating encapsulation 150'. That is, for example, the top surfaces of the conductive pillars 130d and the protection layer 130e of the semiconductor die 130 become substantially leveled with the top surface 150a' of the insulating encapsulation 150'. In other words, the top surfaces of the conductive pillars 130d and the protection layer 130e of the semiconductor die 130 and the top surface 150a' of the insulating encapsulation 150' are substantially coplanar to each other.

Figure 51:
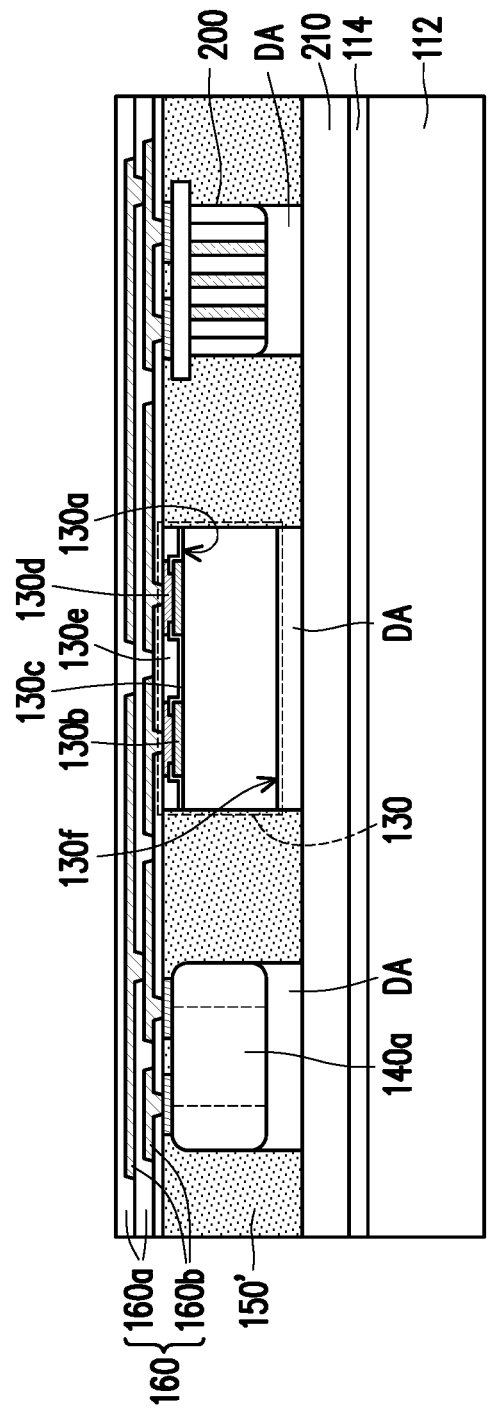

Referring to FIG. 51, in some embodiments, a redistribution layer 160 is formed on the semiconductor die 130, the surface mount device 140a, the connecting module 200, and the insulating encapsulation 150'. In some embodiments, the redistribution layer 160 is electrically connected to the semiconductor die 130, the surface mount device 140a, and the connecting module 200. In some embodiments, through the redistribution layer 160, the semiconductor die 130, the surface mount device 140a, and the connecting module 200 are electrically connected to one antoher. As shown in FIG. 51, for example, the redistribution layer 160 is referred as a front-side redistribution layer of the semiconductor die 130. As shown in FIG. 51, in certain embodiments, the semiconductor die 130, the surface mount device 140a, and the connecting module 200 are mechanically connected to the redistribution layer 160 by direct contact.

Figure 52:
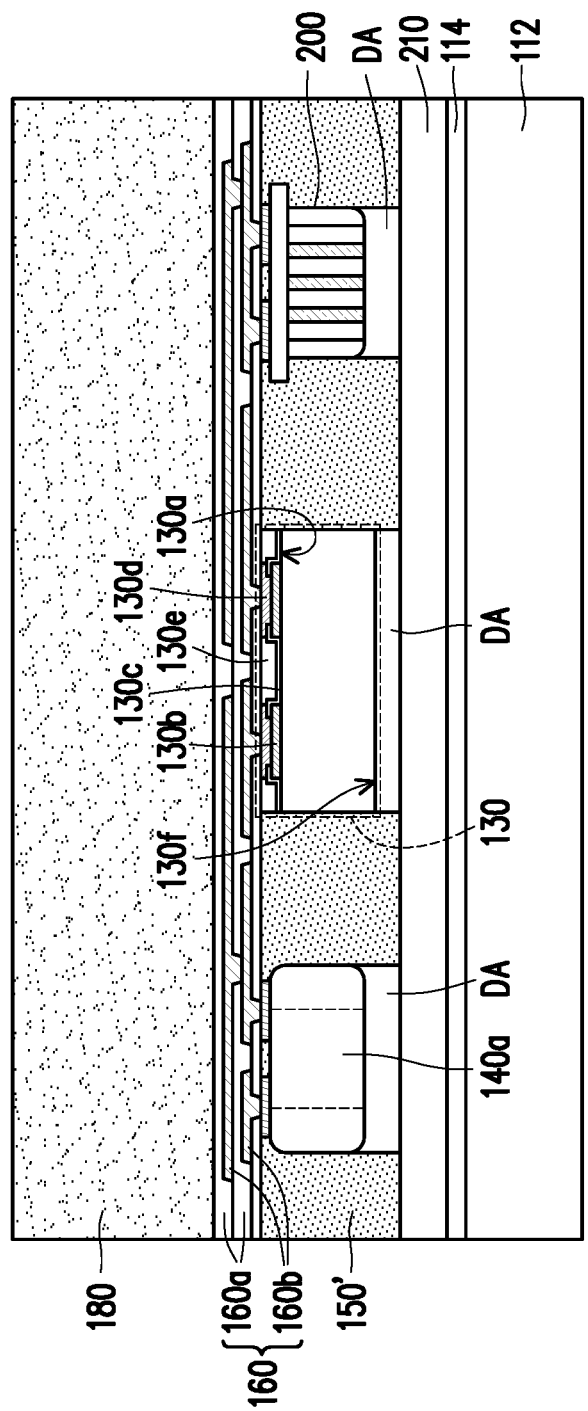

Referring to FIG. 52, in some embodiments, an encapsulant 180 is formed on the redistribution layer 160. In some embodiments, the redistribution layer 160 is located between the encapsulant 180 and the insulating encapsulation 150'.

Figure 53:
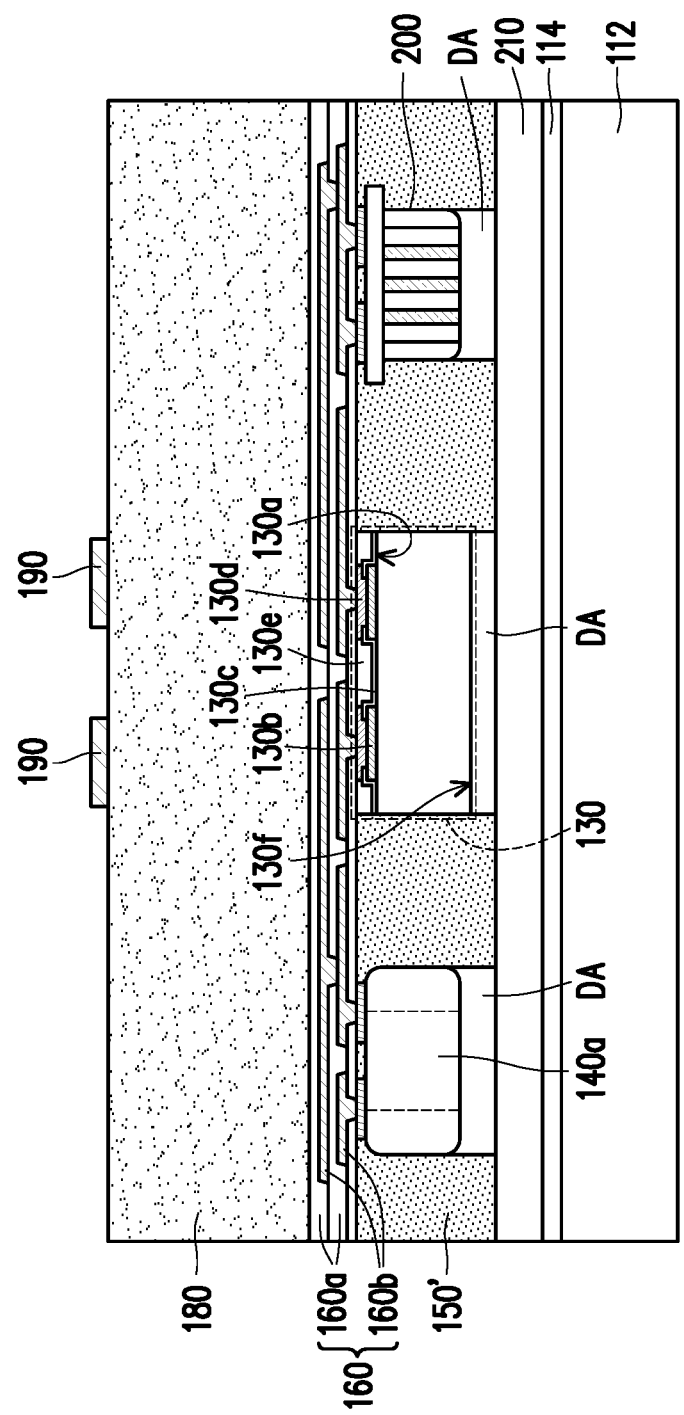

Referring to FIG. 53, in some embodiments, antenna elements 190a are formed on formed on the encapsulant 180. The encapsulant 180 is located between the antenna elements 190a and the redistribution layer 160. As shown in FIG. 53, the antenna elements 190a are formed on a surface of the encapsulant 180 facing away from the redistribution layer 160. In some embodiments, the antenna elements 190a are electrically coupled with the redistribution layer 160a which serves a feed-line for the antenna elements 190a, and a portion of the redistribution layer 160 overlapped with the antenna elements 190a serves as a ground plate for the antenna elements 190a. In some embodiment, the redistribution layer 160 is referred as a ground plate and/or a feed line.

Figure 54:
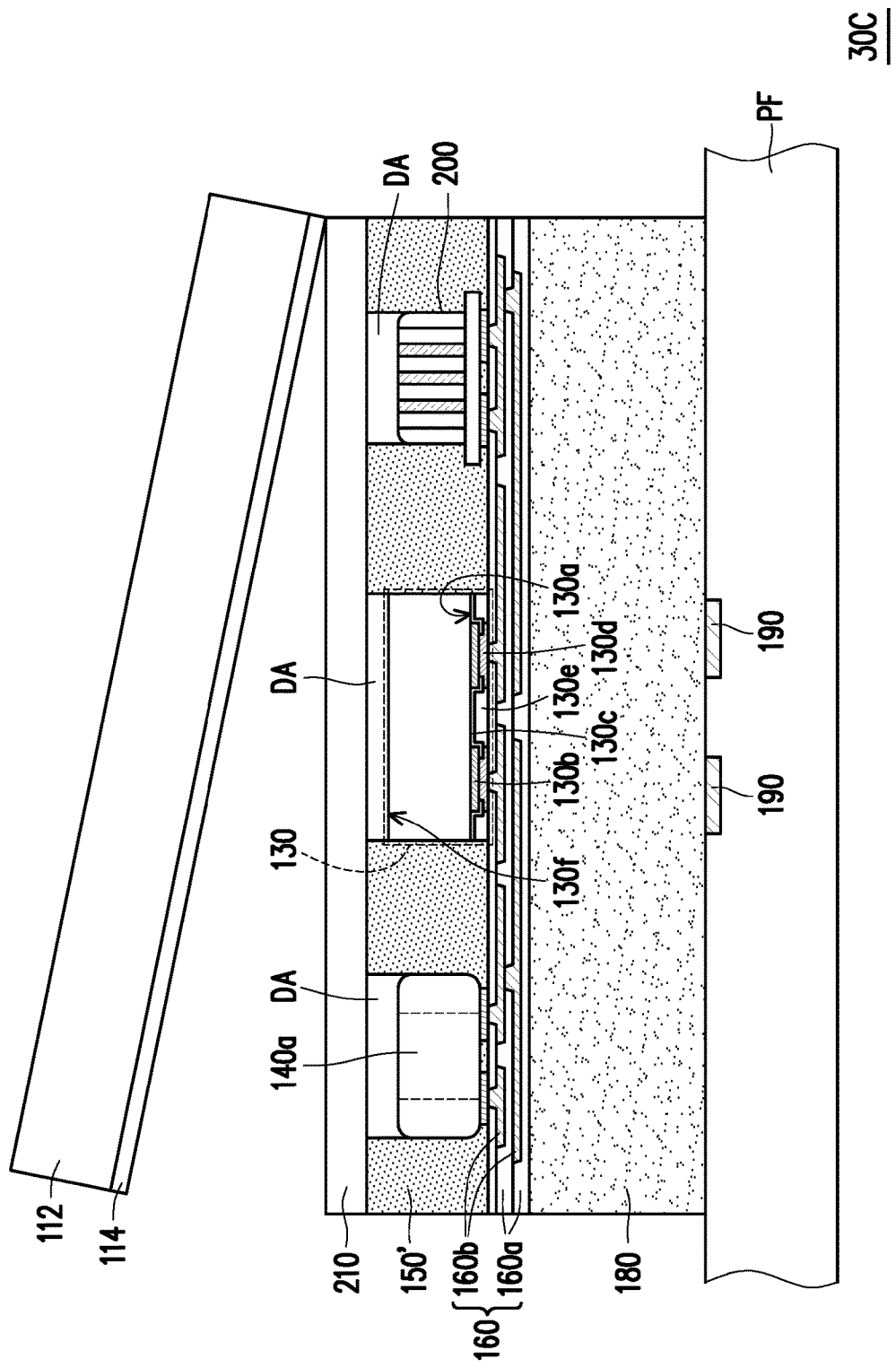

Referring to FIG. 54, in some embodiments, the whole package structure 30C along with the carrier 112 is flipped (turned upside down), and the antenna elements 190a are mounted into a polymer film PF. In certain embodiments, the antenna elements 190a are embedded in the polymer film PF. In some embodiments, after the antenna elements 190a are mounted into the polymer film PF, the carrier 112 is easily debonded from the protection layer 210 due to the debond layer 114, and a surface of the protection layer 210 is exposed. In some embodiments, the carrier 112 is detached from the protection layer 210 through a debonding process, and the carrier 112 and the debond layer 114 are removed. In one embodiment, the debonding process is a laser debonding process.

Figure 55:
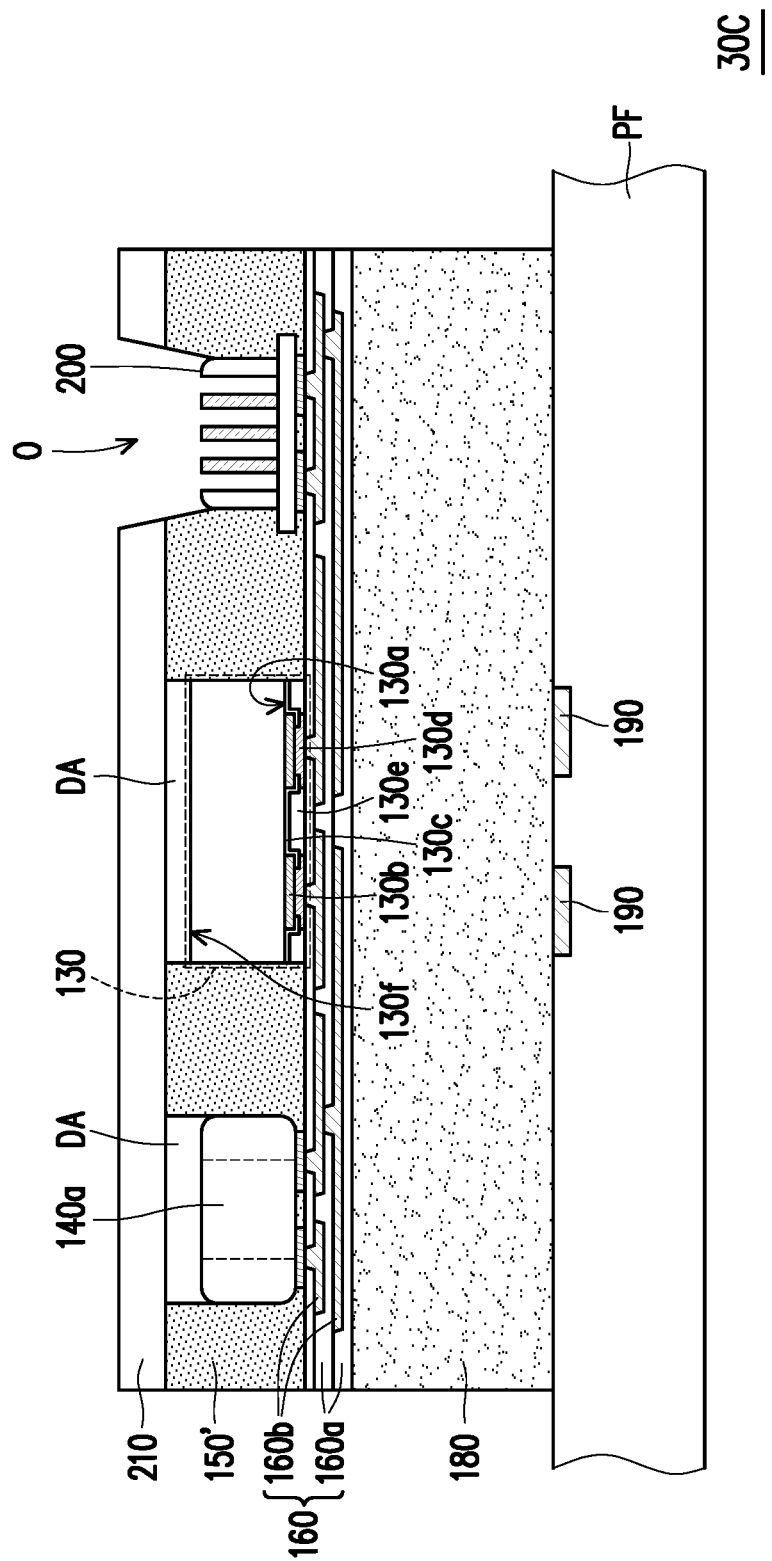

Referring to FIG. 55, in some embodiments, after removing the carrier 112 and the debond layer 114, at least one trench O is formed in the protection layer 210 and the insulating encapsulation 150' to accessibly expose the connecting module 200. As shown in FIG. 55, in certain embodiments, during the formation of the trench O, the connecting film DA adhered to the connecting module 200 is removed. Due to the insulating encapsulation 150', the connecting module 200 is stably fixed on the redistribution layer 160, and the adhesion degree of the connecting module 200 to the redistribution layer 160 is further enhanced.

Figure 56:
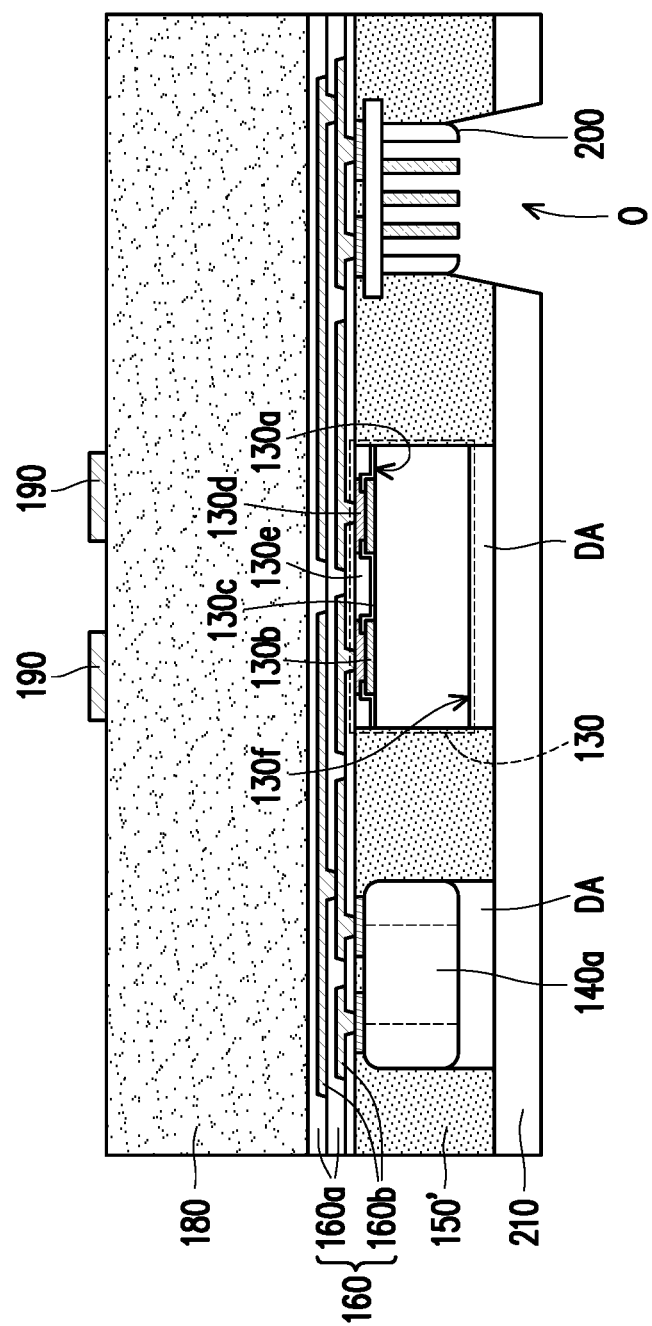

Referring to FIG. 56, in some embodiments, the polymer film PF is removed from the antenna elements 190a to form the package structure 30C. Up to here, the manufacture of the package structures 30C is completed. In certain embodiments, the whole package structure 30C along with the polymer film PF is first flipped (turned upside down), and then the antenna elements 190a are released from the polymer film PF by removing the polymer film PF.

In some embodiments, a holding device (not shown) is adopted to secure the package structures 30C by holding the protection layer 210 before releasing the antenna elements 190a (e.g. removing the polymer film PF). In such embodiments, after the polymer film PF is removed, the protection layer 210 is then released from the holding device to form the package structure 30C. In certain embodiments, prior to releasing the protection layer 210 from the holding device, a dicing process is performed to cut the wafer having a plurality of the package structures 30C into individual and separated package structures 30C.

Figure 57:
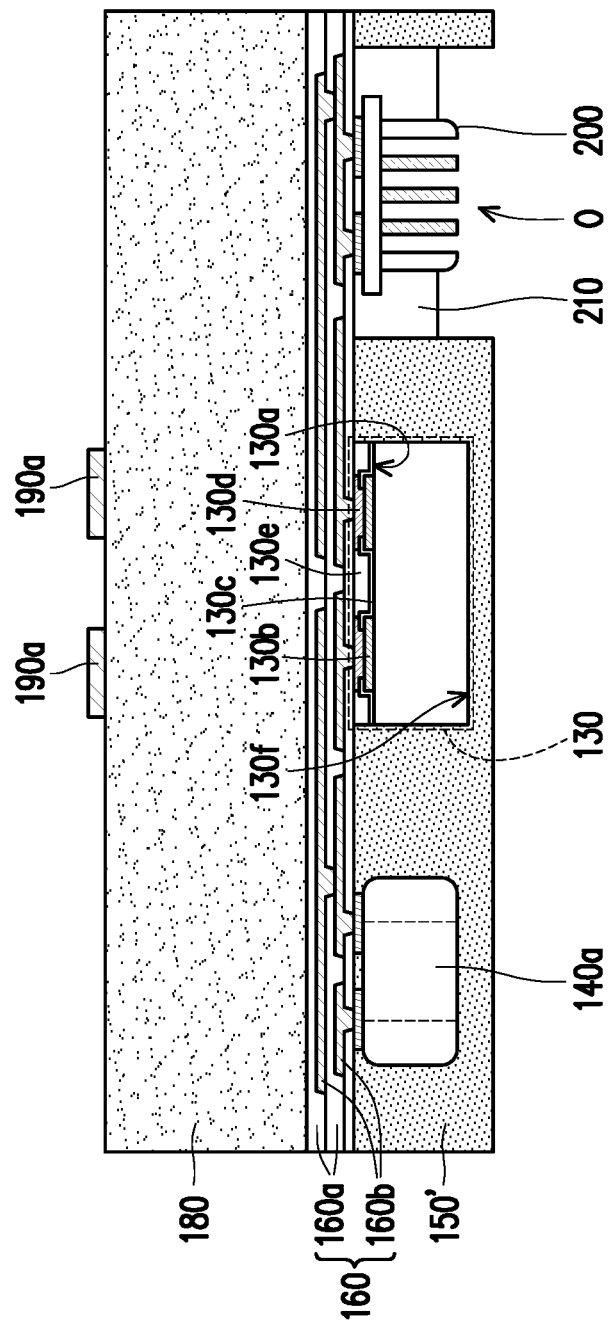
FIG. 57 is a schematic cross sectional view of a package structure according to some exemplary embodiments of the present disclosure.

FIG. 57 is a schematic cross sectional view of a package structure according to some exemplary embodiments of the present disclosure. Referring to FIG. 56 and FIG. 57 together, the package structure 30C depicted in FIG. 56 and the package structure 30D depicted in FIG. 57 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 56 and FIG. 57 together, the difference is that, for the package structure 30D depicted in FIG. 57, where the protection layer 210 is located in the trench O and between the insulating encapsulation 150' and the connecting module 210. In certain embodiments, as shown in FIG. 57, the insulating encapsulation 150' surrounds the connecting module 200, and is separated from the connecting module 200 by the protection layer 210. In some embodiments, the connecting module 200 is accessibly exposed by the insulating encapsulation 150' and the protection layer 210. In some embodiments, as shown in FIG. 57, the formation of the protection layer 210 is formed after forming the trench O in the insulating encapsulation 150'. Due to the protection layer 210, the insulating encapsulation 150', the connecting module 200 is more stably fixed on the redistribution layer 160, and the adhesion degree of the connecting module 200 to the redistribution layer 160 is further enhanced. Due to such configuration, the package structure 30D is capable of being electrically connected to additional external electronic device(s) while maintaining an impact volume and a small form factor.

Figure 58:
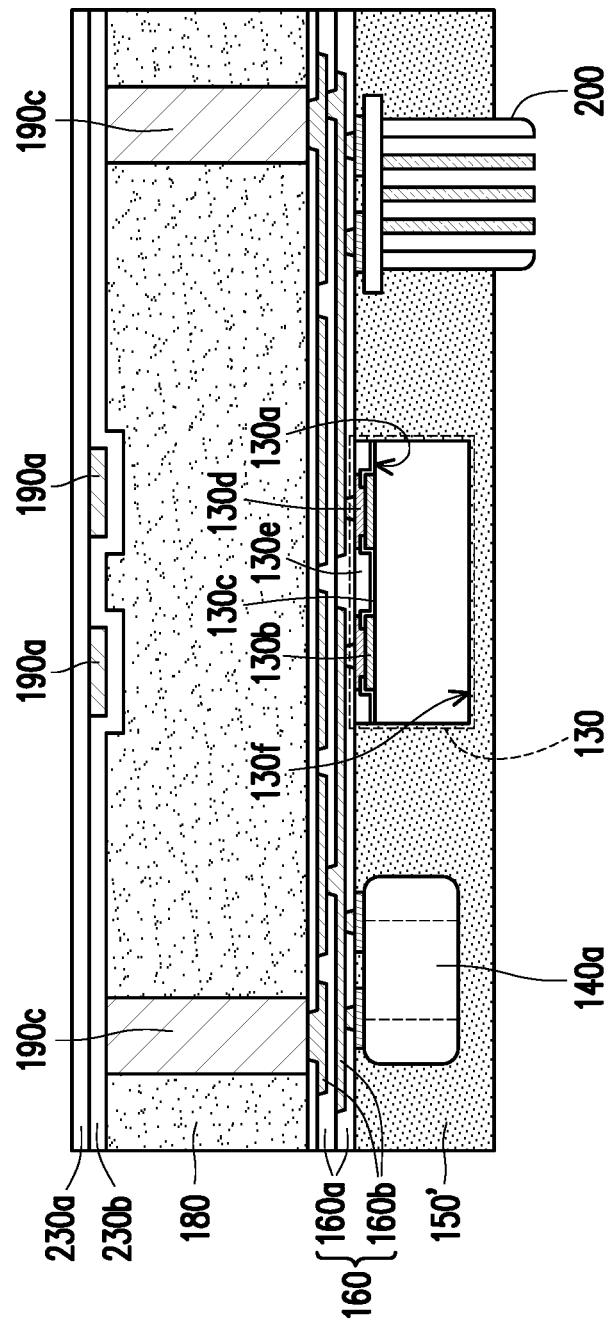
FIG. 58 is a schematic cross sectional view of a package structure according to some exemplary embodiments of the present disclosure.

FIG. 58 is a schematic cross sectional view of a package structure according to some exemplary embodiments of the present disclosure. Referring to FIG. 56 and FIG. 58 together, the package structure 30C depicted in FIG. 56 and the package structure 30E depicted in FIG. 58 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 56 and FIG. 58 together, the difference is that, the package structure 30E depicted in FIG. 58, further includes a dielectric layer 230a, a dielectric layer 230b, and antenna elements 190c, and in addition, a portion of the connecting module 200 is embedded in the insulating encapsulation 150', and other portion of the connecting module 200 protruding out of the insulating encapsulation 150'. As shown in FIG. 58, the package structure 30E excludes the protection layer and the trench O, and the connecting module 200 is protruding out of the insulating encapsulation 150'. Due to such configuration, the connecting module 200 is more stably fixed on the redistribution layer 160, and the adhesion degree of the connecting module 200 to the redistribution layer 160 is further enhanced. Due to such configuration, the package structure 30E is capable of being electrically connected to additional external electronic device(s) while maintaining an impact volume and a small form factor.

In some embodiments, as shown in FIG. 58, the antenna elements 190a, the dielectric layer 230a, and the dielectric layer 230b are located on the encapsulate 190, where the antenna elements 190a are sandwiched between the dielectric layer 230a and the dielectric layer 230b, and the encapsulation 180 is located between the dielectric layer 230b and the redistribution layer 160. In one embodiment, materials of the dielectric layer 230a and the dielectric layer 230b may include a photo-sensitive material such as polybenzoxazole (PBO), polyimide, benzocyclobutene (BCB), a combination thereof or the like, which may be easily patterned using a lithography mask. In an alternative embodiment, the materials of the dielectric layer 230a and the dielectric layer 230b may include a nitride such as silicon nitride, an oxide such as silicon oxide, phosphosilicate glass (PSG), borosilicate glass (BSG), boron-doped phosphosilicate glass (BPSG), a combination thereof or the like. The dielectric layer 230a and the dielectric layer 230b, for example, may be formed by suitable fabrication techniques such as spin-coating, chemical vapor deposition (CVD), plasma-enhanced chemical vapor deposition (PECVD) or the like. In one embodiment, the material of the dielectric layer 230a and the material of the dielectric layer 230b may be the same. In an alternative embodiment, the material of the dielectric layer 230a is different from the material of the dielectric layer 230b.

In some embodiments, as shown in FIG. 58, the antenna elements 190c are encapsulated in the encapsulant 180 and are electrically connected to the redistribution layer 160. In some embodiments, the antenna elements 190c are located aside of the locations of the semiconductor die 130, the surface mount device 140a, the connecting module 200, and the antenna elements 190a. In some embodiments, the antenna elements 190c may be dipole antennas. For example, a pair of two adjacent antenna elements 190c constitutes an end-fire radiation antenna, where one of the antenna elements 190c is electrically connected to a portion of the redistribution layer 160 (serving as a feed line); and the other one of the antenna elements 190c is electrically connected to another portion of the redistribution layer 160 (serving as a ground plate/line). Owing to the configuration of the antenna elements 190a and antenna elements 190c, a coverage range of the electromagnetic waves in the package structure 30E is increased, and thus the efficiency of the antenna application of the package structure 30E is enhanced.

Figure 59:
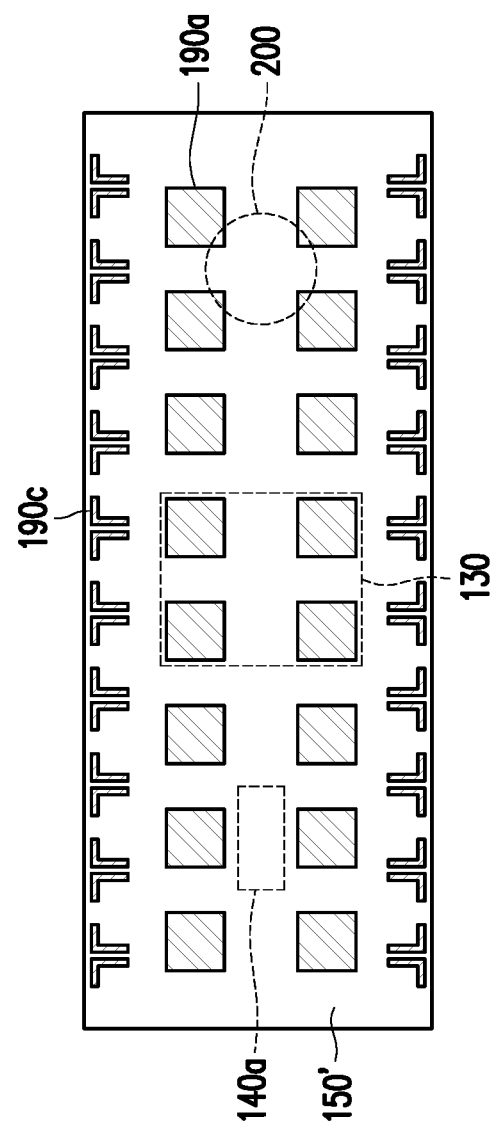
FIG. 59 is a schematic top view illustrating a relative position between antenna elements, a semiconductor die, a passive element, and a connecting module of a package structure according to some exemplary embodiments of the present disclosure.

FIG. 59 is a schematic top view illustrating a relative position between antenna elements, a semiconductor die, a passive element, a connecting module, and an insulating encapsulation of a package structure according to some exemplary embodiments of the present disclosure. The elements similar to or substantially the same as the elements described above will use the same reference numbers, and certain details or descriptions of the same elements and the relationship thereof (e.g. the relative positioning configuration and electrical connection) will not be repeated herein. As shown in FIG. 59, in some embodiments, the antenna elements 190c are continuously arranged along the edge of the package structure, where the location of the antenna elements 190c are not overlapped with the locations of the antenna elements 190a, the semiconductor die 130, the surface mount device 140a, and the connecting module 200.

According to some embodiments, a package structure includes a first redistribution layer, a second redistribution layer, at least one semiconductor chip, an insulating encapsulation, a protection layer, and at least one connecting module. The at least one semiconductor chip is located between and electrically connected to the first redistribution layer and the second redistribution layer. The insulating encapsulation encapsulates the at least one semiconductor chip. The protection layer is disposed on and partially covers the first redistribution layer, wherein the first redistribution layer is located between the at least one semiconductor chip and the protection layer. The at least one connecting module connects to the first redistribution layer and is electrically connected to the at least one semiconductor chip through the first redistribution layer, wherein the at least one connecting module comprises a plurality of pins, and the at least one connecting module is mounted onto the first redistribution layer by the protection layer and is accessibly exposed by the protection layer.

According to some embodiments, a package structure includes a first redistribution layer, at least one semiconductor chip, at least one passive element, an insulating encapsulation, a protection layer, and at least one connecting module. The at least one semiconductor chip is located on and electrically connected to the first redistribution layer. The at least one passive element is located on the first redistribution layer and electrically connected to the at least one semiconductor chip, wherein the at least one passive element is arranged aside of a location of the at least one semiconductor chip. The insulating encapsulation encapsulates the at least one semiconductor chip and the at least one passive element. The protection layer is disposed on and partially covers the first redistribution layer, wherein the first redistribution layer is located between the at least one semiconductor chip and the protection layer. The at least one connecting module connects to the first redistribution layer and is electrically connected to the at least one semiconductor chip through the first redistribution layer, wherein the at least one connecting module comprises a plurality of pins, and the at least one connecting module is mounted onto the first redistribution layer by the protection layer and is accessibly exposed by the protection layer.

According to some embodiments, a package structure includes a first redistribution layer, at least one semiconductor chip, at least one passive element, at least one connecting module, and an insulating encapsulation. The at least one semiconductor chip is located on and electrically connected to the first redistribution layer. The at least one passive element is located on the first redistribution layer and electrically connected to the at least one semiconductor chip. The at least one connecting module is electrically connected to the first redistribution layer and the at least one semiconductor chip, wherein the at least one connecting module comprises a plurality of pins. The insulating encapsulation is located on the first redistribution layer, wherein the insulating encapsulation encapsulates the at least one semiconductor chip and the at least one passive element and surrounds the at least one connecting module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first redistribution layer and a second redistribution layer;
   at least one semiconductor chip, located between and electrically connected to the first redistribution layer and the second redistribution layer;
   an insulating encapsulation, encapsulating the at least one semiconductor chip;
   a protection layer, disposed on and partially covering the first redistribution layer, wherein the first redistribution layer is located between the at least one semiconductor chip and the protection layer; and
   at least one connecting module, connecting to the first redistribution layer and electrically connected to the at least one semiconductor chip through the first redistribution layer, wherein the at least one connecting module comprises a circuit board and a plurality of pins connected thereto, and the at least one connecting module is mounted onto the first redistribution layer by the protection layer and is accessibly exposed by the protection layer.

2. The package structure of claim 1, further comprising:
   through vias, located between and electrically connected to the first redistribution layer and the second redistribution layer and encapsulated in the insulating encapsulation, wherein the through vias are disposed aside of a location of the at least one semiconductor chip.

3. The package structure of claim 1, further comprising:
   warpage control elements, located between the first redistribution layer and the second redistribution layer and encapsulated in the insulating encapsulation, wherein a first group of the warpage control elements are disposed aside of a location of the at least one semiconductor chip, and a second group of the warpage control elements are disposed between the second redistribution layer and the at least one semiconductor chip.

4. The package structure of claim 1, further comprising:
   at least one first passive element, located at a side of the second redistribution layer, wherein the at least one first passive element is mechanically connected to one of the first redistribution layer and the second redistribution layer.

5. The package structure of claim 4, further comprising:
   at least one second passive element, located at a side of the second redistribution layer, wherein the at least one second passive element is electrically connected to the first redistribution layer and at least partially encapsulated in the protection layer.

6. The package structure of claim 1, further comprising:
   first antenna elements, located over the second redistribution layer; and
   an encapsulant, located between the first antenna elements and the second redistribution layer, wherein the second redistribution layer is located between the encapsulant and the at least one semiconductor chip, and a portion of the second redistribution layer is electrically coupled with the first antenna elements.

7. The package structure of claim 6, further comprising:
   first air cavities, formed within the encapsulant, wherein a location of each of the first air cavities is overlapped with a location of a respective one of the first antennas in the vertical projection on the second redistribution layer.

8. The package structure of claim 7, further comprising:
   second antenna elements, located in the first air cavities respectively, wherein the second antenna elements are electrically coupled with the first antenna elements, respectively.

* * * * *